(12) United States Patent
Yamashita et al.

(10) Patent No.: US 9,453,890 B2
(45) Date of Patent: Sep. 27, 2016

(54) MAGNETIC SENSOR AND MAGNETIC DETECTING METHOD OF THE SAME

(71) Applicant: ASAHI KASEI MICRODEVICES CORPORATION, Tokyo (JP)

(72) Inventors: Masaya Yamashita, Tokyo (JP); Yo Yamagata, Tokyo (JP); Ken Tanaka, Tokyo (JP); Norihiko Mikoshiba, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/635,111

(22) Filed: Mar. 2, 2015

(65) Prior Publication Data

US 2015/0177337 A1    Jun. 25, 2015

Related U.S. Application Data

(63) Continuation of application No. PCT/JP2014/001676, filed on Mar. 24, 2014.

(30) Foreign Application Priority Data

Mar. 26, 2013  (JP) ................................ 2013-064646
Jul. 9, 2013  (JP) ................................ 2013-143431

(51) Int. Cl.
*G01R 33/02*     (2006.01)
*G01R 33/022*    (2006.01)
(Continued)

(52) U.S. Cl.
CPC ........... *G01R 33/0206* (2013.01); *G01R 33/09* (2013.01); *G01R 33/093* (2013.01); *G01R 33/096* (2013.01); *G01R 33/098* (2013.01); *H01L 43/08* (2013.01)

(58) Field of Classification Search
CPC . G01R 33/09; G01R 33/0011; G01R 33/093

USPC ......................................................... 324/252
See application file for complete search history.

(56) References Cited

U.S. PATENT DOCUMENTS 5,465,185 A    11/1995  Heim et al.
8,742,520 B2 *  6/2014  Wan ....................... H01L 27/22
                                                257/421
(Continued)

FOREIGN PATENT DOCUMENTS

EP    2 180 329 A3    10/2010
JP    H07-169026 A     7/1995
(Continued)

OTHER PUBLICATIONS

International Preliminary Report on Patentability dated Oct. 8, 2015, for the corresponding International application No. PCT/JP2014/001676.

(Continued)

*Primary Examiner* — Reena Aurora
(74) *Attorney, Agent, or Firm* — Morgan, Lewis & Bockius LLP

(57) ABSTRACT

The present invention relates to a magnetic sensor and a magnetic detecting method of the same capable of detecting at least a magnetic field perpendicular to a substrate and a magnetic field parallel to the substrate in a state where the respective magnetic field components are mixed. One embodiment of the magnetic sensor detects a magnetic field of the orthogonal three axes, and includes a magnetic detector including a magnetic field sensitive material configured to detect a magnetic field component in a first direction, a magnetic field direction converters configured to convert a magnetic field component in a second direction and a magnetic field component in a third direction into magnetic field components in the first direction, the second direction being perpendicular to the first direction, the third direction being perpendicular to both of the first and the second directions.

73 Claims, 31 Drawing Sheets

(51) Int. Cl.
 *G01R 33/09* (2006.01)
 *H01L 43/08* (2006.01)

(56) References Cited

U.S. PATENT DOCUMENTS

| | | | |
|---|---|---|---|
| 8,957,679 B2* | 2/2015 | Loreit | G01D 1/00 |
| | | | 324/244 |
| 2002/0021124 A1 | 2/2002 | Schott et al. | |
| 2004/0137275 A1 | 7/2004 | Jander et al. | |
| 2006/0072249 A1 | 4/2006 | Wakui et al. | |
| 2009/0098827 A1 | 4/2009 | Koyama | |
| 2011/0309829 A1 | 12/2011 | Loreit et al. | |
| 2012/0013332 A1 | 1/2012 | Honkura et al. | |
| 2012/0200292 A1 | 8/2012 | Sugihara et al. | |
| 2012/0217961 A1 | 8/2012 | Ando et al. | |
| 2013/0141090 A1 | 6/2013 | Sidman | |
| 2014/0375311 A1 | 12/2014 | Ishii et al. | |

FOREIGN PATENT DOCUMENTS

| | | |
|---|---|---|
| JP | H11-274598 A | 10/1999 |
| JP | 2002-071381 A | 3/2002 |
| JP | 2003-194574 A | 7/2003 |
| JP | 2003-282996 A | 10/2003 |
| JP | 2004-006752 A | 1/2004 |
| JP | 2006-003116 A | 1/2006 |
| JP | 2006-010461 A | 1/2006 |
| JP | 2009-077385 A | 4/2009 |
| JP | 2013-002856 A | 1/2013 |
| KR | 10-2006-0051772 A | 5/2006 |
| KR | 10-2010-0027980 A | 3/2010 |
| KR | 10-2011-0120343 | 11/2011 |
| WO | 2009-048018 A1 | 4/2009 |
| WO | 2011/068146 A1 | 6/2011 |
| WO | 2011/089978 A1 | 7/2011 |
| WO | 2012/085296 A1 | 6/2012 |
| WO | 2012/116933 A1 | 9/2012 |
| WO | 2013/118498 A1 | 8/2013 |

OTHER PUBLICATIONS

International Search Report dated May 27, 2014, for International Application No. PCT/JP2014/001676.
Supplementary European Search Report issued in European Patent Application No. 14773348.9 on Mar. 17, 2016.
Japanese Office Action for corresponding Japanese Patent Application No. 2015-159460.

* cited by examiner

FIG. 14
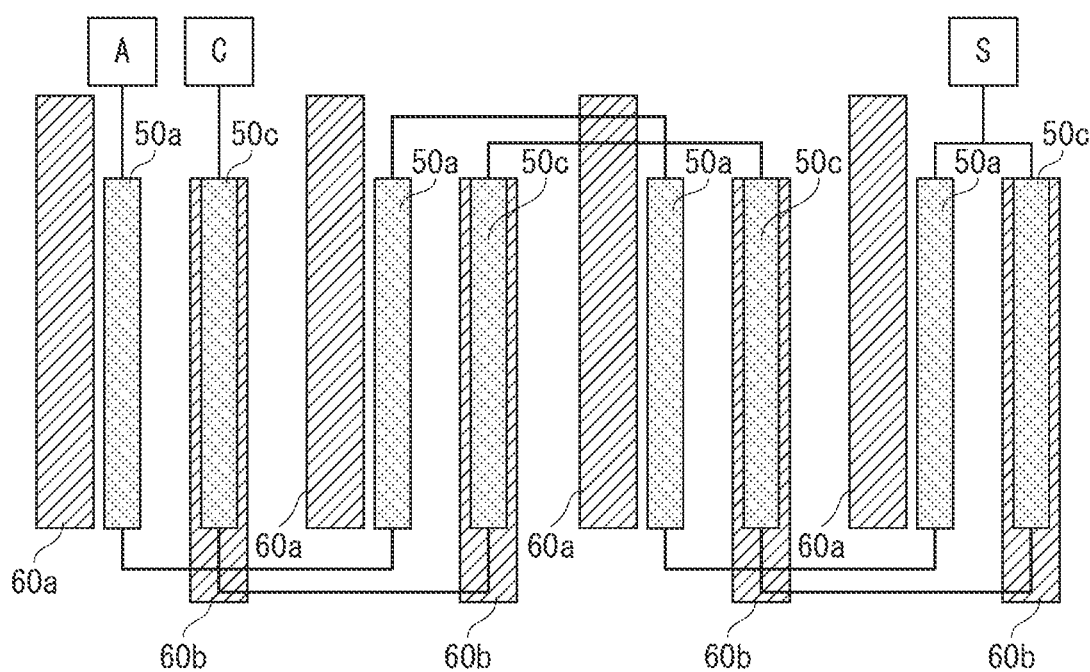
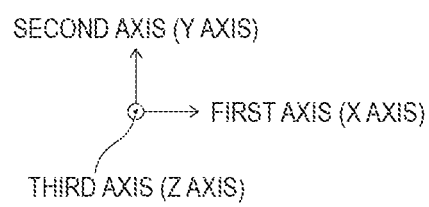

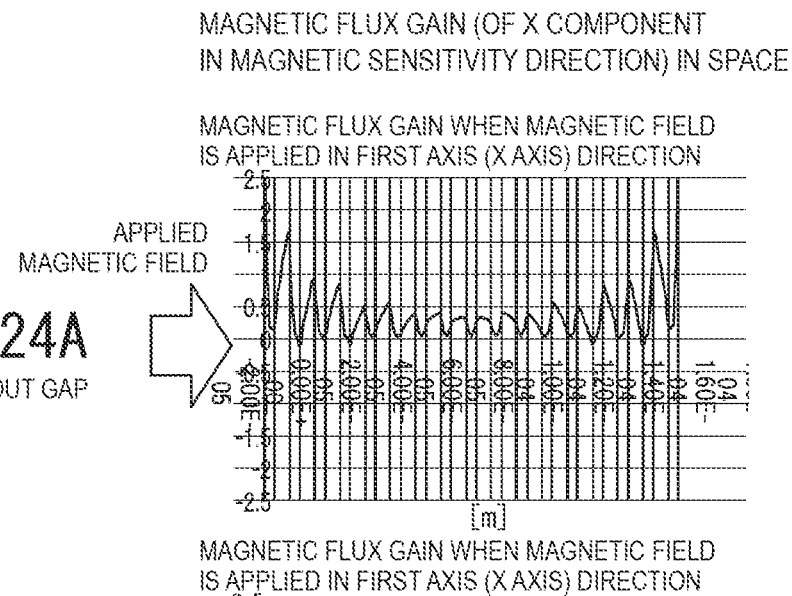
FIG. 24A WITHOUT GAP
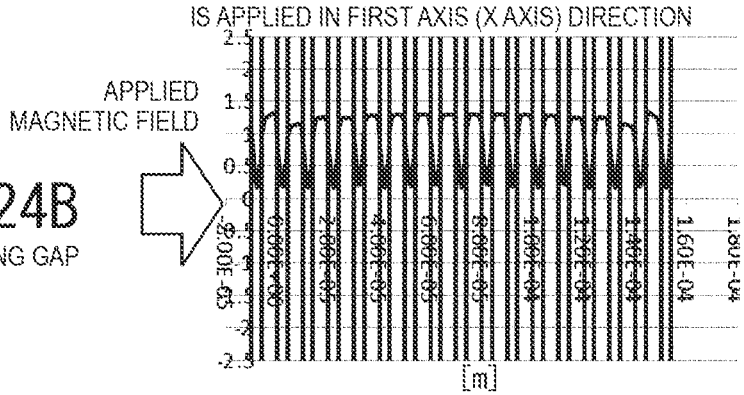
FIG. 24B HAVING GAP

MAGNETIC SENSOR AND MAGNETIC DETECTING METHOD OF THE SAME

TECHNICAL FIELD

The present invention relates to a magnetic sensor and a magnetic detecting method of the same, and in more details, relates to a magnetic sensor and a magnetic detecting method of the same, capable of detecting at least a magnetic field perpendicular to a substrate and a magnetic field parallel to the substrate in a state where the respective magnetic field components are mixed and separable.

BACKGROUND ART

Generally, giant magneto-resistance (GMR) elements for detecting presence or absence of magnetic field are widely known. The phenomenon that an electric resistance increases when a magnetic field is applied, is called as magneto-resistive effect. Although the resistance change of a common substance would be several percent, the resistance change of such GMR element reaches several tens of percent. For this reason, the GMR elements are widely used for recording heads of hard disks.

FIG. 1 is a perspective view illustrative of the operation principle of a conventional GMR element, and FIG. 2 is a partial cross-sectional view of FIG. 1. In the drawings, a reference numeral 1 denotes an antiferromagnetic layer, a reference numeral 2 denotes a pinned layer, a reference numeral 3 denotes a Cu layer (spacer layer), and a reference numeral 4 denotes a free layer. A magnetization direction of a magnetic material changes electronic spin scattering, and changes a resistance. In other words, the change of the resistance is represented by $\Delta R=(R_{AP}-R_P)/R_P$ (where $R_{AP}$: when magnetization directions on upper and lower sides are not parallel, and $R_P$: when magnetization directions on upper and lower sides are not parallel).

As for the magnetic moment of the pinned layer 2, the direction is fixed by magnetic coupling with the antiferromagnetic layer 1. When the direction of the magnetic moment of the free layer 4 changes due to leakage field, the current flowing through the Cu layer 3 changes, and a change of the leakage field can be detected.

FIG. 3 is a schematic diagram illustrative of a stack of the conventional GMR element. In the drawing, a reference numeral 11 denotes an insulating film, a reference numeral 12 denotes a free layer, a reference numeral 13 denotes a conductive layer, a reference numeral 14 denotes a pinned layer, a reference numeral 15 denotes an antiferromagnetic layer, and a reference numeral 16 denotes an insulating film. The free layer 12 is a layer in which a magnetization direction rotates freely, and is made of NiFe or CoFe/NiFe. The conductive layer 13 is a layer in which a current flows and the electrons are scattered dependent on their spin, and is made of Cu. The pinned layer 14 is a layer in which a magnetization direction is fixed in a specific direction, and is made of CoFe or CoFe/Ru/CoFe. The antiferromagnetic layer 15 is a layer for fixing the magnetization direction of the pinned layer 14, and is made of PtMn or IrMn. The insulating films 11 and 16 are made of Ta, Cr, NiFeCr, or AlO. The pinned layer 14 may use a self-bias structure instead of the antiferromagnetic layer.

FIG. 4 is a plain view illustrative of a pattern shape of a conventional GMR element. The GMR element has a sensitive axis in the magnetization direction of the pinned layer 14. When there is no magnetic field, the magnetization direction of the free layer of the GMR element is the longitudinal direction of the GMR element. When the magnetic field is inputted in the direction of the sensitive axis, the magnetization direction of the free layer is changed depending on the magnetic field. Thus, the resistance of the GMR element is changed.

Recently, an electronic compass is widely used in a mobile phone or the like, and includes a magnetic sensor capable of detecting the terrestrial magnetism and outputting resolved three orthogonal axis components of the magnetic signal. By calculation using the three output signals obtained by the magnetic sensor, the electronic compass obtains the direction of the terrestrial magnetism precisely.

Now, a magnetic sensor detecting the terrestrial magnetism and outputting resolved three orthogonal axis components of the magnetic signal is proposed in PTL 1, for example. This sensor includes a two-axis magnetic sensor unit configured to detect terrestrial magnetism components in two axis directions (X axis and Y axis) which are set parallel to a substrate surface and perpendicular to each other, and a magnetic flux concentrator concentrating a magnetic field in the perpendicular direction (Z axis) to the substrate surface including the two axes and disposed on the two-axis magnetic sensor unit. Coils are formed on a magneto-resistance element, and the magnetization direction is controlled by a magnetic field generated by a current flowing into the coils, and the magnetic flux concentrator converts the magnetic field direction to detect the X-, Y-, and −Z magnetic fields on the substrate.

In addition, open/close switch and rotation detector widely used in a mobile phone or the like are proposed in PTL 2, for example. A magnetic sensor and a magnet are used in detection, and a hinge is made of nonmagnetic material so as to prevent an erroneous detection of the magnetic sensor.

In addition, for example, a technique described in PTL 3 relates to a magnetic recording head using a GMR element, and PTL 3 discloses a spin-valve magneto-resistance (MR) sensor including a pinned layer which has been improved so that the magneto-static coupling of a free layer is the minimum. A stack of the free layer and a pinned layer is illustrated in PTL 3.

In addition, a magnetic sensor using a Hall element is proposed as an electronic compass for detecting a three-dimensional magnetic field. Hall element can detect a magnetic field perpendicular to a substrate where the Hall element is disposed, and can detect a magnetic field in Z direction when the element is disposed on the substrate surface. For example, PTL 4 describes that Hall elements are disposed in a cross shape, i.e. on the upper and lower sides, and right and left sides with respect to a symmetry center under a circular magnetic flux concentrator. By utilizing the fact that a horizontal magnetic field is converted into a magnetic field perpendicular to the substrate at an end of the magnetic flux concentrator, not only the perpendicular magnetic field but also the horizontal magnetic field are detected, so that the magnetic fields in X-, Y-, and Z-axis directions can be detected on the substrate.

In addition, for example, a technique described in PTL 5 relates to a magnetic sensor having magneto-resistive effect elements disposed so as to intersect with one another in three dimensional directions on a single substrate. The magnetic sensor uses the magneto-resistance element including a pinned layer and a free layer. Then, PTL 5 describes the magnetic sensor with high sensitivity measuring a magnetic field in a direction perpendicular to a surface of the magnetic sensor. It is proposed that X-, Y-, and Z magnetic fields are detectable on the substrate, by performing vector decomposition for the Z magnetic field applied in the vertical direction which is originally undetectable, by disposing the magneto-resistance element detecting a horizontal magnetic field on a slope.

In addition, for example, PTL 6 describes a GMR element formed to have one polygonal line pattern on a substrate.

CITATION LIST

Patent Literature

PTL1: JP 2006-3116 A
PTL2: JP 2006-10461 A
PTL3: JP H07-169026 A
PTL4: JP 2002-71381 A
PTL5: JP 2004-6752 A
PTL6: JP 2003-282996 A

SUMMARY OF INVENTION

Technical Problem

However, by changing mindset without being tied to common sense, the inventors found that a magnetic sensor outputting a magnetic signal which contains three orthogonal components of a magnetic field in a mixed state without separation is useful in many applications of responding to the magnetic field, since it is possible to respond to the magnetic field in any direction, not only in a specific direction.

In an application in which a magnetic field is generated in a specific direction, such as, in a case where a magnetic field generated by a current flowing through a conductor is detected with a magnetic sensor having only one sensitive axis, an output signal proportional to the magnitude of current is obtained with high sensitivity, when the magnetic sensor is disposed such that the sensitive axis of the magnetic sensor is aligned with the direction of the magnetic field generated by the current. However, the mounting of the conductor and the magnetic sensor may be constrained, thus it may be impossible to dispose the magnetic sensor such that the sensitive axis of the magnetic sensor is aligned with the direction of the magnetic field generated by the current. Even in such a case, a magnetic sensor responding to a magnetic field in any direction can reduce the dependence of sensitivity on the arrangement of the magnetic sensor, and can obtain an output signal proportional to the magnitude of the current. Therefore, such a magnetic sensor can increase the degree of freedom for an application design.

In PTL 2 described above, the magnetic sensor detects the magnetic field in one axis direction. Therefore, the magnetic sensor has to be disposed such that the sensitive axis of the magnetic sensor is aligned with the direction of the magnetic field generated by the magnet. That is, plural magnetic sensors are needed to be disposed such that the sensitive axis of each of magnetic sensors is aligned with the magnetic field direction generated by each of magnets. Such a magnetic sensor is not sufficient for the significant densification of the mobile phone and the like recently, with respect to the downsizing of the device or the space-saving in the housing.

In addition, the above-mentioned magnetic sensor described in PTL 1 can respond to the three axis components, however, it is difficult to mount this sensor on a portable device or the like since this sensor is large because of usage of coils.

In short, the techniques described in PTL 1 to PTL 6 can not respond to the magnetic field of three orthogonal axes to output three axis components in a mixed state without separation in spite of having a small size.

On the other hand, from the viewpoint of the downsizing of the device or the space saving in the housing, there is needed a magnetic sensor capable of responding to the magnetic field of two axes including an axis perpendicular to a substrate and an axis parallel to the substrate or the magnetic field of three orthogonal axes, and of separating the two axis components or the three axis components.

FIG. 5 is a view illustrative of the difference between a conventional three-chip type three-axis magnetic sensor and a one-chip type three-axis magnetic sensor according to one embodiment of the present invention. The conventional three-chip type three-axis magnetic sensor includes an X axis sensor 22X, a Y axis sensor 22Y, a Z axis sensor 22Z, and a signal processing circuit on a substrate 21. This three-chip type magnetic sensor has a large sensor area, thus there is a problem in miniaturization. Therefore, it has been desired to develop a miniaturized magnetic sensor capable of obtaining three axis sensor signals at the same time. The one-chip type three-axis magnetic sensor according to the one embodiment of the present invention can obtain three axis sensor signals at the same time, thus reduce the sensor area substantially and realize miniaturization.

That is, in magnetic sensing units, magneto-resistance elements, such as GMR elements or a tunneling magneto-resistance effect (TMR) elements are used. The GMR element is a magneto-resistance responding in only one direction. Therefore, three die-chips are necessary for three-axes detection. In contrast, the magnetic sensor according to the one embodiment of the present invention makes it possible to detect in three axes at the same time with only one die-chip. Such a configuration makes it possible to reduce the sensor area to one-third or less with the same resolution, and is useful for a rotation angle sensor or an azimuth sensor.

As mentioned above, the inventors found that there is the necessity of a magnetic sensor capable of detecting at least a magnetic field perpendicular to a substrate and a magnetic field parallel to the substrate in a state where these magnetic field components are mixed and separable.

The present invention has been made in view of such problems, and an object is to provide a magnetic sensor capable of detecting at least a magnetic field perpendicular to a substrate and a magnetic field parallel to the substrate in a state where these magnetic field components are mixed and separable.

Solution to Problem

The present invention has been made to achieve the above object, and includes the following features.

(1) A magnetic sensor comprises: a plurality of magnetic flux concentrator units (60a, 60b) substantially parallel to each other and substantially parallel to a substrate, one of two adjacent ones of the plurality of magnetic flux concentrator units being displaced with respect to another of the two adjacent ones in a longitudinal direction; a plurality of magnetic detectors (50a, 50b) substantially parallel to the plurality of magnetic flux concentrator units (60a, 60b), disposed between two adjacent magnetic flux concentrator units (60a, 60b) of the plurality of magnetic flux concentrator units in a planar view. The plurality of magnetic detectors includes a first and a second magnetic detectors (50a, 50b) disposed to be close to the two adjacent ones (60a, 60b) of the plurality of magnetic flux concentrator units (60a, 60b), respectively, in the planar view (all embodiment).

(2) The first magnetic detector (50a) is disposed to be closer to one magnetic flux concentrator unit (60a) than to another magnetic flux concentrator unit (60b) of the two ones (60a, 60b) of the plurality of magnetic flux concentrator units (60a, 60b), in the planar view. The second magnetic detector (50b) is disposed to be closer to the another magnetic flux concentrator unit (60b) than to the one magnetic flux concentrator unit (60a), in the planar view.

(3) The plurality of magnetic flux concentrator units include three or more magnetic flux concentrator units (60a to 60c). One magnetic flux concentrator unit (60a) of the three or more magnetic flux concentrator units is disposed to be displaced with respect to two other magnetic flux concentrator units (60b, 60c) in the longitudinal direction and the two other magnetic flux concentrator units (60b, 60c) face with each other to sandwich the one magnetic flux concentrator unit (60a), in the planar view (for example, the third embodiment, FIG. 13).

(4) Respective inter-edge distances between the plurality of magnetic flux concentrator units are substantially equal to each other.

(5) Respective centroid positions of the plurality of magnetic flux concentrator units are disposed zigzag in the planar view.

(6) Alternate ones of the plurality of magnetic flux concentrator units face each other in the planar view.

(7) A magnetic flux concentrator member is provided at an end of one of the plurality of magnetic flux concentrator units.

(8) The one of the plurality of magnetic flux concentrator units and the magnetic flux concentrator member form a magnetic flux concentrator unit having a T-shape, a Y-shape or an L-shape.

(9) The magnetic sensor further comprises a third magnetic detector (50c) disposed to be covered with one (60b) of the plurality of magnetic flux concentrator units in the planar view (for example, the first embodiment, FIGS. 8A and 8B).

(10) The plurality of magnetic flux concentrator units are alternately connected to each other via the magnetic flux concentrator member.

(11) The magnetic sensor further comprises a fourth and a fifth magnetic detectors (50e, 50f) disposed outside of magnetic flux concentrator units (60a, 60c) disposed at ends, among the plurality of magnetic flux concentrator units, respectively, in the planar view (the fourteenth embodiment, FIG. 26).

(12) A magnetic flux concentrator unit disposed at an end, among the plurality of magnetic flux concentrator units and the magnetic flux concentrator member form a magnetic flux concentrator unit having a T-shape, a Y-shape or an L-shape, in the planar view. Magnetic flux concentrator units among the plurality of magnetic flux concentrator units other than the magnetic flux concentrator unit disposed at the end are alternately connected to each other via the magnetic flux concentrator member.

(13) Sensitive axes of the plurality of magnetic detectors are an identical first axis direction.

(14) The magnetic sensor comprises a calculator (80) configured to calculate a magnetic field in a second axis direction and a magnetic field in a third axis direction, on the basis of respective outputs of the plurality of magnetic detectors.

(15) The calculator (80) is configured to calculate the magnetic fields in the second and the third axis directions, on the basis of respective resistances of the plurality of magnetic detectors.

(16) Sensitive axes of the plurality of magnetic detectors and of the third magnetic detector are an identical first axis direction.

(17) The magnetic sensor comprises a calculator (80) configured to calculate a magnetic field in a second axis direction and a magnetic field in a third axis direction, on the basis of respective outputs of the plurality of magnetic detectors and of the third magnetic detector (the fifth and fourteenth embodiments, FIGS. 18 and 29).

(18) The calculator is configured to calculate the magnetic fields in the second and the third axis directions, on the basis of respective resistances of the plurality of magnetic detectors and of the third magnetic detector.

(19) Sensitive axes of the plurality of magnetic detectors, and of the fourth and the fifth magnetic detectors are an identical first axis direction.

(20) The magnetic sensor comprises a calculator configured to calculate a magnetic field in a second axis direction and a magnetic field in a third axis direction, on the basis of respective outputs of the plurality of magnetic detectors, and of the fourth and the fifth magnetic detectors.

(21) The calculator is configured to calculate the magnetic fields in the second and the third axis directions, on the basis of respective resistances of the plurality of magnetic detectors, and of the fourth and the fifth magnetic detectors.

(22) The calculator is configured to calculate the magnetic fields in the second and the third axis directions by solving simultaneous equations with respect to the respective resistances.

(23) The first axis direction is parallel to the substrate, and the second axis direction is parallel to the substrate and perpendicular to the first axis direction, and the third axis direction is perpendicular to the substrate.

(24) A magnetic sensor comprises: a magnetic detector (50a/50b) including a magnetic field sensitive material configured to detect a magnetic field component in a first direction (X axis), and a magnetic field direction converter (60a, 60b) configured to convert a magnetic field component in a second direction (Y axis) and a magnetic field component in a third direction (Z axis) into the magnetic field component in the first direction, the second direction being perpendicular to the first direction, the third direction being perpendicular to both of the first and the second directions (the first to fourth embodiments, FIGS. 8A, 8B, 12A, 12B, 13, and 14).

(25) The magnetic field direction converter comprises a first and a second magnetic flux concentrator units (60a, 60b) disposed to be substantially parallel to each other on a substrate. In an arrangement pattern including the first and the second magnetic flux concentrator units and the magnetic field sensitive material included in the magnetic detector, the magnetic field sensitive material included in the magnetic detector is disposed between the first magnetic flux concentrator unit (60a) and the second magnetic flux concentrator unit (60b) in a planar view of the substrate (the first and second embodiments, FIGS. 8A, 8B, 12A, and 12B).

(26) The magnetic field sensitive material included in the magnetic detector is disposed to be substantially parallel to the first magnetic flux concentrator unit and the second magnetic flux concentrator unit in the planar view of the substrate.

(27) A distance between the magnetic field sensitive material included in the magnetic detector and the first magnetic flux concentrator unit is shorter than a distance between the magnetic field sensitive material included in the magnetic detector and the second magnetic flux concentrator unit.

(28) The first and the second magnetic flux concentrator units are disposed to form a magnetic path of a magnetic flux component from the second magnetic flux concentrator unit to the first magnetic flux concentrator unit, when a magnetic field is inputted in a longitudinal direction of the second magnetic flux concentrator unit.

(29) The first direction and the second direction are parallel to a plane of the substrate, and the third direction is perpendicular to the plane of the substrate.

(30) The second magnetic flux concentrator unit is disposed to be displaced with respect to the first magnetic flux concentrator unit in a longitudinal direction of the second magnetic flux concentrator unit.

(31) The magnetic field direction converter comprises a third magnetic flux concentrator unit and/or a fourth magnetic flux concentrator unit. The third magnetic flux concentrator unit is disposed at a position where the first magnetic flux concentrator unit is sandwiched between the third magnetic flux concentrator unit and the second magnetic flux concentrator unit. The fourth magnetic flux concentrator unit is disposed at a position where the second magnetic flux concentrator unit is sandwiched between the fourth magnetic flux concentrator unit and the first magnetic flux concentrator unit.

(32) The first to the fourth magnetic flux concentrator units are equipped with a first to a fourth magnetic flux concentrator members, respectively, disposed at the ends of the first to the fourth magnetic flux concentrator units. The first to the fourth magnetic flux concentrator units and the first to the fourth magnetic flux concentrator members form T-shapes, Y-shapes, or L-shapes, respectively, in the planar view of the substrate.

(33) The first to the fourth magnetic flux concentrator units and the first to the fourth magnetic flux concentrator members forming T-shapes, Y-shapes, or L-shapes have gaps between one another.

(34) A part of the magnetic field sensitive material included in the magnetic detector, the part extending along a long side of the magnetic field sensitive material, is covered with any one of the first or the second magnetic flux concentrator unit on the plane of the substrate.

(35) The magnetic sensor comprises an auxiliary magnetic detector (50c) including a magnetic field sensitive material having the same structure as a structure of the magnetic field sensitive material included in the magnetic detector. The magnetic field sensitive material included in the auxiliary magnetic detector is disposed not to sense magnetic field components in the first to the third directions. The arrangement pattern includes the magnetic field sensitive material included in the auxiliary magnetic detector (for example, the second embodiment, FIGS. 12A, and 12B).

(36) The magnetic field sensitive material included in the auxiliary magnetic detector is covered with any one of the first or the second magnetic flux concentrator units.

(37) The magnetic field sensitive material included in the auxiliary magnetic detector is covered with the second magnetic flux concentrator unit.

(38) In (24) to (37), the magnetic sensor comprises a plurality of the arrangement patterns.

(39) In the plurality of arrangement patterns, the magnetic field sensitive material included in the magnetic detector and/or the magnetic field sensitive material included in the auxiliary magnetic detector in each of the arrangement patterns are/is electrically connected to the magnetic field sensitive material included in the magnetic detector and/or the magnetic field sensitive material included in the auxiliary magnetic detector in another arrangement pattern in a stage adjacent and subsequent to the each of the arrangement patterns, respectively.

(40) In the plurality of arrangement patterns, the magnetic field sensitive material included in the magnetic detector in each of the arrangement patterns is electrically connected to the magnetic field sensitive material included in the magnetic detector in another arrangement pattern in a stage adjacent and subsequent to the each of the arrangement patterns.

(41) In the plurality of arrangement patterns, the magnetic field sensitive material included in the auxiliary magnetic detector in each of the arrangement patterns is electrically connected to the magnetic field sensitive material included in the auxiliary magnetic detector in another arrangement pattern in a stage adjacent and subsequent to the each of the arrangement patterns.

(42) The magnetic field sensitive material included in the magnetic detector is configured to detect the magnetic field component in only the first direction.

(43) The first to the fourth magnetic flux concentrator units and the first to the fourth magnetic flux concentrator members are made of a soft magnetic material.

(44) The magnetic sensor comprises a controller configured to control another function block. The controller is configured to receive a signal obtained from an output of the magnetic detector, the signal being in a state where magnetic field components in the first to third directions are summed, and to control the another function block by using the signal in the state where the magnetic field components in the first to third directions are summed.

(45) The magnetic sensor comprises: a signal generator configured to generate a signal on the basis of an output of the magnetic detector and an output of the auxiliary magnetic detector, the signal being in a state where magnetic field components in the first to third directions are summed; and a controller configured to control another function block. The controller is configured to control the another function block by using the signal outputted from the signal generator, the signal being in the state where the magnetic field components in the first to third directions are summed.

(46) A magnetic sensor for detecting magnetic field components in two axis directions or three axis directions, the magnetic sensor comprises an arrangement pattern including: three or more magnetic detectors (50a to 50d) disposed to be parallel to one another and parallel to a substrate plane (70); and a first to a third magnetic flux concentrator units (60a to 60c) disposed to be parallel to one another and parallel to the substrate plane. The first to the third magnetic flux concentrator units are disposed to form respective magnetic paths of a magnetic flux component from the second magnetic flux concentrator unit to the first magnetic flux concentrator unit (60a) and a magnetic flux component from the second magnetic flux concentrator unit to the third magnetic flux concentrator unit (60c), when a magnetic field is inputted in a longitudinal direction of the second magnetic flux concentrator unit (60b). The three or more magnetic detectors are divided into a first magnetic detector group (50a, 50b) disposed between the second magnetic flux concentrator unit and the first magnetic flux concentrator unit and a second magnetic detector group (50c and/or 50d) disposed between the second magnetic flux concentrator unit and the third magnetic flux concentrator unit (for example, the fifth embodiment, FIGS. 15A and 15B).

(47) All of the three or more magnetic detectors have a sensitive axis in a first axis direction parallel to the substrate plane. The two axis directions include a second axis direction parallel to the substrate plane and perpendicular to the first axis direction and a third axis direction perpendicular to the substrate plane. The three axis directions include the first to the third axis directions.

(48) The three or more magnetic detectors are disposed such that inter-median-line distances are substantially equal to one another, the inter-median-line distances including first inter-median-line distances between a first virtual median line and centerlines of the respective magnetic detectors in the first magnetic detector group extending in a longitudinal direction of the magnetic detectors, the first virtual median line being a line midway between the first magnetic flux concentrator unit and the second magnetic flux concentrator unit, and second inter-median-line distances between a second virtual median line and centerlines of the respective magnetic detectors in the second magnetic detector group extending in the longitudinal direction of the magnetic detectors, the second virtual median line being a line midway between the second magnetic flux concentrator unit and the third magnetic flux concentrator unit.

(49) Any one of the inter-median-line distances is not shorter than 0.7 times and not longer than 1.3 times another of the inter-median-line distances.

(50) The second magnetic flux concentrator unit is disposed to be displaced with respect to the first and the third magnetic flux concentrator units in the longitudinal direction of the second magnetic flux concentrator unit.

(51) A centroid position of the second magnetic flux concentrator unit is not located on a virtual line connecting centroid positions of the first and the third magnetic flux concentrator units in a planar view.

(52) A first inter-edge distance between the first magnetic flux concentrator unit and the second magnetic flux concentrator unit is substantially equal to a second inter-edge distance between the second magnetic flux concentrator unit and the third magnetic flux concentrator unit.

(53) The first inter-edge distance is not shorter than 0.7 times and not longer than 1.3 times the second inter-edge distance.

(54) The magnetic sensor comprises a fourth magnetic flux concentrator unit and/or a fifth magnetic flux concentrator unit. The fourth magnetic flux concentrator unit is disposed at a position where the first magnetic flux concentrator unit is sandwiched between the fourth magnetic flux concentrator unit and the second magnetic flux concentrator unit. The fifth magnetic flux concentrator unit is disposed at a position where the third magnetic flux concentrator unit is sandwiched between the fifth magnetic flux concentrator unit and the second magnetic flux concentrator unit.

(55) Magnetic flux concentrator members are disposed at the ends on the magnetic flux concentrator units, respectively. The magnetic flux concentrator units form magnetic flux concentrator units having T-shapes, Y-shapes, or L-shapes, respectively.

(56) The magnetic flux concentrator members of the magnetic flux concentrator units having T-shapes, Y-shapes, or L-shapes have gaps between each other.

(57) A part of each of the three or more magnetic detectors extending along a long side of the magnetic detectors is covered with any one of the first to the third magnetic flux concentrator units on the substrate plane.

(58) The arrangement pattern comprises an auxiliary magnetic detector (50e) in addition to the three or more magnetic detectors, wherein the auxiliary magnetic detector is covered with one of the magnetic flux concentrator units (the fifth embodiments, FIGS. 15A and 15B).

(59) The three or more magnetic detectors are four magnetic detectors.

(60) The auxiliary magnetic detector is covered with any one of the first to the three magnetic flux concentrator units.

(61) In (40) to (61), the magnetic sensor comprises a plurality of the arrangement patterns.

(62) In the plurality of arrangement patterns, the third magnetic flux concentrator unit in each of the arrangement patterns serves as the first magnetic flux concentrator unit in another arrangement pattern in a stage adjacent and subsequent to the each of the arrangement patterns.

(63) In the plurality of arrangement patterns, the three or more magnetic detectors and/or the auxiliary magnetic detector in each of the arrangement patterns are/is electrically connected to the three or more magnetic detectors and/or the auxiliary magnetic detector in another arrangement pattern in a stage adjacent and subsequent to the each of the arrangement patterns, respectively.

(64) The magnetic sensor comprises a calculator configured to receive signals on the basis of outputs from the three or more magnetic detectors to calculate a magnetic field component of Y axis and a magnetic field component of Z axis, the Y axis being perpendicular to sensitive axes of the three or more magnetic detectors and parallel to the substrate plane, the Z axis being perpendicular to the substrate plane.

(65) The magnetic sensor comprises a calculator configured to receive signals on the basis of outputs from the three or more magnetic detectors and an output from the auxiliary magnetic detector to calculate a magnetic field component of sensitive axes of the three or more magnetic detectors, a magnetic field component of Y axis, and a magnetic field component of Z axis, the Y axis being perpendicular to the sensitive axes of the three or more magnetic detectors and parallel to the substrate plane, the Z axis being perpendicular to the substrate plane.

(66) The calculator is configured to calculate the magnetic field component of the sensitive axes of the three or more magnetic detectors by adding signals obtained by subtracting the signal on the basis of the output from the auxiliary magnetic detector from the signals on the basis of the outputs from the three or more magnetic detectors.

(67) A magnetic detecting method uses the magnetic sensor described in any one of (46) to (66).

(68) In a magnetic detecting method, magnetic field components in two axis directions are detected on the basis of outputs ($R_A$ to $R_C$) from a first and a second magnetic detectors sandwiched between a first and a second magnetic flux concentrator units and from a third magnetic detector sandwiched between the second and a third magnetic flux concentrator units. The first to the third magnetic detectors have a sensitive axis in an identical first axis direction. The magnetic detecting method comprising: calculating a magnetic field component ($2\Delta Ry$) in a second axis direction (Y axis) on the basis of a value based on the output ($R_A$=R+$\Delta Rx$−$\Delta Ry$−$\Delta Rz$) from the first magnetic detector and a value based on the output ($R_C$=R+$\Delta Rx$+$\Delta Ry$−$\Delta Rz$) from the third magnetic detector; and calculating a magnetic field component ($2\Delta Rz$) in a third axis direction (Z axis) on the basis of the value based on the output ($R_A$=R+$\Delta Rx$−$\Delta Ry$−$\Delta Rz$) from the first magnetic detector and a value based on the output ($R_B$=R+$\Delta Rx$−$\Delta Ry$+$\Delta Rz$) from the second magnetic detector.

(69) In a magnetic detecting method, magnetic field components in two axis directions are detected on the basis of outputs ($R_A$ to $R_D$) from a first and a second magnetic detectors sandwiched between a first and a second magnetic flux concentrator units and from a third and a fourth magnetic detectors sandwiched between the second and a third magnetic flux concentrator units. The first to the fourth magnetic detectors have a sensitive axis in an identical first axis direction. The magnetic detecting method comprising: calculating a magnetic field component (4ΔRy) in a second axis direction (Y axis) on the basis of a value ($R_C+R_D-(R_A+R_B)$) obtained by subtracting a sum ($R_A+R_B$) of values based on the outputs ($R_A$, $R_B$) from the first and the second magnetic detectors from a sum ($R_C+R_D$) of values based on the outputs ($R_C$, $R_D$) from the third and the fourth magnetic detectors; and calculating a magnetic field component (4ΔRz) in a third axis (Z axis) direction on the basis of a value ($R_B+R_D-(R_A+R_C)$) obtained by subtracting a sum ($R_A+R_C$) of the values based on the outputs ($R_A$, $R_C$) from the first and the third magnetic detectors from a sum ($R_B+R_D$) of the values based on the outputs ($R_B$, $R_D$) from the second and the fourth magnetic detectors, or calculating the magnetic field component (2ΔRy) in the second axis direction (Y axis) on the basis of the output ($R_A$=R+ΔRx−ΔRy−ΔRz) from the first magnetic detector and the output ($R_C$=R+ΔRx+ΔRy−ΔRz) from the third magnetic detector; and calculating the magnetic field component (2ΔRz) in the third axis direction (Z axis) on the basis of the output ($R_A$=R+ΔRx−ΔRy−ΔRz) from the first magnetic detector and the output ($R_B$=R+ΔRx−ΔRy+ΔRz) from the second magnetic detector.

(70) In the magnetic detecting method, magnetic field components in three axis directions are detected on the basis of the outputs from the first to third magnetic detectors and an output from an auxiliary magnetic detector covered with a magnetic flux concentrator unit. The first to the third magnetic detectors and the auxiliary magnetic detector have a sensitive axis in the first axis direction. The magnetic detecting method comprising calculating a magnetic field component (2ΔRx) in the first axis direction (X axis) on the basis of the output ($R_B$=R+ΔRx−ΔRy+ΔRz) from the second magnetic detector, the output ($R_C$=R+ΔRx+ΔRy−ΔRz) from the third magnetic detector, and the output ($R_E$=R) from the auxiliary magnetic detector (50e), in addition to the calculating the magnetic field component in the second axis direction and the calculating the magnetic field component in the third axis direction.

(71) In the magnetic detecting method, magnetic field components in three axis directions are detected on the basis of the outputs from the first to fourth magnetic detectors and an output from an auxiliary magnetic detector covered with a magnetic flux concentrator unit. The first to the fourth magnetic detectors and the auxiliary magnetic detector have a sensitive axis in the first axis direction. The magnetic detecting method comprising calculating a magnetic field component (4ΔRx) in the first axis direction (X axis) on the basis of a total sum ($R_A+R_B+R_C+R_D$) of signals based on the outputs ($R_A$, $R_B$, $R_C$, $R_D$) from the first to the fourth magnetic detectors (50a to 50d), the signals being obtained by subtracting a value based on the output ($R_E$) from the auxiliary magnetic detector (50e) from values based on the outputs from the first to the fourth magnetic detectors (50a to 50d), in addition to the calculating the magnetic field component in the second axis direction and the calculating the magnetic field component in the third axis direction.

(72) The second axis direction is perpendicular to the sensitive axes of the magnetic detectors and parallel to a substrate plane and the third axis direction is perpendicular to the substrate plane.

(73) The first axis direction is a direction of sensitive axes of the magnetic detectors.

Advantageous Effects of Invention

According to the present invention, it is possible to achieve a magnetic sensor capable of detecting at least a magnetic field perpendicular to a substrate and a magnetic field parallel to the substrate in a state where these magnetic field components are mixed and separable.

BRIEF DESCRIPTION OF DRAWINGS

FIG. 14 is a view illustrative of an arrangement pattern of magnetic detectors having magnetic field sensitive materials and magnetic flux concentrator units in the fourth embodiment;

FIG. 24A and FIG. 24B are views illustrative of the eleventh embodiment;

DESCRIPTION OF EMBODIMENTS

Before describing respective embodiments of the present invention, the principle of a magnetic field detection using a magneto-resistance element, as a premise of the magnetic sensor in the respective embodiments of the present invention, will be hereinafter described.

Figure 1:
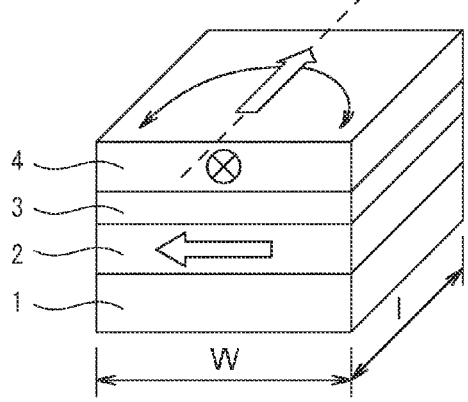
FIG. 1 is a perspective view illustrative of an operation principle of a conventional GMR element.
Figure 2:
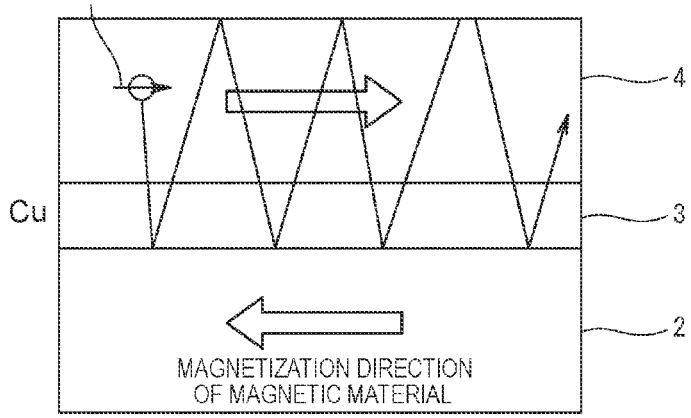
FIG. 2 is a partial cross-sectional view of FIG. 1.
Figure 3:
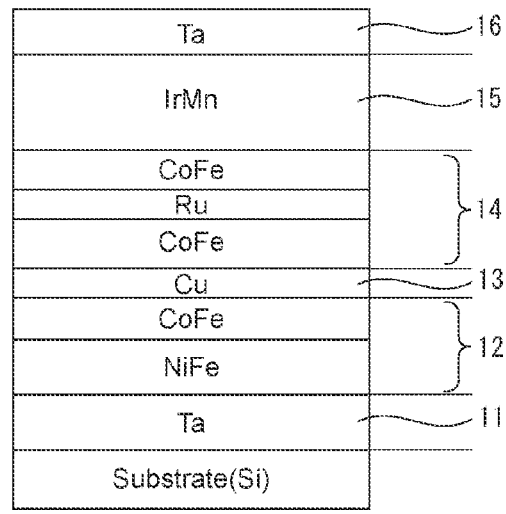
FIG. 3 is a schematic diagram illustrative of a stack of the conventional GMR element.
Figure 4:
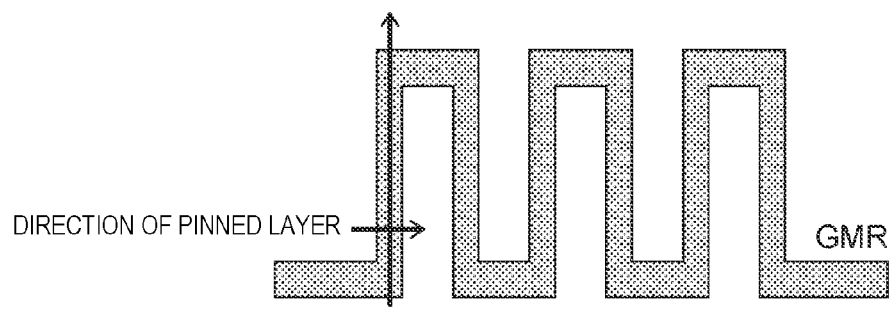
FIG. 4 is a plain view illustrative of a pattern shape of the conventional GMR element.
Figure 5:
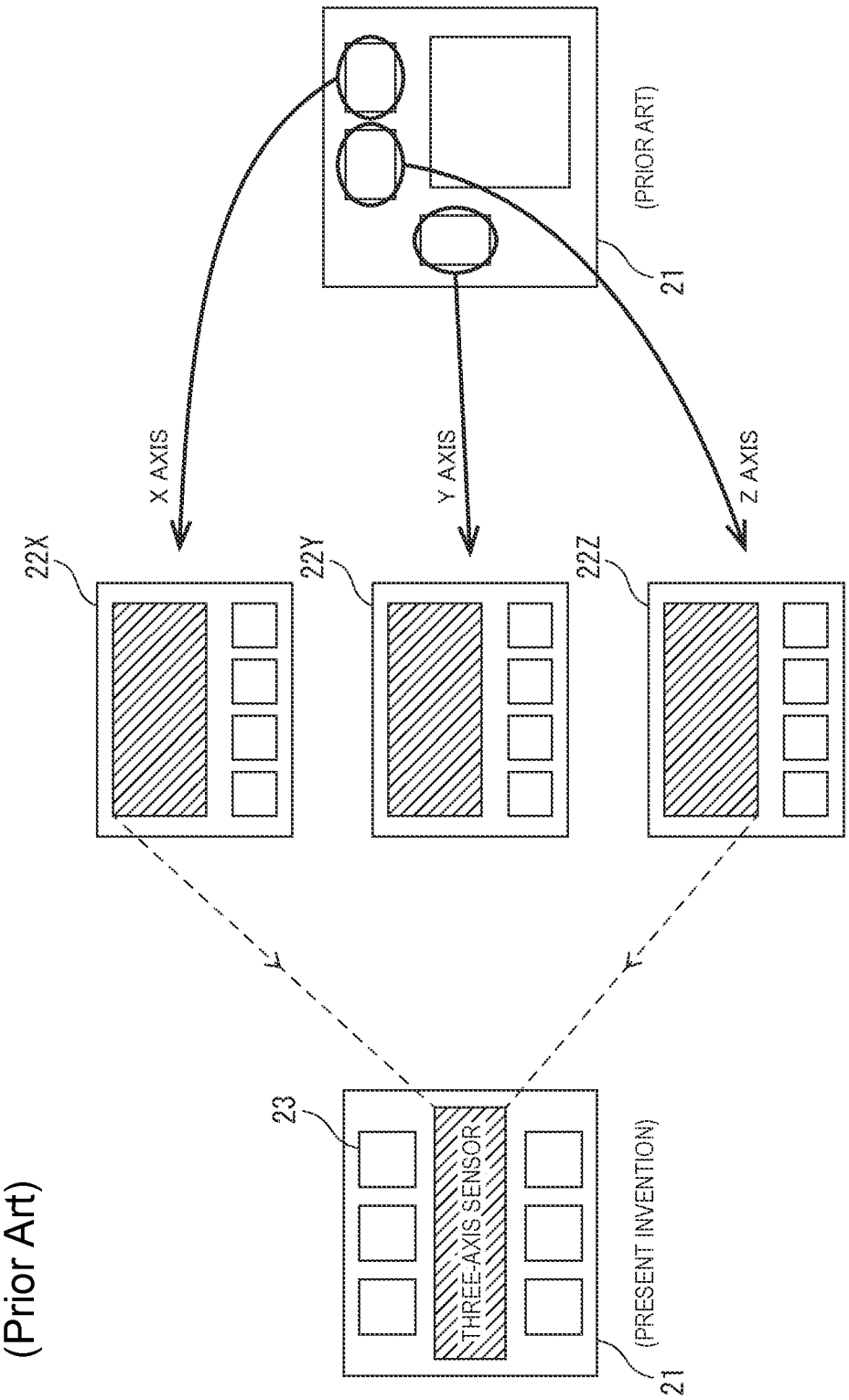
FIG. 5 is a view illustrative of the difference between a conventional three-chip type three-axis magnetic sensor and a one-chip type three-axis magnetic sensor according to one embodiment of the present invention.
Figure 6:
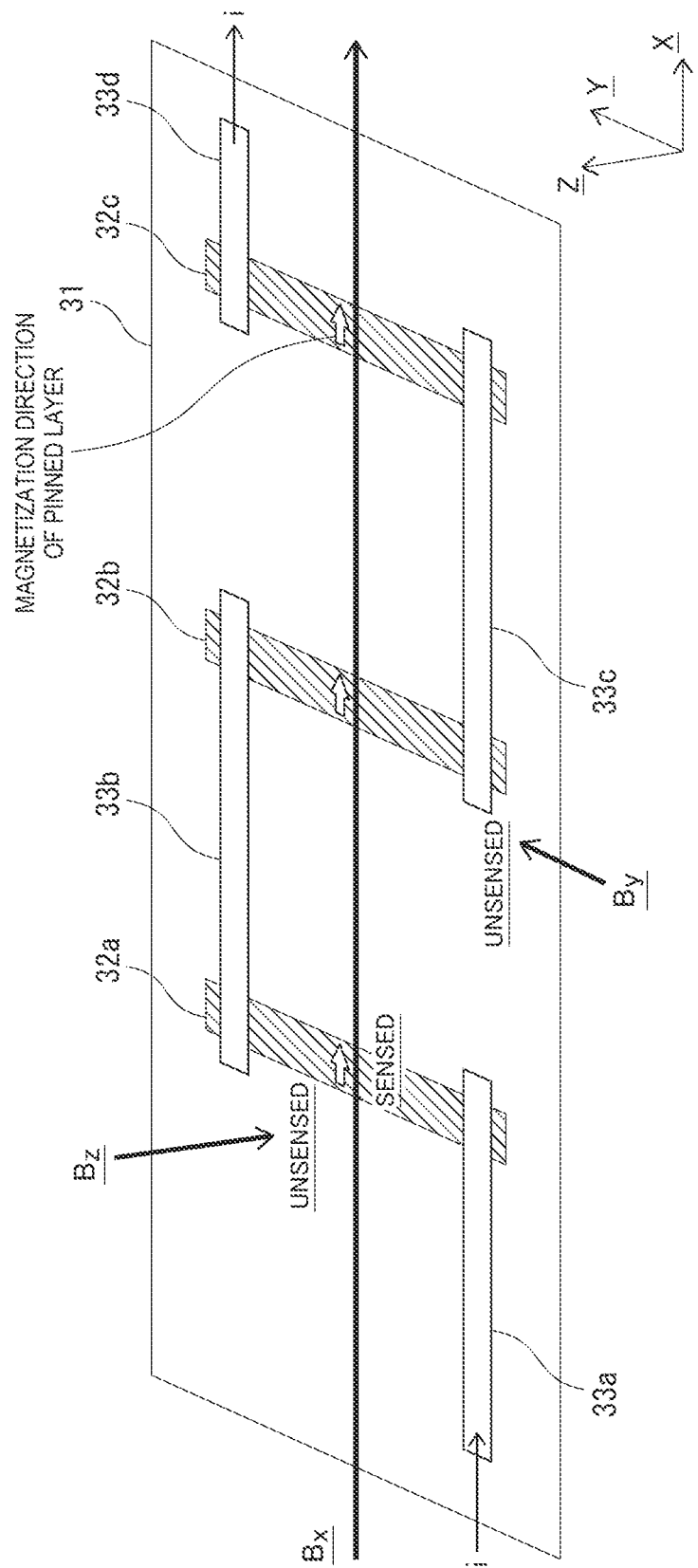
FIG. 6 is a view illustrative of an operation principle of magnetic field detection using a magneto-resistance element.

FIG. 6 is a view illustrative of the operation principle of the magnetic field detection using the magneto-resistance element. In the drawing, a reference numeral 31 denotes a silicon substrate, reference numerals 32a to 32c denote GMR elements as a kind of magneto-resistance element, and reference numerals 33a to 33d denote metal wirings. As the plural GMR elements 32a to 32c, the GMR element illustrated in FIG. 1 is used, for example. In addition, the arrows on the GMR elements in the drawing indicate the magnetization directions of the pinned layers. It is noted that the magnetic sensor used in the respective embodiments is not limited to the GMR element, and may be made of a magneto-resistance element such as TMR elements or AMR elements.

On the silicon substrate 31, the plural GMR elements 32a to 32c and the plural metal wirings 33a to 33d are mounted, and the plural GMR elements 32a to 32c are connected by the respective metal wirings 33a to 33d. The plural GMR elements 32a to 32c are formed in a flat plate shape and have a rectangular shape whose longitudinal direction coincides with the Y direction. In the drawing, the shapes of the GMR elements in a planar view (when viewed in the Z direction) are rectangular, but are not limited to rectangular. When a current i flows from the metal wiring 33a to the metal wiring 33d through the metal wirings 33b and 33c, the plural GMR elements 32a to 32c sense a magnetic field Bx in the X direction. The plural GMR elements 32a to 32c are magneto-resistance elements responding to in only one direction, therefore, the plural GMR elements 32a to 32c sense the magnetic field in the X direction when the magnetization directions of the pinned layers are the X direction, and do not sense the magnetic field in the Y or Z direction. The magneto-resistance $R_{GMR}$ of the GMR element in this case is represented as follows.

$$R_{GMR} = R + \Delta Rx$$

Here, R represents the resistance which does not depend on the magnetic field, and $\Delta Rx$ represents the amount of the resistance change depending on the magnitude of the magnetic field Bx in the X direction.

Figure 7:
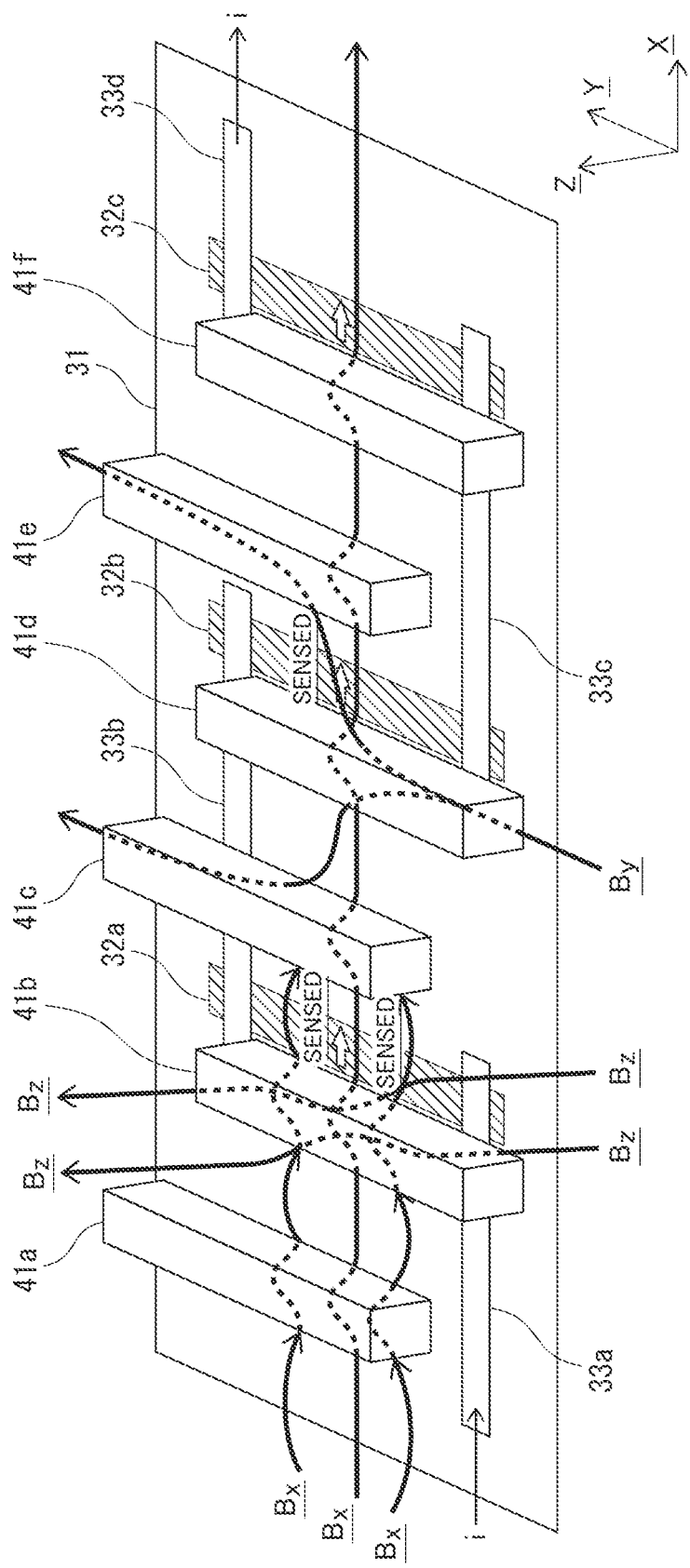
FIG. 7 is a view illustrative of the magnetic field detection in a case where the magneto-resistance element illustrated in FIG. 6 is provided with a magnetic flux concentrator.

FIG. 7 is a view illustrative of the magnetic field detection in a case where the magneto-resistance element illustrated in FIG. 6 is provided with magnetic flux concentrators. In the drawing, reference numerals 41a to 41f denote magnetic flux concentrators. It is noted that the same numerals are assigned to the components having the same functions as those in FIG. 6.

The plural magnetic flux concentrators 41a to 41f are formed on the plural GMR elements 32a to 32c and the plural metal wirings 33a to 33d. In addition, the plural magnetic flux concentrators 41a to 41f have thicknesses in the Z direction, and have a rectangular parallelepiped shape whose longitudinal direction coincides with the Y direction. The plural magnetic flux concentrators 41a to 41f are disposed in parallel to the Y direction. In FIG. 7, the magnetic flux concentrators are rectangular parallelepiped, but are not limited to rectangular parallelepiped.

Some magnetic flux concentrators 41b, 41d, and 41f among the plural magnetic flux concentrators 41a to 41f are disposed to project from some other magnetic flux concentrators 41a, 41c, and 41e toward the negative Y direction. And the some magnetic flux concentrators 41b, 41d, and 41f are disposed to be adjacent to the plural GMR elements 32a to 32c, respectively, such that the some magnetic flux concentrators 41b, 41d, and 41f are positioned on the negative sides in the X direction with respect to the plural GMR elements 32a to 32c, respectively. By providing with such plural magnetic flux concentrators 41a to 41f, it is possible to make the magneto-resistance elements respond to the magnetic field components of the three axes. The principle of detection is described below.

First, with respect to a magnetic path of the magnetic field Bx in the X direction, the detection at the magnetic flux concentrator 41b and the GMR element 32a is described. A magnetic path in which the magnetic field Bx in the X direction is concentrated by the magnetic flux concentrator 41b, passes through the magnetic flux concentrator 41b, and traverses the GMR element 32a toward a positive X direction is formed. Similarly, the magnetic field Bx in the X direction traverses the GMR elements 32b and 32c. Thus the plural GMR elements 32a to 32c sense the magnetic field Bx in the X direction. Then, when the current i flows from the metal wiring 33a to the metal wiring 33d through the metal wirings 33b and 33c, the magnetic field Bx in the X direction sensed by the plural GMR elements 32a to 32c is detected.

Next, with respect to a magnetic path of the magnetic field By in the Y direction, the detection at the three magnetic flux concentrators 41c, 41d, and 41e, and the GMR element 32b is described. A magnetic path in which the magnetic field By in the Y direction passes through the magnetic flux concentrator 41c toward the negative X direction from the magnetic flux concentrator 41d projecting toward the negative Y direction, and a magnetic path in which the magnetic field By traverses the GMR element 32b toward the positive X direction from the magnetic flux concentrator 41d are formed. That is, the magnetic field By in the Y direction is converted into a magnetic field in the X direction, and traverses the GMR element 32b. Similarly, the magnetic field By in the Y direction is converted into the magnetic field in the X direction, and traverses the GMR elements 32a and 32c, thus the plural GMR elements 32a to 32c sense the magnetic field By in the Y direction. Then when the current i flows from the metal wiring 33a to the metal wiring 33d through the metal wirings 33b and 33c, the magnetic field By in the Y direction sensed by the plural GMR elements 32a to 32c is detected.

Furthermore, with respect to a magnetic path of the magnetic field Bz in the Z direction, the detection at the magnetic flux concentrator 41b and the GMR element 32a is described. A magnetic path in which the magnetic field Bz in the Z direction traverses the GMR element 32a toward the negative X direction, and is concentrated by the magnetic flux concentrator 41b is formed. That is, the magnetic field Bz in the Z direction is converted into a magnetic field in the X direction, and traverses the GMR element 32a. Similarly, the magnetic field Bz in the Z direction is converted into the magnetic field in the X direction, and traverses the GMR elements 32b and 32c, thus the plural GMR elements 32a to 32c sense the magnetic field Bz in the Z direction. Then when the current i flows from the metal wiring 33a to the metal wiring 33d through the metal wirings 33b and 33c, the magnetic field Bz in the Z direction sensed by the plural GMR elements 32a to 32c is detected.

That is, by converting the directions of the magnetic fields with the plural magnetic flux concentrators 41a and 41f, it is possible to sense the magnetic fields in the X, Y, and Z directions. The magneto-resistance $R_{GMR}$ of the GMR elements 32a to 32c in FIG. 7 in this case is represented as follows.

$$R_{GMR}=R+\Delta Rx+\Delta Ry-\Delta Rz$$

Here, R represents the resistance which does not depend on the magnetic field (or the resistance when there is no magnetic field), $\Delta Rx$ represents the amount of the resistance change depending on the magnitude of the magnetic field Bx in the X direction, $\Delta Ry$ represents the amount of the resistance change depending on the magnitude of the magnetic field By in the Y direction, and $\Delta Rz$ represents the amount of the resistance change depending on the magnitude of the magnetic field Bz in the Z direction. The sign of $\Delta Rz$ is different from the signs of $\Delta Rx$ and $\Delta Ry$, since the magnetic field in the X direction that is converted from the magnetic field Bz in the Z direction and traversing the plural GMR elements 32a to 32c is oriented toward the negative X direction.

Hereinafter, embodiments of the present invention will be described below in detail with reference to the drawings.

First Embodiment

Figure 8A:
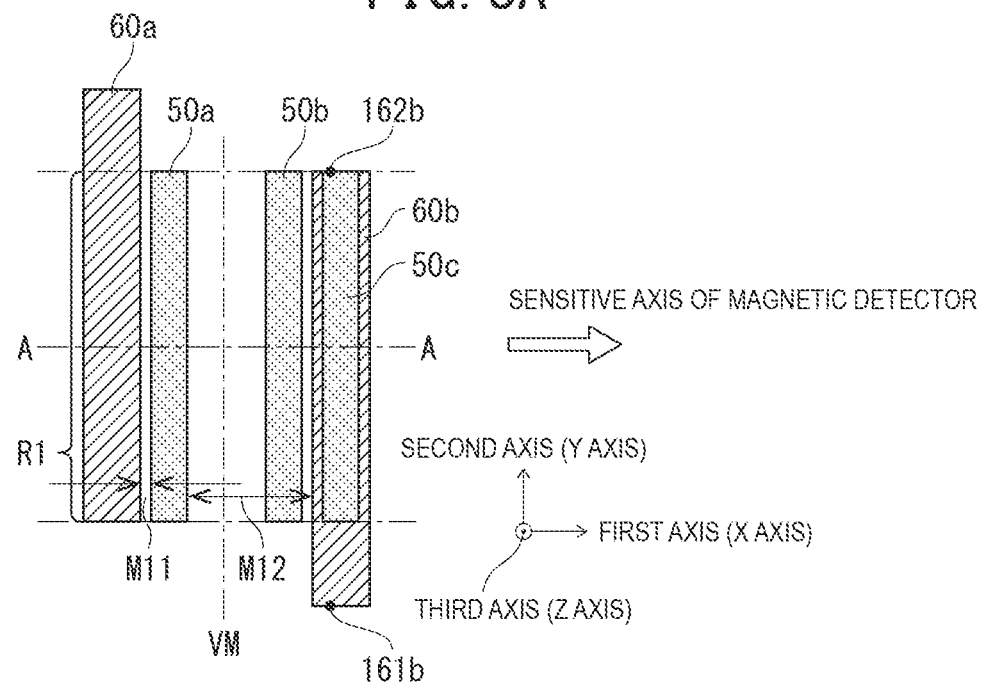
FIG. 8A and FIG. 8B are views illustrative of an arrangement pattern of magnetic detectors having magnetic field sensitive materials and magnetic flux concentrator units in the first embodiment.
Figure 8B:
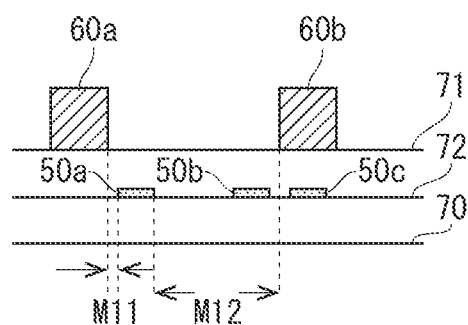

FIG. 8A and FIG. 8B are views illustrative of an arrangement pattern of magnetic detectors having magnetic field sensitive materials and magnetic flux concentrator units in the first embodiment of the magnetic sensor according to the present invention. FIG. 8A is a top view (a planar view, when viewed in the third direction), and FIG. 8B is a cross-sectional view cut along A-A line in FIG. 8A. In the drawings, reference numerals 50a and 50b denote magnetic detectors having magnetic field sensitive materials, a reference numeral 50c denotes an auxiliary magnetic detector having a magnetic field sensitive material, reference numerals 60a and 60b denote the first and second magnetic flux concentrator units (magnetic field direction converter), respectively, a reference numeral 71 denotes the first virtual plane, a reference numeral 72 denotes the second virtual plane, a reference numeral 70 denotes a substrate plane, and reference numerals 161a and 162b denote endpoints.

The magnetic sensor of the first embodiment includes the magnetic detector 50a or 50b having the magnetic field sensitive material detecting a magnetic field component in the first direction (X axis) and the magnetic field direction converters 60a and 60b converting a magnetic field component in the second direction (Y axis) perpendicular to the first direction and a magnetic field component in the third direction (Z axis) perpendicular to both of the first and second directions into the magnetic field component in the first direction. The magnetic sensor outputs a magnetic signal which contains three orthogonal components of a magnetic field in a mixed state without separation.

The magnetic field direction converters 60a and 60b include the first and second magnetic flux concentrator units 60a and 60b disposed on the substrate to be in parallel to each other. Then, in the arrangement pattern including the first and second magnetic flux concentrator units 60a and 60b and the magnetic field sensitive material that the magnetic detector 50a or 50b has, the magnetic field sensitive material that the magnetic detector 50a or 50b has is disposed between the first magnetic flux concentrator unit 60a and the second magnetic flux concentrator unit 60b in a planar view of the substrate.

In addition, the magnetic sensor of the first embodiment include the auxiliary magnetic detector 50c having a magnetic field sensitive material having the same structure as the magnetic field sensitive material that the magnetic detector 50a or 50b has. The magnetic field sensitive material that the auxiliary magnetic detector 50c has is disposed not to sense the magnetic field components in the first to third directions. That is, the arrangement pattern is formed such that the second magnetic flux concentrator unit 60b encompasses the magnetic field sensitive material that the auxiliary magnetic detector 50c has in the planar view.

That is, the magnetic flux concentrator units 60a and 60b are substantially parallel to each other and are substantially parallel to the substrate. The adjacent two units 60a and 60b are disposed such that one unit of the units 60a and 60b is displaced with respect to the other unit in the longitudinal direction. In addition, the magnetic detectors 50a and 50b are substantially parallel to the plural magnetic flux concentrator units 60a and 60b, and are disposed between the two magnetic flux concentrator units 60a and 60b among the plural magnetic flux concentrator units, in the planar view. That is, with respect to the magnetic flux concentrator units 60a and 60b, the adjacent two units 60a and 60b are disposed such that the one unit of the units 60a and 60b are displaced with respect to the other unit in the direction parallel to the magnetic detectors 50a and 50b in the planar view.

In addition, the plural magnetic detectors include the first and second magnetic detectors 50a and 50b, which are disposed to be close to the two adjacent magnetic flux concentrator units 60a and 60b, respectively, among the plural magnetic flux concentrator units, in the planar view. That is, the magnetic detectors are disposed between at least one pair of adjacent magnetic flux concentrator units among the plural magnetic flux concentrator units, such that one and the other of the magnetic detectors are close to the one unit and the other unit of the two magnetic flux concentrator units, respectively, in the planar view. In some configuration, only one magnetic detector or no magnetic detector may be disposed between the two adjacent magnetic flux concentrator units.

In addition, the first magnetic detector 50a may be disposed to be closer to the other magnetic flux concentrator unit 60a than to the one magnetic flux concentrator unit 60b of the two adjacent magnetic flux concentrator units 60a and 60b among the plural magnetic flux concentrator units, in the planar view. The second magnetic detector 50b may be disposed to be closer to the one magnetic flux concentrator unit 60b than to the other magnetic flux concentrator unit 60a, in the planar view.

It will be described hereinafter in detail that the above-mentioned configuration can output a magnetic signal which contains three orthogonal components of a magnetic field in a mixed state without separation.

As illustrated in FIGS. 8A and 8B, the first and second directions are parallel to the substrate plane 70, and the third direction is perpendicular to the substrate plane 70.

The first and second magnetic flux concentrator units 60a and 60b are disposed on the first virtual plane 71 substantially parallel to the substrate plane 70 and have thicknesses in the third direction. The magnetic flux concentrator units overlapping (crossing or contacting) the first virtual plane 71 have substantially rectangular shapes, whose longitudinal directions coincide with the second direction. The units 60a and 60b are disposed in substantially parallel to the second direction.

In addition, the rectangular magnetic flux concentrator units illustrated in FIGS. 8A and 8B have four right-angled corners, but at least one corner of the four corners may be rounded or chamfered. In addition, the shape of the magnetic flux concentrator unit overlapping with the first virtual plane 71 is not limited to rectangular, may be any of a quadrangle, a parallelogram, a trapezoid, whose longitudinal direction is substantially parallel to the second direction.

Furthermore, the first and second magnetic flux concentrator units 60a and 60b are parallel to the second direction and have long sides parallel to the second direction, the long sides being of the same length, however, the lengths of the long sides may be different from each other. In addition, the first and second magnetic flux concentrator units 60a and 60b have short sides parallel to the first direction, the short sides being of the same length, however, the lengths of the short sides may be different from each other.

In addition, the first and second magnetic flux concentrator units 60a and 60b are disposed such that the bottom faces of the units 60a and 60b contact the first virtual plane 71, however, the units 60a and 60b may be disposed such that a part of each of the units 60a and 60b crosses the first virtual plane 71. In addition, the thicknesses of the first and second magnetic flux concentrator units 60a and 60b in the third direction are the same, however the thicknesses of the units 60a and 60b may be different from each other.

In addition, the first and second magnetic flux concentrator units 60a and 60b are disposed such that the second magnetic flux concentrator unit 60b projects from the first magnetic flux concentrator unit 60a in the second direction (disposed to be displaced in the longitudinal direction of the second magnetic flux concentrator unit 60a). In more detail, the first and second magnetic flux concentrator units 60a and 60b are disposed such that a plane (XZ plane) perpendicular to the second direction including one endpoint 161b of the two endpoints 161b and 162b of the shape of the second magnetic flux concentrator unit 60b overlapping with the first virtual plane 71 does not cross the first magnetic flux concentrator unit 60a, the two endpoints 161b and 162b being located on a negative side and a positive side in the second direction, respectively. And, the first and second magnetic flux concentrator units 60a and 60b are disposed such that a plane (XZ plane) perpendicular to the second direction including the other endpoint 162b crosses the first magnetic flux concentrator unit 60a. However, when the side at the end in the second direction of the shape of the second magnetic flux concentrator unit 60b overlapping with the first virtual plane 71 is parallel to the first direction, the endpoint may be any one point on the side at the end.

Such a configuration forms magnetic path of a magnetic flux component from the second magnetic flux concentrator unit 60b to the first magnetic flux concentrator unit 60a when a magnetic field is inputted to the second magnetic flux concentrator unit 60b in the longitudinal direction.

The magnetic field sensitive materials that the magnetic detectors 50a and 50b have and the magnetic field sensitive material that the auxiliary magnetic detector 50c has are disposed on the second virtual plane 72 substantially parallel to the substrate plane 70 and are formed to sense only a magnetic field in the first direction in a state where there is no magnetic flux concentrator unit and the like. In other word, the magnetic field sensitive materials that the magnetic detector 50a and 50b have and the magnetic field sensitive material that the auxiliary magnetic detector 50c has a sensitive axis in the first direction in a state where there is no magnetic flux concentrator unit and the like.

In addition, the magnetic field sensitive materials that the magnetic detectors 50a and 50b have and the magnetic field sensitive material that the auxiliary magnetic detector 50c has are preferably formed in flat plate shapes. The shape of the magnetic field sensitive material overlapping with the second virtual plane 72 is most preferably rectangular in the planar view, when viewed in the third direction as illustrated. However, the magnetic field sensitive material may be formed in any shape. The shape of the magnetic field sensitive material may be, for example, any of a quadrangle, a quadrate, a parallelogram, a trapezoid, a triangle, a polygon, a circle, and an ellipse. Furthermore, the magnetic field sensitive material may be divided in the second direction, into a series of magnetic field sensitive materials. The series of magnetic field sensitive materials can be used as a cluster of magnetic field sensitive materials by connecting between the respective adjacent ones of the magnetic field sensitive materials with a metal wiring. In other word, for example, the magnetic field sensitive material that the magnetic detector 50a has is not limited to a single magnetic field sensitive material, may be formed by connecting two or more magnetic field sensitive materials with metal wirings.

In addition, the magnetic field sensitive materials that the magnetic detectors 50a and 50b have and the magnetic field sensitive material that the auxiliary magnetic detector 50c has are disposed such that the bottom faces of these magnetic field sensitive materials contact the second virtual plane 72, however, these magnetic field sensitive materials may be disposed such that a part of each of these magnetic field sensitive materials crosses the second virtual plane 72. In addition, the thicknesses of the magnetic field sensitive materials that the magnetic detectors 50a and 50b have and the magnetic field sensitive material that the auxiliary magnetic detector 50*c* has in the third direction are the same, however the thicknesses of these magnetic field sensitive materials may be different from each other.

The magnetic field sensitive material that the magnetic detector 50*a* has is disposed between the first magnetic flux concentrator unit 60*a* and the second magnetic flux concentrator unit 60*b* so as to be adjacent to the first magnetic flux concentrator unit 60*a*. In addition, the magnetic field sensitive material that the magnetic detector 50*b* has is disposed between the first magnetic flux concentrator unit 60*a* and the second magnetic flux concentrator unit 60*b* so as to be adjacent to the second magnetic flux concentrator unit 60*b*. That is, when it is assumed that a virtual median line VM is a line midway between a side of the shape of the first magnetic flux concentrator unit 60*a* overlapping with the first virtual plane 71 which is the closest to the second magnetic flux concentrator unit 60*b*, and a side of the shape of the second magnetic flux concentrator unit 60*b* overlapping with the first virtual plane 71 which is the closest to the first magnetic flux concentrator unit 60*a*, the magnetic field sensitive material overlapping with the second virtual plane 72 that the magnetic detector 50*a* has is disposed to be closer to the first magnetic flux concentrator unit 60*a* than to the virtual median line VM.

That is, the magnetic field sensitive material that the magnetic detector 50*a* has is disposed such that a distance M11 is shorter than a distance M12. The distance M11 is a distance between a side of the shape of the first magnetic flux concentrator 60*a* overlapping with the first virtual plane 71 which is the closest to the magnetic detector 50*a*, and a side of the shape of the magnetic detector 50*a* overlapping with the first virtual plane 72 which is the closest to the first magnetic flux concentrator unit 60*a*. The distance M12 is a distance between a side of the shape of the second magnetic flux concentrator 60*b* overlapping with the first virtual plane 71 which is the closest to the magnetic detector 50*a*, and a side of the shape of the magnetic detector 50*a* overlapping with the first virtual plane 72 which is the closest to the second magnetic flux concentrator unit 60*b*. Similarly, the magnetic field sensitive material that the magnetic detector 50*b* has is disposed such that the shape of the magnetic field sensitive material overlapping with the second virtual plane 72 that the magnetic detector 50*b* has is closer to the second magnetic flux concentrator unit 60*b* than to the virtual median line VM.

In addition, when the shapes of the magnetic field sensitive materials that the magnetic detector 50*a* and 50*b* overlapping with the second virtual plane 72 have and the shapes of the first and second magnetic flux concentrator units 60*a* and 60*b* overlapping with the first virtual plane 71 are rectangular, the magnetic field sensitive materials that the magnetic detectors 50*a* and 50*b* have may be disposed to be substantially parallel to the first magnetic flux concentrator unit 60*a* and the second magnetic flux concentrator unit 60*b* in the planar view (of the substrate) in the third direction. In such a configuration, a magnetic field in the first direction obtained by converting a magnetic field in the second direction or the third direction traverses the magnetic field sensitive materials that the magnetic detectors 50*a* and 50*b* have uniformly, thus the magnetic field in the second direction or the third direction can be detected with high accuracy.

With respect to the positional relationship between the magnetic field sensitive material that the magnetic detector 50*a* has and the first magnetic flux concentrator unit 60*a*, it is important that the magnetic field sensitive material that the magnetic detector 50*a* has is disposed to be adjacent to an edge side of the first magnetic flux concentrator unit 60*a* extending in the longitudinal direction, in the planar view, when viewed in the third direction. More preferably, a part of the magnetic field sensitive material that the magnetic detector 50*a* has, the part extending in the long side direction, may be covered with the first magnetic flux concentrator unit 60*a* on the substrate plane 70. That is, the magnetic field sensitive material that the magnetic detector 50*a* has and the first magnetic flux concentrator unit 60*a* overlap with each other to some extent, in the planar view, when viewed in the third direction. This is also applied to the positional relationship between the magnetic field sensitive material that the magnetic detector 50*b* has and the second magnetic flux concentrator unit 60*b*.

The magnetic sensor of the first embodiment having such a configuration has an advantage of improving the sensitivity in detecting the magnetic field in each of the first to third directions.

It is preferable that the magnetic field sensitive material that the magnetic detector 50*a* has be disposed between the first magnetic flux concentrator unit 60*a* and the second magnetic flux concentrator unit 60*b*, such that at least a part of the magnetic field sensitive material is positioned within a range R1, where a plane perpendicular to the second direction crosses the both of the first magnetic flux concentrator unit 60*a* and the second magnetic flux concentrator unit 60*b*, and such that the magnetic field sensitive material within the range R1 extending in the second direction senses the magnetic field in the first direction. It is more preferable that the entirety of the magnetic field sensitive material that the magnetic detector 50*a* has be disposed within the range R1 extending in the second direction.

Similarly, it is preferable that the magnetic field sensitive material that the magnetic detector 50*b* has be disposed between the first magnetic flux concentrator unit 60*a* and the second magnetic flux concentrator unit 60*b*, such that at least a part of the magnetic field sensitive material is positioned within the range R1 extending in the second direction, and such that the magnetic field sensitive material within the range R1 extending in the second direction senses the magnetic field in the first direction. It is more preferable that the entirety of the magnetic field sensitive material that the magnetic detector 50*b* has be disposed within the range R1 extending in the second direction.

The magnetic field sensitive material that the auxiliary magnetic detector 50*c* has is disposed to be covered with the second magnetic flux concentrator unit 60*b*. Since the magnetic path in which the magnetic field in the first direction is concentrated by the second magnetic flux concentrator unit 60*b* is formed, the magnetic field in the first direction inputted to the magnetic field sensitive material that the auxiliary magnetic detector 50*c* has becomes very small. In addition, the magnetic field in the second direction and the magnetic field in the third direction are not converted into the magnetic field in the first direction at the position of the magnetic field sensitive material that the auxiliary magnetic detector 50*c* has, thus are not detected.

Therefore, the auxiliary magnetic detector 50*c* having the magnetic field sensitive material with sensing the magnetic field in only first direction does not sense the magnetic field in any of the first to third directions. In addition, it is preferable that the magnetic field sensitive material that the auxiliary magnetic detector 50*c* has be disposed at the center of the second magnetic flux concentrator unit 60*b* in the short direction. In addition, the magnetic field sensitive material that the auxiliary magnetic detector 50*c* has only has to be disposed to be covered with at least one magnetic flux concentrator unit among the first and second magnetic flux concentrator units 60a and 60b. In addition, the magnetic field sensitive material that the auxiliary magnetic detector 50c has is disposed to be covered with the second magnetic flux concentrator unit 60b. However, the magnetic field sensitive material that the auxiliary magnetic detector 50c has may be disposed to be covered with the first magnetic flux concentrator unit 60a.

In addition, although not illustrated in the drawings, the magnetic field sensitive material that the auxiliary magnetic detector 50c has may be disposed to be covered with a magnetic flux concentrator unit, which is provided separately from the first and second magnetic flux concentrator units 60a and 60b. In addition, the auxiliary magnetic detector 50c may have plural magnetic field sensitive materials.

It is preferable that the magnetic flux concentrator units be made of a soft magnetic material, such as NiFe, NiFeB, NiFeCo, CoFe, or the like. The magnetic field sensitive material may be any type of magneto-resistance element sensing only the magnetic field in one axis direction and having a resistance which changes depending on the sensed magnetic field, including, for example a giant magneto-resistance (GMR) element, a tunneling magneto-resistance (TMR) element, an anisotropic magneto-resistance (AMR) element, and a semiconductor magneto-resistance (SMR) element.

The substrate may be any of a silicon substrate, a compound semiconductor substrate, a ceramic substrate. In addition, the substrate may be a silicon substrate on which an integrated circuit is mounted.

The first and second virtual planes 71 and 72 are disposed in the third direction such that the second virtual plane 72 is positioned above the substrate plane 70, and the first virtual plane 71 is positioned above the second virtual plane 72. Such a configuration is most preferable from the viewpoint of manufacturing and performance, since it is possible to apply a simple method of forming the magnetic flux concentrator unit after forming a magnetic field sensitive material sensing the magnetic field in only the first direction on the substrate plane 70. However, the first embodiment is not limited to such a configuration.

Figure 9:
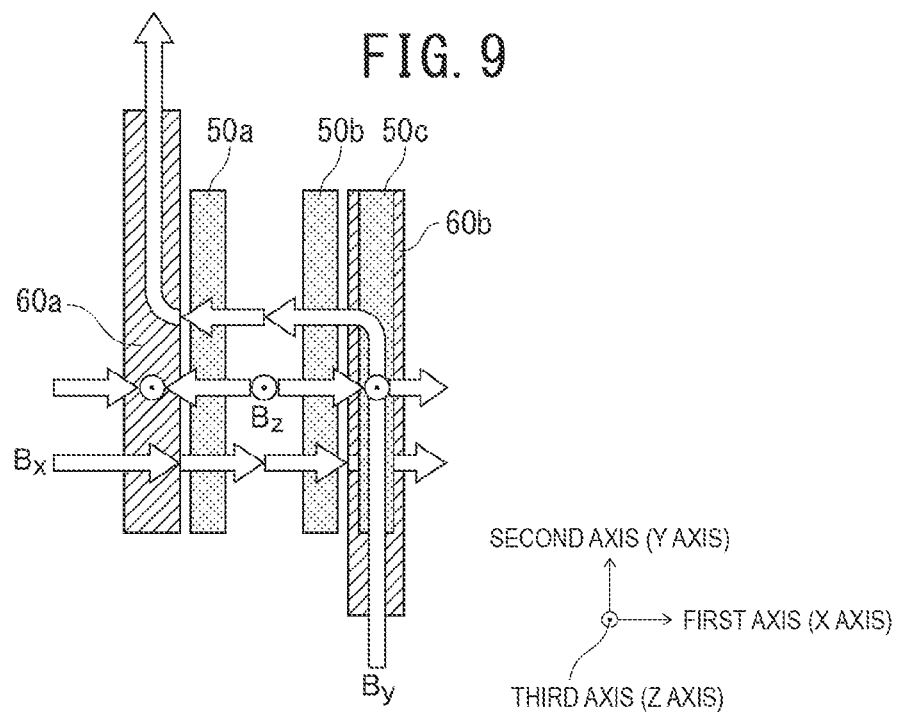
FIG. 9 is a view illustrative of the operation of the magnetic sensor illustrated in FIG. 8A.

FIG. 9 is a view illustrative of the operation of the magnetic sensor illustrated in FIG. 8A.

First, a magnetic path of the magnetic field By in the second direction is formed, the magnetic path traversing the magnetic field sensitive materials that the magnetic detectors 50a and 50b have toward the negative first direction from the second magnetic flux concentrator unit 60b, then passing through the first magnetic flux concentrator unit 60a, the second magnetic flux concentrator unit 60b is projecting in the second direction. In such a configuration, the magnetic field sensitive materials that the magnetic detectors 50a and 50b have detect the magnetic field in the first direction, which is obtained by converting the magnetic field inputted in the second direction and is proportional to the magnitude thereof.

Next, a magnetic path in which the magnetic field Bz in the third direction traverses the magnetic field sensitive material that the magnetic detector 50a has toward the negative first direction, and then is concentrated by the first magnetic flux concentrator unit 60a, and a magnetic path in which the magnetic field Bz traverses the magnetic field sensitive material that the magnetic detector 50b has toward the positive first direction, and then is concentrated by the second magnetic flux concentrator unit 60b, are formed. In such a configuration, the magnetic field sensitive materials that the magnetic detectors 50a and 50b have detect the magnetic field in the first direction, which is obtained by converting the magnetic field inputted in the third direction and is proportional to the magnitude thereof.

Furthermore, a magnetic path in which the magnetic field Bx in the first direction is concentrated by the first magnetic flux concentrator unit 60a and passes through the first magnetic flux concentrator unit 60a, traverses the magnetic field sensitive materials that the magnetic detectors 50a and 50b have toward the positive first direction, and then is concentrated by the second magnetic flux concentrator unit 60b and passes through the second magnetic flux concentrator unit 60b, is formed. In such a configuration, the magnetic field sensitive materials that the magnetic detector 50a and 50b have detect the magnetic field in the first direction.

Figure 10:
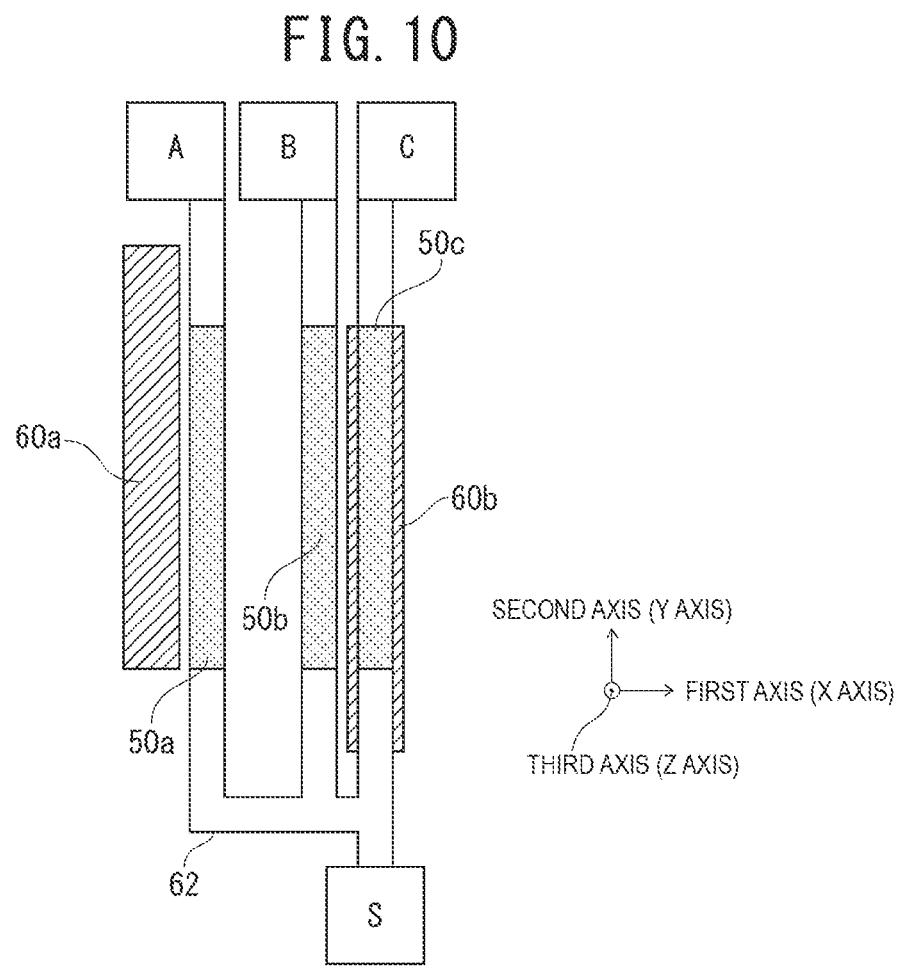
FIG. 10 is a view illustrative of output signals of the magnetic sensor illustrated in FIG. 8A.

FIG. 10 is a view illustrative of output signals of the magnetic sensor illustrated in FIG. 8A. In the drawing, a reference numeral 62 denotes a metal wiring, a reference symbol S denotes an output terminal at which the first terminals of the magnetic field sensitive materials that the magnetic detectors 50a and 50b have, and of the magnetic field sensitive material that the auxiliary magnetic detector 50c has are electrically coupled at one point, and reference symbols A, B, and C denote output terminals to which the second terminals of the magnetic field sensitive materials that the magnetic detectors 50a and 50b have, and of the magnetic field sensitive material that the auxiliary magnetic detector 50c has are connected, respectively. Then when $R_A$, $R_B$, and $R_C$ represent the magneto-resistances between the output terminals A and S, between the output terminals B and S, and between the output terminals C and S, respectively, the respective magneto-resistances are represented as follows.

$$R_A = R + \Delta Rx - \Delta Ry - \Delta Rz \quad (1)$$

$$R_B = R + \Delta Rx - \Delta Ry + \Delta Rz \quad (2)$$

$$R_C = R \quad (3)$$

Here, R represents the resistance which does not depend on the magnetic field (or the resistance when there is no magnetic field), $\Delta Rx$ represents the amount of the resistance change depending on the magnitude of the magnetic field Bx in the first direction, $\Delta Ry$ represents the amount of the resistance change depending on the magnitude of the magnetic field By in the second direction, and $\Delta Rz$ represents the amount of the resistance change depending on the magnitude of the magnetic field Bz in the third direction. Each of the magneto-resistances represented by the expressions (1) and (2) includes the amounts of the resistance change $\Delta Rx$, $\Delta Ry$, and $\Delta Rz$ depending on the magnitude of the three axis components of the magnetic field.

The each of signs of $\Delta Rx$, $\Delta Ry$, and $\Delta Rz$ corresponds to the orientation of each of the magnetic fields converted to the first direction when traversing the magnetic detectors 50a and 50b. The magneto-resistance represented by the expression (3) includes none of the amounts of the resistance change of the three axis components, since none of the magnetic fields in the first to third directions are sensed.

Furthermore, from the magneto-resistances represented by the expressions (1) to (3), the following expressions are obtained.

By calculating (1)−(3), $$S_A = R_A - R_C = \Delta Rx - \Delta Ry - \Delta Rz \quad (4)$$

By calculating (2)−(3), $$S_B = R_B - R_C = \Delta Rx - \Delta Ry + \Delta Rz \quad (5)$$

As seen above, it can be understood that it is possible to extract an output signal as a magnetic signal which contains three orthogonal components of a magnetic field in a mixed state without separation. That is, the magnetic sensor of the first embodiment can detect at least the magnetic field perpendicular to the substrate and the magnetic field parallel to the substrate in a state where these magnetic field components are mixed and separable. Furthermore, by adding the expressions (4) and (5), the magnetic field component parallel to the substrate is separated from the mixed magnetic field components. By subtracting the expression (4) from the expression (5), the magnetic field perpendicular to the substrate is separated from the mixed magnetic field components. Since only at least one magnetic field sensitive material has to be disposed between the first magnetic flux concentrator unit 60*a* and the second magnetic flux concentrator unit 60*b*, the output signal represented by the expression (1) can be obtained by providing the magnetic field sensitive material that the magnetic detector 50*a* has, and the output signal represented by the expression (4) can be obtained by further providing the magnetic field sensitive material that the auxiliary magnetic detector 50*c* has. Or, the output signal represented by the expression (2) can be obtained by providing the magnetic field sensitive material that the magnetic detector 50*b* has between the first magnetic flux concentrator unit 60*a* and the second magnetic flux concentrator unit 60*b*, and the output signal represented by the expression (5) can be obtained by further providing the magnetic field sensitive material that the auxiliary magnetic detector 50*c* has.

In FIG. 10, the wiring used for connecting the magnetic field sensitive materials is a metal wiring, however, a wiring formed from the same material as the magnetic field sensitive material may be used, and both types of wiring can be used in mixture. In addition, the configuration in which the first terminals of the magnetic field sensitive materials that the magnetic detectors 50*a* and 50*b* have, and of the magnetic field sensitive material that the auxiliary magnetic detector 50*c* has are electrically coupled to one point and then connected to the output terminal S is most preferable, since the number of the output terminal can be reduced. However, the essence of the invention does not vary, even if the first terminals of the magnetic field sensitive materials that the magnetic detectors 50*a* and 50*b* have, and of the magnetic field sensitive material that the auxiliary magnetic detector 50*c* has are connected to output terminals, respectively.

Figure 11:
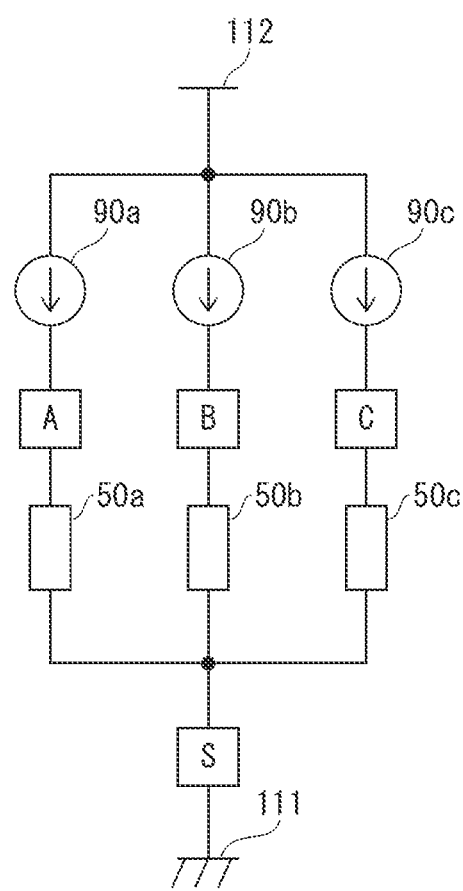
FIG. 11 is a configuration diagram of a specific circuit for the signal detection of the magnetic sensor illustrated in FIG. 10.

FIG. 11 is a configuration diagram of a specific circuit for the signal detection of the magnetic sensor illustrated in FIG. 10. In the drawing, reference numerals 50*a* and 50*b* denote magnetic detectors having magnetic field sensitive materials, a reference numeral 50*c* denotes an auxiliary magnetic detector having a magnetic field sensitive material, a reference symbol S denotes an output terminal at which the first terminals of the magnetic field sensitive materials that the magnetic detectors 50*a* and 50*b* have, and of the magnetic field sensitive material that the auxiliary magnetic detector 50*c* has are electrically coupled at one point, and reference symbols A, B, and C denote output terminals to which the second terminals of the magnetic field sensitive materials that the magnetic detectors 50*a* and 50*b* have, and of the magnetic field sensitive material that the auxiliary magnetic detector 50*c* has are electrically coupled, respectively, reference numerals 90*a* to 90*c* denote the first to third constant current sources, respectively, a reference numeral 111 denotes the first electrical potential, and a reference numeral 112 denotes the second electrical potential.

The first electrical potential 111 is applied to the output terminal S. In addition, the output terminals A, B, and C are connected to the first terminals of the first to the third constant current sources 90*a* to 90*c*, respectively. In addition, the second terminals of the first to third constant current sources 90*a* to 90*c*, are electrically coupled to one point and the second electrical potential 112 is applied to the one point.

Currents of magnitude Is generated by the first to the third constant current sources 90*a* to 90*c* are supplied to the magnetic field sensitive materials that the magnetic detectors 50*a* and 50*b* have and the magnetic field sensitive material that the auxiliary magnetic detector 50*c* has, respectively, via the output terminals A to C connected thereto.

In such a configuration, the voltage $V_{AS}$ between the output terminals A and S is $V_{AS} = I_s R_A = I_s (R + \Delta Rx - \Delta Ry - \Delta Rz)$, thus the signal obtained by multiplying the expression (1) by Is is available. Similarly, from the voltages $V_{Bs}$ and $V_{CS}$ between the output terminals B and S, and between the output terminals C and S, respectively, the signals obtained by multiplying the expressions (2) and (3) by Is are available, respectively.

Next, the differential voltage $V_A$ obtained from the voltage $V_{AS}$ and the voltage $V_{CS}$ is $V_A = V_{AS} - V_{CS} = I_s S_A = I_s (\Delta Rx - \Delta Ry - \Delta Rz)$, thus the signal obtained by multiplying the expression (4) by Is is available. Similarly, from the differential voltage $V_B$ obtained from the voltage $V_{BS}$ and the voltage $V_{CS}$, the signal obtained by multiplying the expression (5) by Is is available.

As seen above, it is possible to extract an output signal as a magnetic signal which contains three orthogonal components of a magnetic field in a mixed state without separation. Since only at least one magnetic field sensitive material has to be disposed between the first magnetic flux concentrator unit 60*a* and the second magnetic flux concentrator unit 60*b*, the signal obtained by multiplying the expression (1) by Is is available by providing the magnetic field sensitive material that the magnetic detector 50*a* has, and the signal obtained by multiplying the expression (4) by Is is available by further providing the magnetic field sensitive material that the auxiliary magnetic detector 50*c* has. Or, the signal obtained by multiplying the expression (2) by Is is available by providing the magnetic field sensitive material that the magnetic detector 50*b* has between the first magnetic flux concentrator unit 60*a* and the second magnetic flux concentrator unit 60*b*, and the signal obtained by multiplying the expression (5) by Is is available by further providing the magnetic field sensitive material that the auxiliary magnetic detector 50*c* has.

Now, in other words, the differential voltage $V_A$ and $V_B$ are a voltage between the output terminals A and C, and a voltage between the output terminals B and C, respectively, thus it is possible to extract the signals obtained by multiplying the expressions (4) and (5) by Is without extracting the signals obtained by multiplying the expressions (1) to (3) by Is, by directly measuring the voltage between the output terminals A and C and the voltage between the output terminals B and C.

The first electrical potential 111 and the second electrical potential 112 are, but not limited to, a ground potential and a power supply potential of a power supply device.

In addition, the magnetic field sensitive materials that the magnetic detectors 50*a* and 50*b* have and the magnetic field sensitive material that the auxiliary magnetic detector 50*c* has are connected to the first to third constant current sources 90*a* to 90*c*, respectively, and are supplied with currents.

However, switches may be provided with the output terminals A, B and C, respectively, for example, so as to supply the current to each of the magnetic field sensitive materials from the at least one constant current source by operating the switches.

In addition, the magnetic sensor of the first embodiment can respond to a magnetic field in any direction, thus the degree of freedom in designing a device is improved, and further miniaturization and space saving of the device can be achieved. Furthermore, the small magnetic sensor with low power consumption, high sensitivity, and high accuracy, configured to output a magnetic signal which contains three orthogonal components of a magnetic field in a mixed state without separation, can be achieved.

Second Embodiment

Figure 12A:
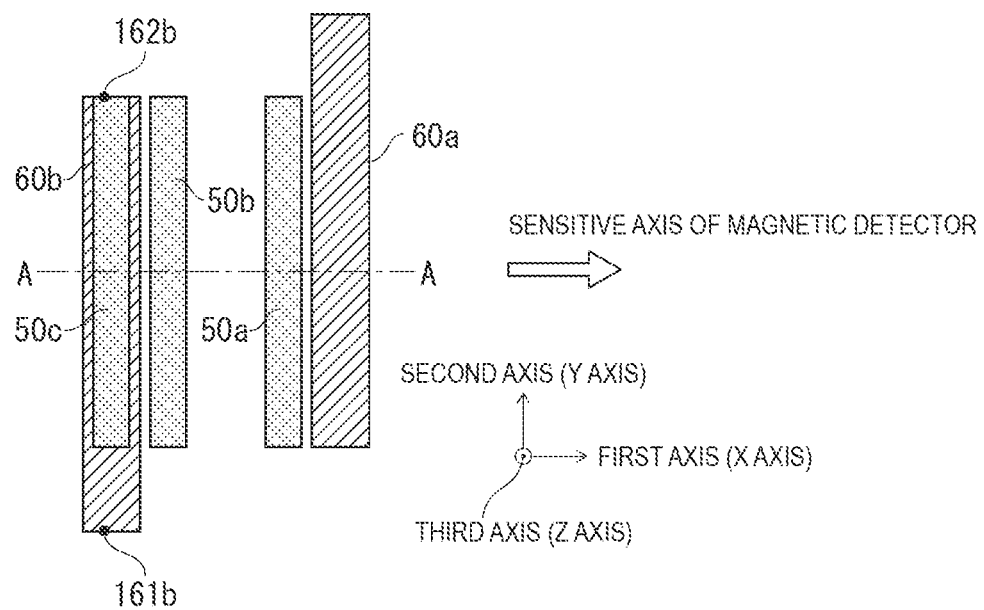
FIG. 12A and FIG. 12B are views illustrative of an arrangement pattern of magnetic detectors having magnetic field sensitive materials and magnetic flux concentrator units in the second embodiment.
Figure 12B:
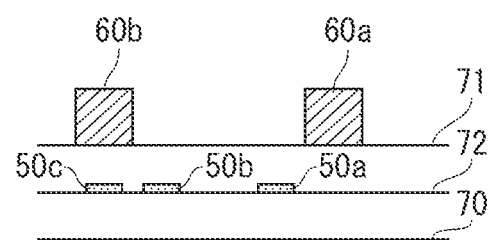

FIG. 12A and FIG. 12B are views illustrative of an arrangement pattern of magnetic detectors having magnetic field sensitive materials and magnetic flux concentrator units in the second embodiment of the magnetic sensor according to the present invention, which is a modification of the magnetic sensor of the first embodiment. FIG. 12A is a top view (a planar view, when viewed in the third direction), and FIG. 12B is a cross-sectional view cut along A-A line in FIG. 12A. In the drawings, the same numerals are assigned to the components having the same functions as those in FIGS. 8A and 8B.

The arrangement pattern illustrated in FIG. 12A is symmetrical with the arrangement pattern illustrated in FIG. 8A with respect to a plane (YZ plane) perpendicular to the first direction. In FIG. 8A, the first and second magnetic flux concentrator units 60a and 60b are disposed in the order of the first magnetic flux concentrator unit 60a and the second magnetic flux concentrator unit 60b toward the positive first direction. However, in FIG. 12A, the first and second magnetic flux concentrator units 60a and 60b are disposed in the order of the second magnetic flux concentrator unit 60b and the first magnetic flux concentrator unit 60a toward the positive first direction.

In addition, in FIG. 8A, the magnetic field sensitive materials that the magnetic detectors 50a and 50b have and the magnetic field sensitive material that the auxiliary magnetic detector 50c has are disposed in the order of the magnetic field sensitive material that the magnetic detector 50a has, the magnetic field sensitive material that the magnetic detector 50b has, and the magnetic field sensitive material that the auxiliary magnetic detector 50c has toward the positive first direction. However, in FIG. 12A, the magnetic field sensitive materials that the magnetic detectors 50a and 50b have and the magnetic field sensitive material that the auxiliary magnetic detector 50c has are disposed in the order of the magnetic field sensitive material that the auxiliary magnetic detector 50c has, the magnetic field sensitive material that the magnetic detector 50b has, and the magnetic field sensitive material that the magnetic detector 50a has toward the positive first direction.

In such a configuration, a magnetic path of the magnetic field By is formed, the magnetic path traversing the magnetic field sensitive materials that the magnetic detectors 50a and 50b have toward the positive first direction from the second magnetic flux concentrator unit 60b projecting toward the negative second direction, then passing through the first magnetic flux concentrator unit 60a.

Therefore, similarly to FIG. 10, when the magnetic detector 50a is connected between the output terminals A and S, the magnetic detector 50b is connected between the output terminals B and S, and the auxiliary magnetic detector 50c is connected between the output terminals C and S, the magneto-resistances $R_A$, $R_B$, and $R_C$ between the output terminals A and S, between the output terminals B and S, and between the output terminals C and S, respectively, are represented as follows.

$$R_A = R + \Delta Rx + \Delta Ry + \Delta Rz \quad (6)$$

$$R_B = R + \Delta Rx + \Delta Ry - \Delta Rz \quad (7)$$

$$R_C = R \quad (8)$$

Furthermore, from the magneto-resistances in the expressions (6) to (8), the following expressions are obtained.

By calculating (6)–(8), $$S_A = R_A - R_C = \Delta Rx + \Delta Ry + \Delta Rz \quad (9)$$

By calculating (7)–(8), $$S_B = R_B - R_C = \Delta Rx + \Delta Ry - \Delta Rz \quad (10)$$

As seen above, it can be understood that it is possible to extract an output signal as a magnetic signals which contains three orthogonal components of a magnetic field in a mixed state without separation. That is, the magnetic sensor of the second embodiment can detect at least the magnetic field perpendicular to the substrate and the magnetic field parallel to the substrate in a state where these magnetic field components are mixed and separable. Furthermore, by adding the expressions (9) and (10), the magnetic field component parallel to the substrate is separated from the mixed magnetic field components. By subtracting the expression (9) from the expression (10), the magnetic field perpendicular to the substrate is separated from the mixed magnetic field components. Since only at least one magnetic field sensitive material has to be disposed between the first magnetic flux concentrator unit 60a and the second magnetic flux concentrator unit 60b, the output signal represented by the expression (6) can be obtained by providing the magnetic field sensitive material that the magnetic detector 50a has, and the output signal represented by the expression (9) can be obtained by further providing the magnetic field sensitive material that the auxiliary magnetic detector 50c has. Or, the output signal represented by the expression (7) can be obtained by providing the magnetic field sensitive material that the magnetic detector 50b has between the first magnetic flux concentrator unit 60a and the second magnetic flux concentrator unit 60b, and the output signal represented by the expression (10) can be obtained by further providing the magnetic field sensitive material that the auxiliary magnetic detector 50c has.

Third Embodiment

Figure 13:
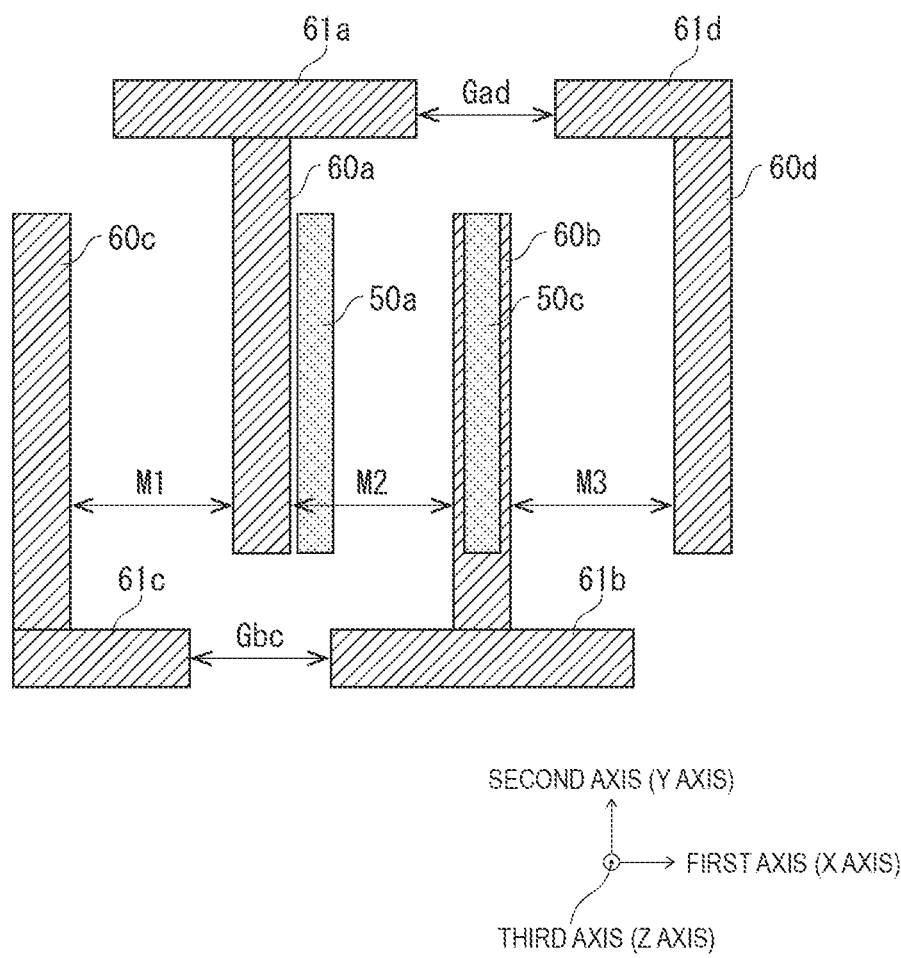
FIG. 13 is a view illustrative of an arrangement pattern of magnetic detectors having magnetic field sensitive materials and magnetic flux concentrator units in the third embodiment.

FIG. 13 is a view illustrative of an arrangement pattern of magnetic detectors having magnetic field sensitive materials and magnetic flux concentrator units in third embodiment of the magnetic sensor according to the present invention. In the drawing, reference numerals 60c and 60d denote the third and fourth magnetic flux concentrator units, and reference numerals 61a to 61d denote the first to fourth magnetic flux concentrator members. It is noted that, the same numerals are assigned to the components having the same functions as those in FIG. 8A and FIG. 8B.

The magnetic sensor of the third embodiment further includes the first to fourth magnetic flux concentrator members 61a to 61d in addition to the arrangement pattern of the first embodiment illustrated in FIG. 8A.

The magnetic field direction converter has the third magnetic flux concentrator unit 60c and/or the fourth magnetic flux concentrator unit 60d. The third magnetic flux concentrator unit 60c is disposed at the position where the first magnetic flux concentrator unit 60a is sandwiched between the third magnetic flux concentrator unit 60c and the second magnetic flux concentrator unit 60b. The fourth magnetic flux concentrator unit 60d is disposed at the position where the second magnetic flux concentrator unit 60b is sandwiched between the fourth magnetic flux concentrator unit 60d and the first magnetic flux concentrator unit 60a.

That is, the plural magnetic flux concentrator units include three or more magnetic flux concentrator units (60a to 60d), and one magnetic flux concentrator unit 60a is displaced with respect to another two magnetic flux concentrator units 60b and 60c in the longitudinal direction. The two magnetic flux concentrator units 60b and 60c are disposed to face each other so as to sandwich the one magnetic flux concentrator unit 60a in the planar view.

In addition, the plural magnetic flux concentrator units 60a to 60d are disposed such that the respective centroid positions of the plural magnetic flux concentrator units 60a to 60d are disposed zigzag in the planar view. In addition, the plural magnetic flux concentrator units 60a to 60d are disposed such that alternate ones of the plural magnetic flux concentrator units 60a to 60d face each other in the planar view.

The first to fourth magnetic flux concentrator units 60a to 60d are disposed such that the second magnetic flux concentrator unit 60b and the third magnetic flux concentrator unit 60c project from the first magnetic flux concentrator unit 60a and the fourth magnetic flux concentrator unit 60d in the second direction. In such a configuration, in addition to the magnetic paths in the first embodiment described above, a magnetic path in which the magnetic field By in the second direction traverses on the virtual plane 72 toward the positive first direction from the third magnetic flux concentrator unit 60c projecting toward the negative second direction and passes through the first magnetic flux concentrator unit 60a, and a magnetic path in which the magnetic field By traverses on the virtual plane 72 toward the positive first direction from the second magnetic flux concentrator unit 60b projecting toward the negative second direction and passes through the fourth magnetic flux concentrator unit 60d, are formed.

In addition, the first to fourth magnetic flux concentrator units 60a to 60d are disposed to have rectangular shapes, whose longitudinal direction coincides with the second direction. An inter-edge distance M1 is a distance between a side of the shape of the first magnetic flux concentrator unit 60a overlapping with the first virtual plane 71 which is the closest to the third magnetic flux concentrator unit 60c, and a side of the shape of the third magnetic flux concentrator unit 60c overlapping with the first virtual plane 71 which is the closest to the first magnetic flux concentrator unit 60a. An inter-edge distance M3 is a distance between a side of the shape of the second magnetic flux concentrator unit 60b overlapping with the first virtual plane 71 which is the closest to the fourth magnetic flux concentrator unit 60d, and a side of the shape of the fourth magnetic flux concentrator units 60d overlapping with the first virtual plane 71 which is the closest to the second magnetic flux concentrator unit 60b. An inter-edge distance M2 is a distance between a side of the shape of the first magnetic flux concentrator unit 60a overlapping with the first virtual plane 71 which is the closest to the second magnetic flux concentrator unit 60b, and a side of the shape of the second magnetic flux concentrator unit 60b overlapping with the first virtual plane 71 which is the closest to the first magnetic flux concentrator unit 60a.

In addition, the first to fourth magnetic flux concentrator units 60a to 60d are disposed such that the inter-edge distances M1, M2 and M3 are substantially equal to one another. More specifically, it is preferable that any two of the three inter-edge distances M1, M2 and M3 be not shorter than 0.7 times and not longer than 1.3 times the other one of M1, M2 and M3. In such a configuration, especially when plural arrangement patterns are employed in the fourth embodiment described later, the magnetic fluxes passing through the first and second magnetic flux concentrator units 60a and 60b become substantially even, thus the magnetic field in the first direction obtained by converting the magnetic field in the second direction can uniformly traverse the magnetic field sensitive material that the magnetic detector 50a has. Therefore, the magnetic sensor of the third embodiment can detect the magnetic field in the second direction with high accuracy. In the drawing, both of the third and fourth magnetic flux concentrator units 60c and 60d are disposed, however, any one of units 60c and 60d does not have to be disposed.

In addition, the first to fourth magnetic flux concentrator units 60a to 60d are equipped with the first to fourth magnetic flux concentrator members 61a to 61d, respectively, disposed at the end of units 60a to 60d. Each of respective combinations of the first to fourth magnetic flux concentrator units 60a to 60d with the first to fourth magnetic flux concentrator members 61a to 61d, respectively, forms a T-shape or an L-shape, in the planar view (of the substrate) when viewed in the third direction.

The first to fourth magnetic flux concentrator members 61a to 61d are disposed such that there is a gap Gad between the first magnetic flux concentrator member 61a and the fourth magnetic flux concentrator member 61d, and there is a gap Gbc between the third magnetic flux concentrator member 61c and the second magnetic flux concentrator member 61b.

In such a configuration, it is possible to inhibit that the magnetic field Bx in the first direction is intensely concentrated by the first to fourth magnetic flux concentrator members 61a to 61d. Thus, a magnetic path uniformly traversing the magnetic field sensitive material that the magnetic detector 50a has can be formed. Therefore, the magnetic sensor of the third embodiment can detect the magnetic field in the first direction with high accuracy. In addition, the magnetic field By in the second direction traverses the end of the second magnetic flux concentrator unit 60b after the second magnetic flux concentrator member 61b disposed at the end of the second magnetic flux concentrator unit 60b concentrates the magnetic field By in a wide range, then traverses the magnetic field sensitive material that the magnetic detector 50a has from the second magnetic flux concentrator unit 60b. Then a magnetic path, in which the magnetic field By in the second direction passes through the first magnetic flux concentrator member 61a after passing the first magnetic flux concentrator unit 60a, is formed. Therefore, the magnetic sensor of the third embodiment can detect the magnetic field in the second direction with high sensitivity.

In the FIG. 13, each of the respective combinations of the first to fourth magnetic flux concentrator units 60a to 60d with the first to fourth magnetic flux concentrator members 61a to 61d forms a T-shape or an L-shape. However, even if the first to fourth magnetic flux concentrator members 61a to 61d are disposed so as to form a Y-shape, the magnetic sensor of the third embodiment can detect the magnetic field in the second direction with high sensitivity. In addition, all of the first to fourth magnetic flux concentrator members 61a to 61d are disposed, however, some of the first to fourth magnetic flux concentrator members 61a to 61d do not have to be disposed.

It is preferable that the first to fourth magnetic flux concentrator units 60a to 60d and the first to fourth magnetic flux concentrator members 61a to 61d be made of a soft magnetic material, such as NiFe, NiFeB, NiFeCo, CoFe, or the like.

Fourth Embodiment

FIG. 14 is a view illustrative of an arrangement pattern of magnetic detectors having magnetic field sensitive materials and magnetic flux concentrator units in the fourth embodiment of the magnetic sensor according to the present invention. In the drawing, the same numerals are assigned to the components having the same functions as those in FIGS. 8A and 8B. The magnetic sensor of the fourth embodiment has plural arrangement patterns of the magnetic flux concentrator units 60a and 60b, the magnetic detector 50a, and the auxiliary magnetic detector 50c illustrated in FIG. 13.

In FIG. 14, the four above-mentioned arrangement patterns are disposed, each of the magnetic detector 50a and the auxiliary magnetic detector 50c has a group of four magnetic field sensitive materials. Then, in each of the groups, the four magnetic field sensitive materials are electrically connected with one another in series. The respective first terminals of the groups of four magnetic field sensitive materials are electrically coupled to one point, and then connected to the output terminal S. The second terminals of the groups are connected to the output terminals A and C, respectively.

The magnetic sensor of the fourth embodiment having such a configuration can detect the magnetic fields in the first to third directions with higher sensitivity in comparison with the a single arrangement pattern. In FIG. 14, the four magnetic field sensitive materials that each of the magnetic detector 50a and the auxiliary magnetic detector 50c has may be electrically connected with one another in parallel, instead of in series. The manner connecting the magnetic field sensitive materials is not limited to the above-mentioned configuration.

In addition, all the four magnetic field sensitive materials that each of the magnetic detector 50a and the auxiliary magnetic detector 50c has are electrically connected with one another, however some of magnetic field sensitive materials do not have to be electrically connected. In addition, the wirings used for connecting the four magnetic field sensitive materials that each of the magnetic detector 50a and the auxiliary magnetic detector 50c has are a metal wiring, however, wirings formed from the same material as the magnetic field sensitive material may be used, and both types of wiring can be used in mixture.

In addition, in FIG. 14, the auxiliary magnetic detector 50c is disposed in the plural repeating arrangement patterns. However, even if only the magnetic detector 50a is disposed without the auxiliary magnetic detector 50c, it is possible to output a magnetic signal which contains three orthogonal components of a magnetic field in a mixed state without separation.

Now, each of the magnetic sensors of the first and fourth embodiments may include a controller (not illustrated) configured to control another function block. The controller may be configured to receive a signal obtained from the output of the magnetic detector, the signal being in a state where the magnetic field components in the first to third directions are summed and to control the other function block by using the signal in the state where the magnetic field components in the first to third directions are summed.

In addition, each of the magnetic sensors of the first and fourth embodiments may include a signal generator (not illustrated) configured to generate a signal on the basis of the output of the magnetic detector and the output of the auxiliary magnetic detector, the signal being in a state where the magnetic field components in the first to third directions are summed, and a controller configured to control another function block. The controller may be configured to control the other function block by using the signal outputted from the signal generator, the signal being in the state where the magnetic field components in the first to third directions are summed.

The controller calculates the magnitude itself of the magnetic field, rather than the magnetic field components in two or three orthogonal axis directions, based on a signal obtained from the output of the magnetic detector, the signal being in a state where the magnetic field components in the first to third directions are summed. Then, the controller controls the other function block on the basis of the calculated magnitude of the magnetic field. Possible examples of the other function block include a function block turning on and off of the display screen of the portable module or the like.

As seen above, the magnetic sensors of the first to fourth embodiments can respond to a magnetic field in any direction, thus the degree of freedom in designing a device is improved, and further miniaturization and space saving of the device can be achieved. Furthermore, the small magnetic sensor with low power consumption, high sensitivity, and high accuracy, configured to output a magnetic signal which contains three orthogonal components of a magnetic field in a mixed state without separation, can be achieved.

Furthermore, the magnetic sensors of the first to fourth embodiments are preferable for an application to determination of the presence of a magnetic field, or responding to the magnetic field components in two or three orthogonal axis directions to measure the magnitude itself of the magnetic field. For example, the magnetic sensors of the first to fourth embodiments can be preferably used for a magnetic sensor IC for detecting the opening and closing of a portable module, a current sensor for measuring an amount of current flowing in a conductor.

Fifth Embodiment

Figure 15A:
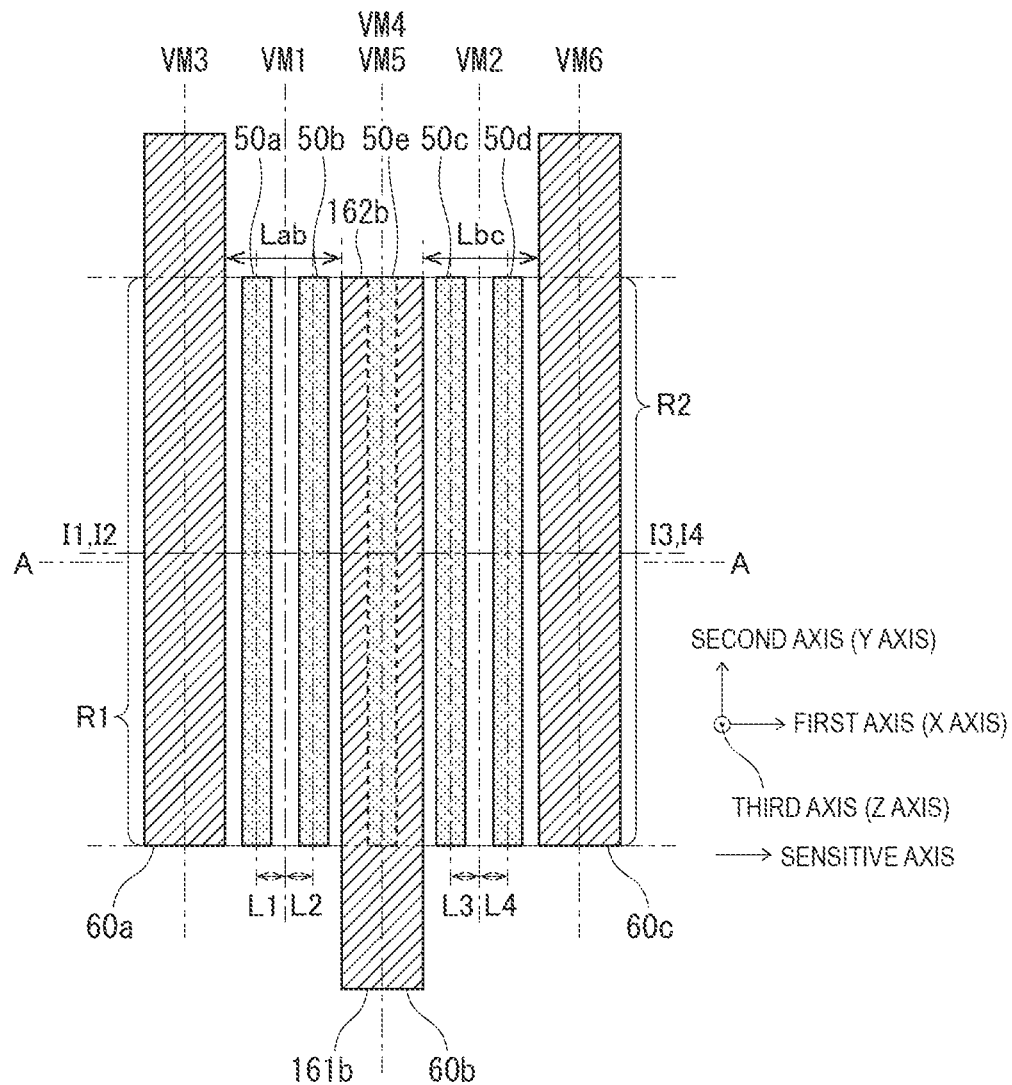
FIG. 15A and FIG. 15B are views illustrative of an arrangement pattern of magneto-resistance elements and magnetic flux concentrators in the fifth embodiment.
Figure 15B:
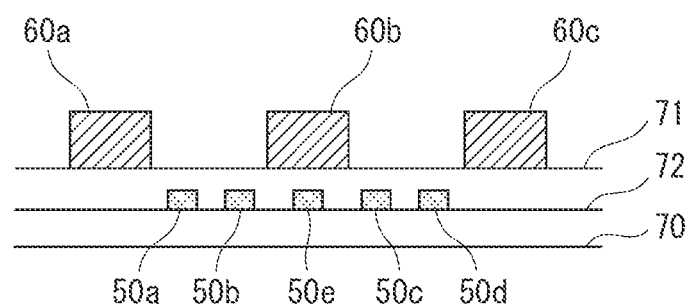

FIG. 15A and FIG. 15B are views illustrative of an arrangement pattern of magneto-resistance elements and magnetic flux concentrators in the fifth embodiment of the magnetic sensor according to the present invention. FIG. 15A is a top view (a planar view, when viewed in the Z axis direction), and FIG. 15B is a cross-sectional view cut along A-A line in FIG. 15A. In the drawings, reference numerals 50a to 50e denote the first to fifth magneto-resistance elements (magnetic detectors), reference numerals 60a to 60c denote the first to third magnetic flux concentrators (magnetic flux concentrator units). In the drawing, the same numerals are assigned to the components having the same functions as those in FIGS. 8A and 8B.

In the magnetic sensor of the fifth embodiment, each of the plural magneto-resistance elements has a sensitive axis in the first axis (X axis) direction parallel to the substrate plane 70. The magnetic sensor of the fifth embodiment detects the magnetic fields in the two axis directions including the second axis (Y axis) and the third axis (Z axis) directions, or the magnetic fields in the three axis directions including the first axis to the third axis (X axis, Y axis, and Z axis) directions, the second axis being parallel to the substrate plane 70 and perpendicular to the first axis, the third axis being perpendicular to the substrate plane 70. In FIGS. 15A and 15B, the plural magneto-resistance elements include the first to fifth magneto-resistance elements 50a to 50e.

In addition, the first magnetic detector 50a may be disposed to be closer to the other magnetic flux concentrator unit 60a than to the one magnetic flux concentrator unit 60b of the two adjacent magnetic flux concentrator units 60a and 60b among the plural magnetic flux concentrator units 60a to 60c, in the planar view. The second magnetic detector 50b may be disposed to be closer to the one magnetic flux concentrator unit 60b than to the other magnetic flux concentrator unit 60a, in the planar view. That is, the other magnetic flux concentrator unit 60a of the two adjacent magnetic flux concentrator units 60a and 60b among the plural magnetic flux concentrator units 60a to 60c is disposed to be displaced with respect to the one magnetic flux concentrator unit 60b in the direction parallel to the first to fifth magneto-resistance elements 50a to 50e, in the planar view. In addition, the other magnetic flux concentrator unit 60c of the two adjacent magnetic flux concentrator units 60b and 60c among the plural magnetic flux concentrator units 60a to 60c is disposed to be displaced with respect to the one magnetic flux concentrator unit 60b in the direction parallel to the first to fifth magneto-resistance elements 50a to 50e, in the planar view. The two magnetic detectors are disposed between at least one pair of adjacent magnetic flux concentrator units among the plural magnetic flux concentrator units, such that one unit and the other unit of the two magnetic detectors are close to the one unit and the other unit of the two magnetic flux concentrator units, respectively, in the planar view. In some configuration, only one magnetic detector or no magnetic detector may be disposed between the two adjacent magnetic flux concentrator units. In addition, the plural magnetic flux concentrator units include three or more magnetic flux concentrator units (60a to 60c), and one magnetic flux concentrator unit 60a is displaced with respect to another two magnetic flux concentrator units 60b and 60c in the longitudinal direction. The two magnetic flux concentrator units 60b and 60c are disposed to face each other so as to sandwich the one magnetic flux concentrator unit 60a in the planar view.

In addition, the plural magnetic flux concentrator units 60a to 60c are disposed such that the respective centroid positions of the plural magnetic flux concentrator units 60a to 60c are disposed zigzag in the planar view. In addition, the plural magnetic flux concentrator units 60a to 60c are disposed such that alternate ones of the plural magnetic flux concentrator units 60a to 60c face each other in the planar view.

It will be described hereinafter that the arrangement pattern including the first to fifth magneto-resistance elements 50a to 50e and the first to third magnetic flux concentrators 60a to 60c can detect the magnetic fields in three axis directions.

The substrate may be any of a silicon substrate, a compound semiconductor substrate, a ceramic substrate. In addition, the substrate may be a silicon substrate on which an integrated circuit is mounted.

The first to third magnetic flux concentrators 60a to 60c are disposed on the first virtual plane 71 substantially parallel to the substrate plane. The first to third magnetic flux concentrators 60a to 60c have thicknesses in the third axis direction (Z axis direction), and the magnetic flux concentrators overlapping (crossing or contacting) the first virtual plane 71 have substantially rectangular shapes, whose longitudinal directions coincide with the second axis direction (Y axis direction). In addition, the first to third magnetic flux concentrators 60a to 60c are disposed in substantially parallel to the second axis direction, and the second magnetic flux concentrator 60b is centrally located. That is, the plural magnetic flux concentrators (magnetic flux concentrator units) 60a to 60c are parallel to one another and are parallel to the substrate, one of the two adjacent magnetic flux concentrators is displaced with respect to the other of the magnetic flux concentrators in the longitudinal direction. In more detail, the plural magnetic flux concentrators 60a to 60c are disposed such that the one magnetic flux concentrator 60b is displaced with respect to the two magnetic flux concentrators 60a and 60c in the longitudinal direction, and the two magnetic flux concentrators 60a and 60c face each other so as to sandwich the one magnetic flux concentrator 60b in the planar view. In the drawing, the rectangular magnetic flux concentrators have four right-angled corners, but at least one corner of the four corners may be rounded or chamfered. In addition, the shape of the magnetic flux concentrator overlapping with the first virtual plane 71 is not limited to rectangular, may be any of a quadrangle, a parallelogram, and a trapezoid, whose longitudinal direction is substantially parallel to the second axis direction.

Furthermore, the first to third magnetic flux concentrators 60a to 60c are parallel to the second axis direction and have long sides parallel to the second axis direction, the long sides being of the same length, however, the lengths of the long sides may be different from each other. In addition, the first to third magnetic flux concentrators 60a to 60c have short sides parallel to the first axis direction (X axis direction), the short sides being of the same length, however, the lengths of the short sides may be different from each other. In addition, the first to third magnetic flux concentrators 60a to 60c are disposed such that the bottom faces of the concentrators 60a to 60c contact the first virtual plane 71, however, the concentrators 60a to 60c may be disposed such that a part of each of the concentrators 60a to 60c crosses the first virtual plane 71. In addition, in FIGS. 15A and 15B, the thicknesses of the first to third magnetic flux concentrators 60a to 60c in the third axis direction are the same, however the thicknesses of the concentrators 60a to 60c may be different from one another.

In addition, the first to third magnetic flux concentrators 60a to 60c are disposed such that the second magnetic flux concentrator 60b projects from the first magnetic flux concentrator 60a and the third magnetic flux concentrator 60c in the second direction. In more detail, the first to third magnetic flux concentrators 60a to 60c are disposed such that a plane (XZ plane) perpendicular to the second axis direction including one endpoint 161b of the two endpoints 161b and 162b of the shape of the second magnetic flux concentrator 60b overlapping with the first virtual plane 71 crosses neither of the first and third magnetic flux concentrators 60a and 60c, the two endpoints 161b and 162b being located on a negative side and a positive side in the second axis direction, respectively. And, the first to third magnetic flux concentrators 60a to 60c are disposed such that a plane (XZ plane) perpendicular to the second axis direction including the other endpoint 162b crosses both of the first and third magnetic flux concentrators 60a and 60c. However, when the side at the end in the second axis direction of the second magnetic flux concentrator 60b overlapping with the first virtual plane 71 is parallel to the first axis direction, the endpoint is any one point on the side at the end.

Such a configuration forms a magnetic flux component from the second magnetic flux concentrator 60*b* to the first magnetic flux concentrator 60*a* and a magnetic flux component from the second magnetic flux concentrator 60*b* to the third magnetic flux concentrator 60*c* when a magnetic field is inputted to the second magnetic flux concentrator 60*b* in the longitudinal direction.

In addition, the first to third magnetic flux concentrators 60*a* to 60*c* are disposed to have rectangular shapes, whose longitudinal direction coincides with the second axis direction. An first inter-edge distance Lab is a distance between a side of the first magnetic flux concentrator 60*a* overlapping with the first virtual plane 71 which is the closest to the second magnetic flux concentrator 60*b*, and a side of the second magnetic flux concentrator 60*b* overlapping with the first virtual plane 71 which is the closest to the first magnetic flux concentrator 60*a*. An second inter-edge distance Lbc is a distance between a side of the second magnetic flux concentrator 60*b* overlapping with the first virtual plane 71 which is the closest to the third magnetic flux concentrator 60*c*, and a side of the third magnetic flux concentrator 60*c* overlapping with the first virtual plane 71 which is the closest to the second magnetic flux concentrator 60*b*.

In more detail, the first and second inter-edge distances Lab and Lbc are defined as follows. The first inter-edge distance Lab is a distance between a side of the first magnetic flux concentrator 60*a* overlapping with the first virtual plane 71 which is the closest to the second magnetic flux concentrator 60*b*, and a side of the second magnetic flux concentrator 60*b* overlapping with the first virtual plane 71 which is the closest to the first magnetic flux concentrator 60*a* in a first range R1 in the second axis direction, the first range R1 being a range where a plane perpendicular to the second axis direction crosses both of the first and second magnetic flux concentrators 60*a* and 60*b*. Then, the second inter-edge distance Lbc is a distance between a side of the second magnetic flux concentrator 60*b* overlapping with the first virtual plane 71 which is the closest to the third magnetic flux concentrator 60*c*, and a side of the third magnetic flux concentrator 60*c* overlapping with the first virtual plane 71 which is the closest to the second magnetic flux concentrator 60*b* in a second range R2 in the second axis direction, the second range R2 being a range where a plane perpendicular to the second axis direction crosses both of the second and third magnetic flux concentrators 60*b* and 60*c*.

In addition, the first to third magnetic flux concentrators 60*a* to 60*c* are disposed such that the inter-edge distances Lab and Lbc are substantially equal to each other. More specifically, it is preferable that one of the inter-edge distances Lab and Lbc be not shorter than 0.7 times and not longer than 1.3 times the other of Lab and Lbc. The magnetic sensor of the fifth embodiment having such a configuration can minimize variation in each of sensitivities to the magnetic fields in the first to third directions, when the variation in the first and second inter-edge distances Lab and Lbc due to production tolerance falls within such a range.

The first to fifth magneto-resistance elements 50*a* to 50*e* are disposed on the second virtual plane 72 substantially parallel to the substrate plane 70 and are formed to sense only the magnetic field in the first axis direction in a state where there is no magnetic flux concentrator and the like. In other words, the first to fifth magneto-resistance elements 50*a* to 50*e* have a sensitive axis in the first axis direction in a state where there is no magnetic flux concentrator and the like.

In addition, the first to fifth magneto-resistance elements 50*a* to 50*e* are preferably formed in flat plate shapes. The shape of the magneto-resistance element overlapping with the second virtual plane 72 are not limited to rectangular as illustrated in FIGS. 15A and 15B (when viewed in the third axis direction, that is, in the planar view). The magneto-resistance element may be formed in any shape. The shape of the magneto-resistance element may be, for example, any of a quadrangle, a quadrate, a parallelogram, a trapezoid, a triangle, a polygon, a circle, and an ellipse. In the case of GMR elements, the shape of the magneto-resistance element overlapping with the second virtual plane 72 is preferably substantially rectangular as illustrated in FIGS. 15A and 15B (when viewed in the third axis direction, that is, in the planar view). The magneto-resistance elements may be divided in the second axis direction into a series of magneto-resistance elements. The series of magneto-resistance elements can be used as a cluster of magneto-resistance elements by connecting between the respective adjacent ones of the magneto-resistance elements with a metal wiring. In other word, for example, the first magneto-resistance element 50*a* is not limited to a single magneto-resistance element, may be formed by connecting two or more magneto-resistance elements with metal wirings.

In addition, the first to fifth magneto-resistance elements 50*a* to 50*e* are disposed such that the bottom faces of these magneto-resistance elements contact the second virtual plane 72, however, these magneto-resistance elements may be disposed such that a part of each of these magneto-resistance elements crosses the second virtual plane 72. In addition, the thicknesses of the first to fifth magneto-resistance elements 50*a* to 50*e* in the third axis direction are the same, however the thicknesses of these magneto-resistance elements may be different from one another.

In addition, the first to fourth magneto-resistance elements 50*a* to 50*d* include two magneto-resistance elements 50*a* and 50*b* (first magnetic detector group) disposed between the first magnetic flux concentrator 60*a* and the second magnetic flux concentrator 60*b*, and another two magneto-resistance elements 50*c* and 50*d* (second magnetic detector) disposed between the second magnetic flux concentrator 60*b* and the third magnetic flux concentrator 60*c*. With respect to the first to fourth magneto-resistance elements 50*a* to 50*d*, the first magneto-resistance element 50*a* among the two magneto-resistance elements 50*a* and 50*b* is disposed to be adjacent to the first magnetic flux concentrator 60*a* and the second magneto-resistance elements 50*b* is disposed to be adjacent to the second magnetic flux concentrator 60*b*. Furthermore, the third magneto-resistance element 50*c* among the other two magneto-resistance elements 50*c* and 50*d* is disposed to be adjacent to the second magnetic flux concentrator 60*b* and the fourth magneto-resistance elements 50*d* is disposed to be adjacent to the third magnetic flux concentrator 60*c*. That is, the plural magneto-resistance elements (magnetic detectors) 50*a* to 50*d* are substantially parallel to the plural magnetic flux concentrators 60*a* to 60*c*. The magneto-resistance elements 50*a* and 50*b* are disposed between the two adjacent magnetic flux concentrators 60*a* and 60*b* among the plural magnetic flux concentrators 60*a* to 60*c*, such that the magneto-resistance elements 50*a* and 50*b* are close to the magnetic flux concentrators 60*a* and 60*b*, respectively, in the planar view. In addition, the magneto-resistance elements 50*c* and 50*d* are disposed between the two adjacent magnetic flux concentrators 60b and 60c among the plural magnetic flux concentrators 60a to 60c, such that the magneto-resistance elements 50c and 50d are close to the magnetic flux concentrators 60b and 60c, respectively, in the planar view.

With respect to the positional relationship between the first magneto-resistance element 50a and the first magnetic flux concentrator 60a, it is important that the first magneto-resistance element 50a is disposed to be adjacent to an edge side of the first magnetic flux concentrator 60a extending in the longitudinal direction, in the planar view, when viewed in the third axis direction. That is, it is important that the first magneto-resistance element 50a is disposed to be closer to the other magnetic flux concentrator 60a among the two adjacent magnetic flux concentrators 60a and 60b than to the one magnetic flux concentrator 60b. In addition, it is important that the second magneto-resistance element 50b is disposed to be closer to the one magnetic flux concentrator 60b among the two adjacent magnetic flux concentrators 60a and 60b than to the other magnetic flux concentrator 60a. More preferably, a part of the first magneto-resistance element 50a, the part extending in the long side direction, may be covered with the first magnetic flux concentrator 60a in the planar view. That is, the first magneto-resistance element 50a and the first magnetic flux concentrator 60a overlap with each other to some extent, in the planar view, when viewed in the third axis direction. This is also applied to the positional relationship between the second magneto-resistance element 50b and the second magnetic flux concentrator 60b, the positional relationship between the third magneto-resistance element 50c and the second magnetic flux concentrator 60b, and the positional relationship between the fourth magneto-resistance element 50d and the third magnetic flux concentrator 60c.

The magnetic sensor of the fifth embodiment having such a configuration has an advantage of improving the sensitivity in detecting the magnetic field in each of the first to third axis directions. In addition, the magnetic sensor of the fifth embodiment has an advantage of minimizing variation in each of sensitivities to the magnetic fields in the first to third directions even if the magnetic sensor is formed to have, due to production tolerance, a displacement of the position of the magneto-resistance element in the first axis direction with respect to the magnetic flux concentrator or variation of the width of the magnetic flux concentrator.

It is preferable that the two magneto-resistance elements 50a and 50b be disposed between the first magnetic flux concentrator 60a and the second magnetic flux concentrator 60b, such that at least a part of the magneto-resistance element 50a and at least a part of the magneto-resistance element 50b are positioned within the first range R1 extending in the second axis direction, so as to sense the magnetic field in the first axis direction in the first range R1. It is more preferable that the entirety of the two magneto-resistance elements 50a and 50b be disposed within the first range R1. Similarly, it is preferable that the other two magneto-resistance elements 50c and 50d be disposed between the second magnetic flux concentrator 60b and the third magnetic flux concentrator 60c, such that at least a part of the magneto-resistance element 50c and at least a part of the magneto-resistance element 50d are positioned within the second range R2 extending in the second axis direction, so as to sense the magnetic field in the first axis direction in the second range R2. It is more preferable that the entirety of the two magneto-resistance elements 50c and 50d be disposed within the second range R2.

In addition, the first to third magnetic flux concentrators 60a to 60c are disposed to have rectangular shapes, whose longitudinal directions coincide with the second axis direction. The first to fourth magneto-resistance elements 50a to 50d also are disposed to have rectangular shapes, whose longitudinal directions coincide with the second axis direction.

The first virtual median line VM1 is a line midway between a side of the first magnetic flux concentrator 60a overlapping with the first virtual plane 71 which is the closest to the second magnetic flux concentrator 60b, and a side of the second magnetic flux concentrator 60b overlapping with the first virtual plane 71 which is the closest to the first magnetic flux concentrator 60a. The first inter-median-line distance L1 is a distance between the first virtual median line VM1 and a line midway between two edge sides of the first magneto-resistance element 50a overlapping with the second virtual plane 72, the two edge sides being perpendicular to the first axis direction. In addition, the second inter-median-line distance L2 is a distance between the first virtual median line VM1 and a line midway between two edge sides of the second magneto-resistance element 50b overlapping with the second virtual plane 72, the two edge sides being perpendicular to the first axis direction.

Similarly, the second virtual median line VM2 is a line midway between a side of the second magnetic flux concentrator 60b overlapping with the first virtual plane 71 which is the closest to the third magnetic flux concentrator 60c, and a side of the third magnetic flux concentrator 60c overlapping with the first virtual plane 71 which is the closest to the second magnetic flux concentrator 60b. The third inter-median-line distance L3 is a distance between the second virtual median line VM2 and a line midway between two edge sides of the third magneto-resistance element 50c overlapping with the second virtual plane 72, the two edge sides being perpendicular to the first axis direction. In addition, the fourth inter-median-line distance L4 is a distance between the second virtual median line VM2 and a line midway between two edge sides of the fourth magneto-resistance element 50d overlapping with the second virtual plane 72, the two edge sides being perpendicular to the first axis direction.

In more detail, the first to fourth inter-median-line distances L1 to L4 are defined as follows. It is assumed that the first virtual median line VM1 is a line including the first virtual intersection VP1 and parallel to the second axis direction, the first virtual intersection VP1 being an intersection between the second virtual plane 72 and a line extending in the third axis direction from the midpoint of the line segment of the first inter-edge distances Lab.

In addition, it is assumed that the first virtual line I1 is a line parallel to the first axis direction including the midpoint between the ends in the second axis direction of the first magneto-resistance element 50a within the first range R1. In addition, it is assumed that the second virtual line I2 is a line parallel to the first axis direction including the midpoint between the ends in the second axis direction of the second magneto-resistance element 50b within the first range R1.

Similarly, it is assumed that the second virtual median line VM2 is a line including the second virtual intersection VP2 and parallel to the second axis direction, the second virtual intersection VP2 being an intersection between the second virtual plane 72 and a line extending in the third axis direction from the midpoint of the line segment of the second inter-edge distances Lbc.

In addition, it is assumed that the third virtual line I3 is a line parallel to the first axis direction including the midpoint between the ends in the second axis direction of the third magneto-resistance element 50c within the second range R2. In addition, it is assumed that the fourth virtual line I4 is a line parallel to the first axis direction including the midpoint between the ends in the second axis direction of the fourth magneto-resistance element 50d within the second range R2.

Then, the first inter-median-line distance L1 is the length of a line segment connecting the intersection between the first virtual line I1 and the first virtual median line VM1 to a point midway between two ends of the first magneto-resistance element 50a on the first virtual line I1. In addition, the second inter-median-line distance L2 is the length of a line segment connecting the intersection between the second virtual line I2 and the first virtual median line VM1 to a point midway between two ends of the second magneto-resistance element 50b on the second virtual line I2.

Similarly, the third inter-median-line distance L3 is the length of a line segment connecting the intersection between the third virtual line I3 and the second virtual median line VM2 to a point midway between two ends of the third magneto-resistance element 50c on the third virtual line I3. In addition, the fourth inter-median-line distance L4 is the length of a line segment connecting the intersection between the fourth virtual line I4 and the second virtual median line VM2 to a point midway between two ends of the fourth magneto-resistance element 50d on the fourth virtual line I4.

The first to fourth magneto-resistance elements 50a to 50d and the first to third magnetic flux concentrators 60a to 60c are disposed such that the first inter-median-line distance L1, the second inter-median-line distance L2, the third inter-median-line distance L3, and the fourth inter-median-line distance L4 are substantially equal to one another. More specifically, it is preferable that any three of the first to fourth inter-median-line distances L1 to L4 be not shorter than 0.7 times and not longer than 1.3 times the other one of L1 to L4.

The magnetic sensor of the fifth embodiment having such a configuration has an advantage of minimizing variation in each of sensitivities to the magnetic fields in the first to third directions, when the variation in the first to fourth inter-median-line distances L1 to L4 due to production tolerance falls within such a range. For example, it was confirmed from the result of magnetic field numerical analysis based on the integral element method that the variation in the sensitivity to the magnetic field in the third axis direction was equal or less than about 5 percent when the magnetic field in the third axis direction was applied.

The fifth magneto-resistance element 50e (auxiliary magnetic detector) is disposed to be covered with the second magnetic flux concentrator 60b. Since the magnetic path in which the magnetic field in the first axis direction is concentrated by the second magnetic flux concentrator 60b is formed, the magnetic field in the first axis direction inputted to the fifth magneto-resistance element 50e becomes very small. In addition, the magnetic field in the second axis direction and the magnetic field in the third axis direction are not converted into the magnetic field in the first axis direction at the position of the fifth magneto-resistance element 50e, thus are not detected. Therefore, the fifth magneto-resistance element 50e does not sense the magnetic field in any of the first to third directions. As illustrated, it is preferable that the fifth magneto-resistance element 50e be disposed at the center of the second magnetic flux concentrator 60b in the short direction. The fifth magneto-resistance element 50e only has to be disposed to be covered with at least one magnetic flux concentrator among the first to third magnetic flux concentrators. In FIGS. 15A and 15B, the fifth magneto-resistance element 50e is disposed to be covered with the second magnetic flux concentrator 60b, in the planar view. However, the fifth magneto-resistance element 50e may be disposed to be covered with the first magnetic flux concentrator 60a or the third magnetic flux concentrator 60c.

In addition, although not illustrated in the drawings, the fifth magneto-resistance element 50e may be disposed to be covered with a magnetic flux concentrator, which is provided separately from the first to third magnetic flux concentrators 60a to 60c. In addition, the plural fifth magneto-resistance elements 50e may be provided.

It is preferable that the magnetic flux concentrators be made of a soft magnetic material, such as NiFe, NiFeB, NiFeCo, CoFe, or the like. The magneto-resistance element is not limited to the GMR element illustrated in FIG. 1, and may be any type of element sensing only the magnetic field in one axis direction and having a resistance which changes depending on the sensed magnetic field, including a tunneling magneto-resistance (TMR) element, an anisotropic magneto-resistance (AMR) element, and a semiconductor magneto-resistance (SMR) element, for example.

The first and second virtual planes 71 and 72 are disposed in the third axis direction such that the second virtual plane 72 is positioned above the substrate plane 70, and the first virtual plane 71 is positioned above the second virtual plane 72. Such a configuration is most preferable from the viewpoint of manufacturing and performance, since it is possible to apply a simple method of forming the magnetic flux concentrator, after forming a magneto-resistance element sensing the magnetic field in only the first axis direction on the substrate plane 70. However, the fifth embodiment is not limited to such a configuration.

Preferable numerical examples in the fifth embodiment will be hereinafter described. It is necessary that the lengths in the first axis direction (widths) of the first to fourth magneto-resistance elements 50a to 50d are selected appropriately by a designer depending on the desired magnetic detection characteristics. When the size of the sensor is not restricted, the width of magneto-resistance element is preferably in a range of 0.5 to 20 μm. The length in the first axis direction (width) of the second magnetic flux concentrator 60b only has to be in a range within which the second magnetic flux concentrator 60b covers the entirety of the fifth magneto-resistance element 50e and has a sufficient magnetic shield effect on the fifth magneto-resistance element 50e. The width of the second magnetic flux concentrator 60b is preferably not shorter than 1.5 times the width of the fifth magneto-resistance element 50e, more preferably not shorter than 3 times the width of the fifth magneto-resistance element 50e. The widths of the first and third magnetic flux concentrators 60a and 60c equivalent to the width of the second magnetic flux concentrator 60b facilitate the manufacturing. However, since the fifth magneto-resistance element 50e as an auxiliary magnetic detector is not provided at the first and third magnetic flux concentrators 60a and 60c, the widths of the first and third magnetic flux concentrators 60a and 60c may be selected to be shorter than the width of the second magnetic flux concentrator 60b. The positional relationship among the first to third magnetic flux concentrators 60a to 60c in the second axis direction is important. As the protruding length of the second magnetic flux concentrator 60b from the first and third magnetic flux concentrators 60a and 60c is longer, the flux concentration effect is enhanced. It is preferable that the protruding length be equal to or several times the width of the magnetic flux concentrator.

Figure 16:
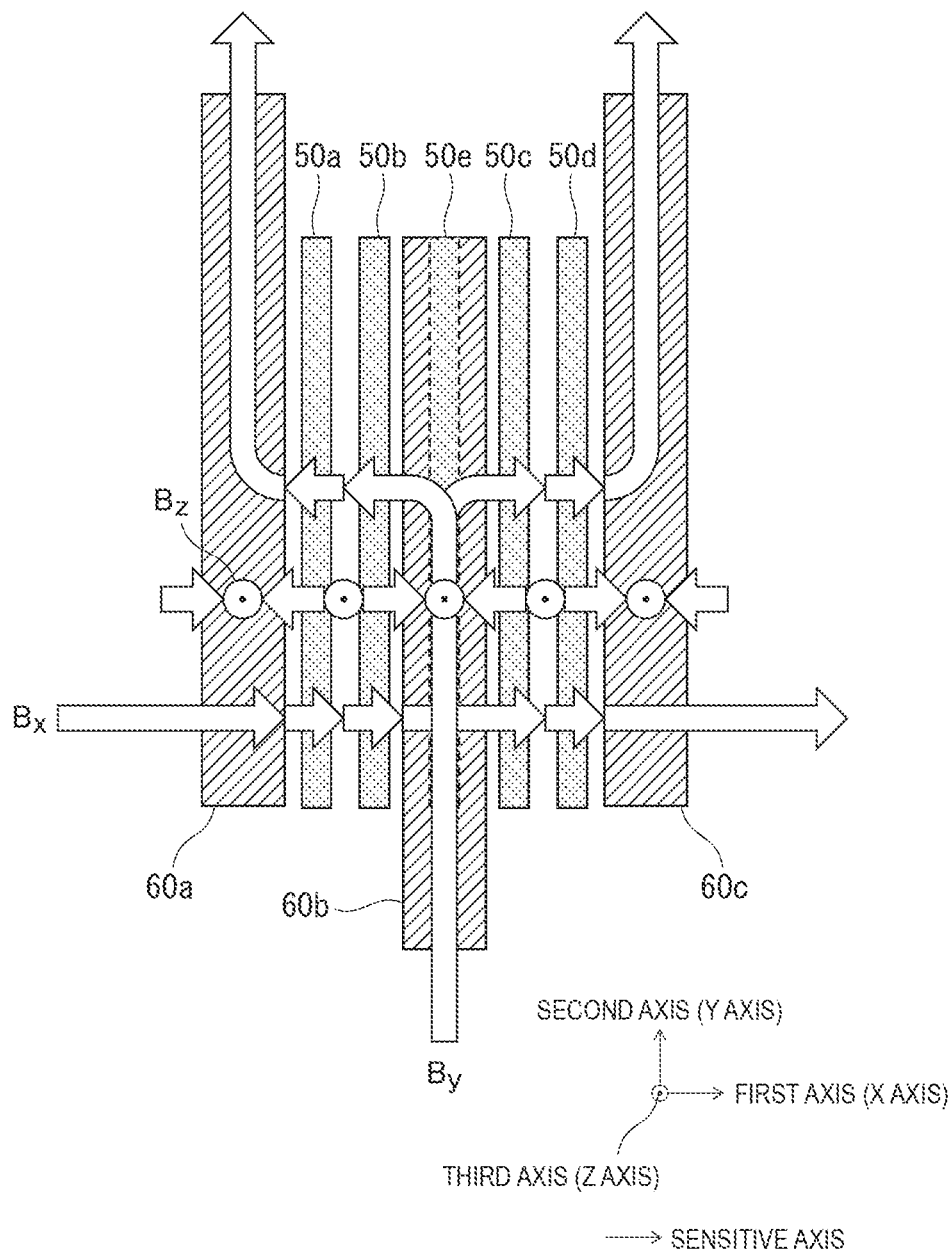
FIG. 16 is a view illustrative of the operation of the magnetic sensor illustrated in FIGS. 15A and 15B.

FIG. 16 is a view illustrative of the operation of the magnetic sensor illustrated in FIGS. 15A and 15B.

First, two magnetic paths of the magnetic field By in the second axis direction is formed, one of the magnetic paths traversing the second and first magneto-resistance elements 50b and 50a toward the negative first axis direction from the second magnetic flux concentrator 60b projecting toward the negative second axis direction, then passing through the first magnetic flux concentrator 60a, the other of the magnetic paths traversing the third and fourth magneto-resistance elements 50c and 50d toward the positive first axis direction from the second magnetic flux concentrator 60b, then passing through the third magnetic flux concentrator 60c, In such a configuration, the first to fourth magneto-resistance elements 50a to 50d detect the magnetic field in the first axis direction, which is obtained by converting the magnetic field inputted in the second axis direction and is proportional to the magnitude thereof.

Next, a magnetic path in which the magnetic field Bz in the third axis direction traverses the first magneto-resistance element 50a toward the negative first axis direction, and then is concentrated by the first magnetic flux concentrator 60a, and a magnetic path in which the magnetic field Bz traverses the second magneto-resistance element 50b toward the positive first axis direction, and then is concentrated by the second magnetic flux concentrator 60b, are formed. In addition, a magnetic path in which the magnetic field Bz in the third axis direction traverses the third magneto-resistance element 50c toward the negative first axis direction, and then is concentrated by the second magnetic flux concentrator 60b, and a magnetic path in which the magnetic field Bz traverses the fourth magneto-resistance element 50d toward the positive first axis direction, and then is concentrated by the third magnetic flux concentrator 60c, are formed. In such a configuration, the first to fourth magneto-resistance elements 50a to 50d detect the magnetic field in the first axis direction, which is obtained by converting the magnetic field inputted in the third axis direction and is proportional to the magnitude thereof.

Furthermore, a magnetic path in which the magnetic field Bx in the first axis direction is concentrated by the first magnetic flux concentrator 60a and passes through the first magnetic flux concentrator 60a, traverses the first and second magneto-resistance elements 50a and 50b toward the positive first direction, is concentrated by the second magnetic flux concentrator 60b and passes through the second magnetic flux concentrator 60b, traverses the third and fourth magneto-resistance elements 50c and 50d toward the positive first direction, and then is concentrated by the third magnetic flux concentrator 60c and passes through the third magnetic flux concentrator 60c, is formed. In such a configuration, the first to fourth magneto-resistance elements 50a to 50d detect the magnetic field in the first axis direction.

Figure 17:
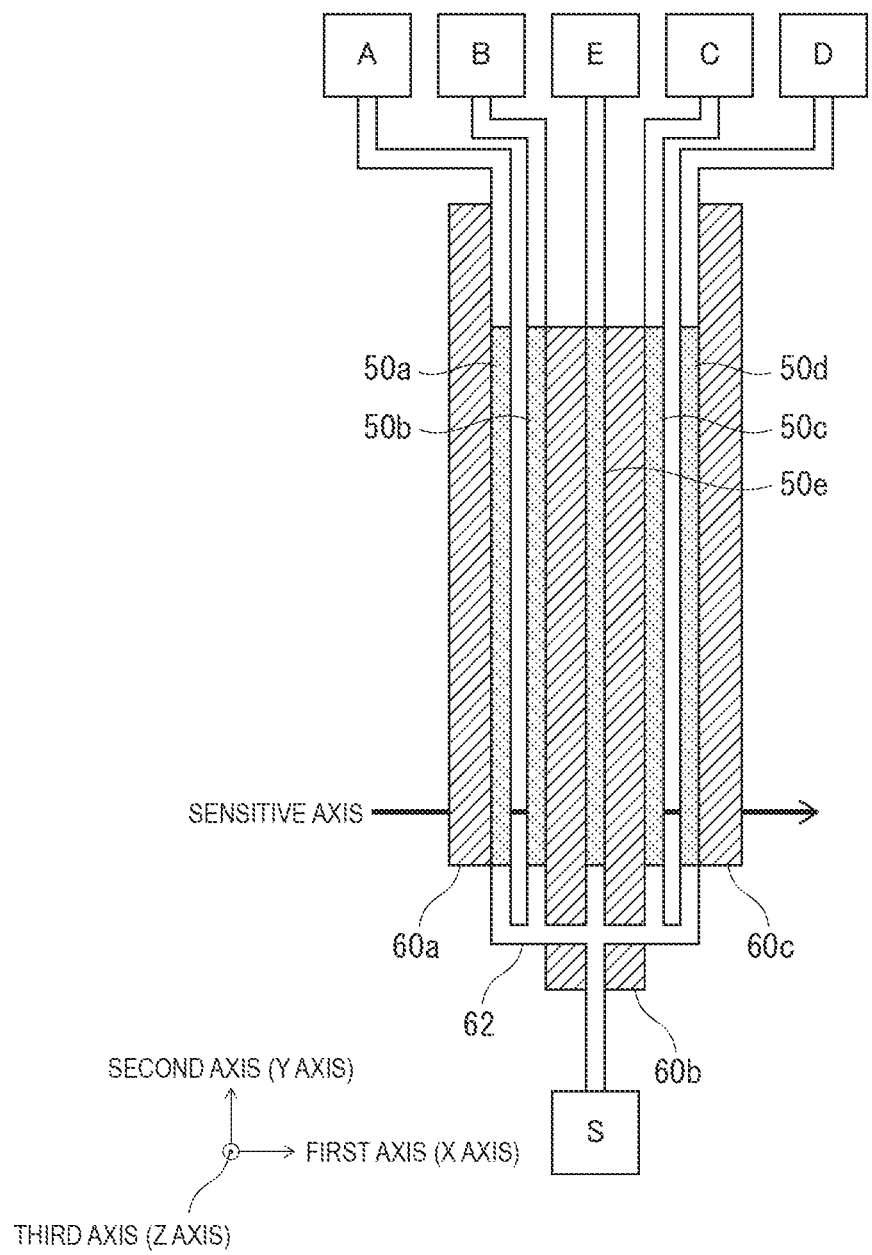
FIG. 17 is a view illustrative of output signals of the magnetic sensor illustrated in FIGS. 15A and 15B.

FIG. 17 is a view illustrative of output signals of the magnetic sensor illustrated in FIGS. 15A and 15B. In the drawing, a reference numeral 62 denotes a metal wiring, a reference symbol S denotes an output terminal at which the first terminals of the first to the fifth magneto-resistance elements 50a to 50e are electrically coupled at one point, and reference symbols A, B, C, D, and E denote output terminals to which the second terminals of the first to the fifth magneto-resistance elements 50a to 50e are connected, respectively. Then when $R_A$, $R_B$, $R_C$, $R_D$, and $R_E$ represent the magneto-resistances between the output terminals A and S, between the output terminals B and S, between the output terminals C and S, between the output terminals D and S, and between the output terminals E and S, respectively, the respective magneto-resistances are represented as follows.

$$R_A = R + \Delta Rx - \Delta Ry - \Delta Rz \tag{11}$$

$$R_B = R + \Delta Rx - \Delta Ry + \Delta Rz \tag{12}$$

$$R_C = R + \Delta Rx + \Delta Ry - \Delta Rz \tag{13}$$

$$R_D = R + \Delta Rx + \Delta Ry + \Delta Rz \tag{14}$$

$$R_E = R \tag{15}$$

Here, R represents the resistance which does not depend on the magnetic field (or the resistance when there is no magnetic field), ΔRx represents the amount of the resistance change depending on the magnitude of the magnetic field Bx in the first axis direction, ΔRy represents the amount of the resistance change depending on the magnitude of the magnetic field By in the second axis direction, and ΔRz represents the amount of the resistance change depending on the magnitude of the magnetic field Bz in the third axis direction. Each of the magneto-resistances represented by the expressions (11) to (14) includes the amounts of the resistance change ΔRx, ΔRy, and ΔRz depending on the magnitude of the three axis components of the magnetic field.

The each of signs of ΔRx, ΔRy, and ΔRz corresponds to the orientation of each of the magnetic fields converted to the first direction axis when traversing the first to fourth magneto-resistance elements 50a to 50d. The magneto-resistance represented by the expression (15) includes none of the amounts of the resistance change of the three axis components, since none of the magnetic fields in the first to third directions are sensed. Output signals corresponding amounts of the resistance change depending on the magnitude of the magnetic fields in the respective axes are extracted from the magneto-resistances represented by the expressions (11) to (15) as follows.

By calculating (11)−(15), $$S_A = R_A - R_E = \Delta Rx - \Delta Ry - \Delta Rz \tag{16}$$

By calculating (12)−(15), $$S_B = R_B - R_E = \Delta Rx - \Delta Ry + \Delta Rz \tag{17}$$

By calculating (13)−(15), $$S_C = R_C - R_E = \Delta Rx + \Delta Ry - \Delta Rz \tag{18}$$

By calculating (14)−(15), $$S_D = R_D - R_E = \Delta Rx + \Delta Ry + \Delta Rz \tag{19}$$

Furthermore, following expressions are obtained.
By calculating (16)+(17)+(18)+(19), $$4\Delta Rx = S_A + S_B + S_C + S_D$$

By calculating −(16)−(17)+(18)+(19), $$4\Delta Ry = -S_A - S_B + S_C + S_D$$

By calculating −(16)+(17)−(18)+(19), $$4\Delta Rz = -S_A + S_B - S_C + S_D$$

As seen above, it can be understood that it is possible to extract output signals in respective axes. That is, the magnetic field components in respective axes are obtained by solving the simultaneous equations with respect to resistances.

In FIG. 17, the wiring used for connecting the magneto-resistance elements is a metal wiring, however, a wiring formed from the same material as the magneto-resistance elements may be used, and both types of wiring can be used in mixture. In addition, the configuration in which the first terminals of the first to the fifth magneto-resistance elements 50a to 50e are electrically coupled to one point and then connected to the output terminal S is most preferable, since the number of the output terminal can be reduced. However, the essence of the invention does not vary, even if the first terminals of the first to fifth magneto-resistance elements 50a to 50e are connected to output terminals, respectively.

Figure 18:
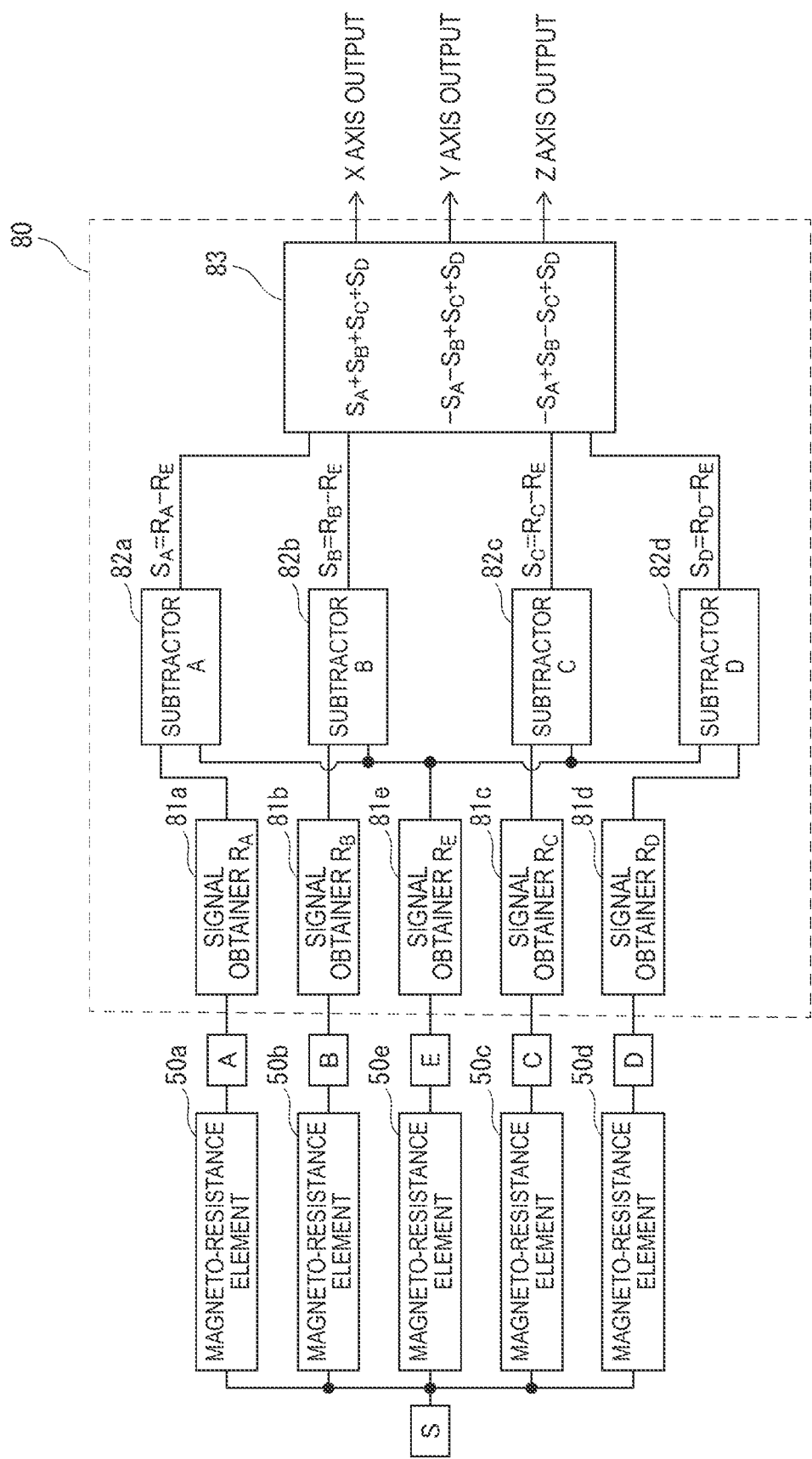
FIG. 18 is a configuration diagram of a circuit for a calculator of the output signals of the magnetic sensor illustrated in FIGS. 15A and 15B.

FIG. 18 is a configuration diagram of a circuit for a calculator of the output signals of the magnetic sensor illustrated in FIGS. 15A and 15B. In the drawing, a reference numeral 80 denotes a calculator, reference numerals 81a to 81e denote signal obtainers, reference numerals 82a to 82d denote subtractors and a reference numeral 83 denotes an adder-subtractor.

The calculator 80 calculates the magnetic fields in the respective axes by calculation on the basis of the outputs of the first to fourth magneto-resistance elements 50a to 50d and of the fifth magneto-resistance element 50e. That is, the calculator 80 calculates the magnetic fields in the respective axes by calculation on the basis of the resistances of the first to fifth magneto-resistance elements 50a to 50e. Specifically, the calculator 80 obtains the magnetic fields in the respective axes by solving the simultaneous equations with respect to resistances of the first to fifth magneto-resistance elements 50a to 50e.

In this example, the calculator 80 includes the signal obtainers 81a to 81e configured to receive the signals on the basis of the magneto-resistances from the first to fifth magneto-resistance elements 50a to 50e, respectively, to output signals corresponding the expressions (11) to (15), respectively, the subtractors 81a to 81d configured to subtract the expression (15) from the expressions (11) to (14), respectively, to output signals corresponding the expressions (16) to (19), respectively, and the adder-subtractor 83 configured to calculate and output the magnetic field components in the first to third axis directions by using the expressions (16) to (19).

Figure 19:
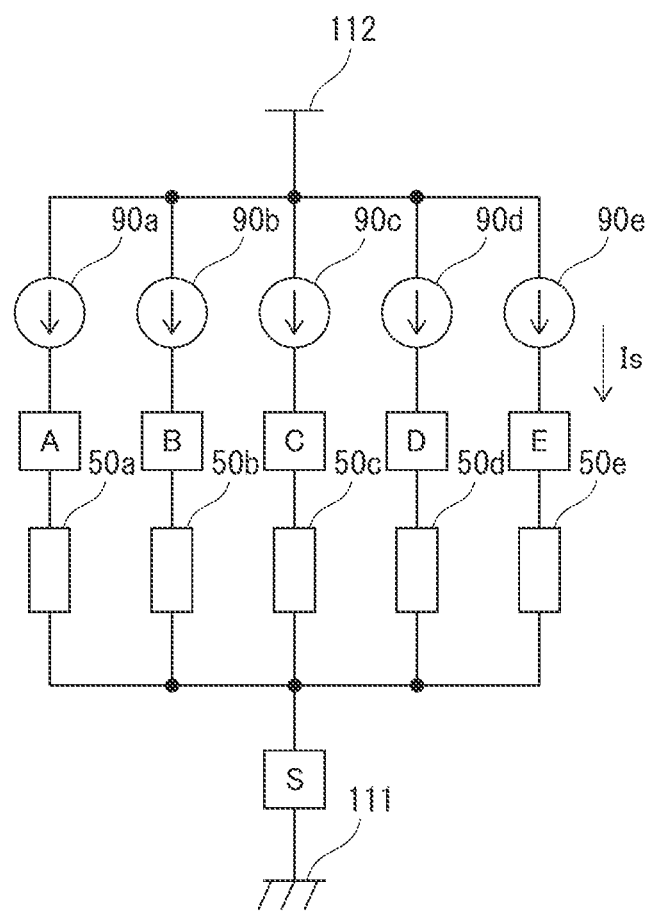
FIG. 19 is a configuration diagram of a specific circuit for the signal detection of the magnetic sensor illustrated in FIG. 17.

FIG. 19 is a configuration diagram of a specific circuit for the signal detection of the magnetic sensor illustrated in FIG. 17. In the drawing, reference numerals 50a to 50e denotes the first to fifth magneto-resistance elements, a reference symbol S denotes an output terminal at which the first terminals of the first to the fifth magneto-resistance elements 50a to 50e are electrically coupled at one point, and reference symbols A, B, C, D, and E denote output terminals to which the second terminals of the first to fifth magneto-resistance elements 50a to 50e are connected, respectively, reference numerals 90a to 90e denote the first to fifth constant current sources, respectively, a reference numeral 111 denotes the first electrical potential, and a reference numeral 112 denotes the second electrical potential.

The first electrical potential 111 is applied to the output terminal S. In addition, the output terminals A, B, C, D, and E are connected to the first terminals of the first to the fifth constant current sources 90a to 90e, respectively. The second terminals of the first to the fifth constant current sources 90a to 90e are electrically coupled to one point and the second electrical potential 112 is applied the one point.

Currents of magnitude Is generated by the first to fifth constant current sources 90a to 90e are supplied to the first to fifth magneto-resistance elements 50a to 50e, respectively, via output terminals A, B, C, D, and E connected thereto.

In such a configuration, the voltage $V_{AS}$ between the output terminals A and S is $V_{AS}=IsR_A=Is$ ($\Delta R+Rx-\Delta Ry-\Delta Rz$), thus the signal obtained by multiplying the expression (11) by Is is available. Similarly, from the voltages $V_{BS}$, $V_{CS}$, $V_{DS}$, and $V_{ES}$ between the output terminals B and S, between the output terminals C and S, between the output terminals D and S, and between the output terminals E and S, the signals obtained by multiplying the expressions (12), (13), (14), and (15) by Is are available, respectively.

Next, the differential voltage $V_A$ obtained from the voltage $V_{AS}$ and the voltage $V_{ES}$ is $V_A=V_{AS}-V_{ES}=IsS_A=Is$ ($\Delta Rx-\Delta Ry-\Delta Rz$), thus the signal obtained by multiplying the expression (16) by Is is available. Similarly, from the differential voltage $V_B$ obtained from the voltage $V_{BS}$ and the voltage $V_{ES}$, the differential voltage $V_C$ obtained from the voltage $V_{CS}$ and the voltage $V_{ES}$, and the differential voltage $V_D$ obtained from the voltage $V_{DS}$ and the voltage $V_{ES}$, the signals obtained by multiplying the expression (17), (18), and (19) by Is are available.

As seen above, it is possible to extract the output signal $\Delta Rx$ in the first axis direction in the form of $4\Delta Rx=(V_A+V_B+V_C+C_D)/Is$, the output signal $\Delta Ry$ in the second axis direction in the form of $4\Delta Ry=(-V_A-V_B+V_C+C_D)/Is$, and the output signal $\Delta Rz$ in the third axis direction in the form of $4\Delta Rz=(-V_A+V_B-V_C+C_D)/Is$.

Now, in other words, the differential voltage $V_A$, $V_B$, $V_C$, and $V_D$ are a voltage between the output terminals A and E, a voltage between the output terminals B and E, a voltage between the output terminals C and E, and a voltage between the output terminals D and E, respectively. That is, it is possible to extract the signals obtained by multiplying the expressions (16) to (19) by Is, by directly measuring the voltages between the output terminals A and E, between the output terminals B and E, between the output terminals C and E, and between the output terminals D and E, so as to obtain output signals in respective axes.

The above-mentioned calculation method is merely an example, the simultaneous equations with respect to resistances of the first to fifth magneto-resistance elements 50a to 50e can be formed and solved in anyway as long as $\Delta Rx$, $\Delta Ry$, and $\Delta Rz$ can be obtained.

In addition, the first electrical potential 111 and the second electrical potential 112 are, but not limited to, a ground potential and a power supply potential of a power supply device.

In addition, the first to fifth magneto-resistance elements 50a to 50e are connected to the first to fifth constant current sources 90a to 90e, respectively, and are supplied with currents. However, switches may be provided with the output terminals A, B, C, D, and E, respectively, for example, so as to supply the current to each of the magneto-resistance elements from the at least one constant current source by operating the switches.

In addition, the magnetic sensor of the fifth embodiment can detect magnetic fields in the two or three axis directions on a substrate while suppressing the increase in current consumption. In addition, a small magnetic sensor with high resolution is achieved by using magneto-resistance elements having a sensitive axis in one direction.

Sixth Embodiment

In the magnetic sensor of the sixth embodiment, each of the plural magneto-resistance elements has a sensitive axis in the first axis (X axis) direction parallel to the substrate plane 70. The magnetic sensor of the sixth embodiment detects the magnetic fields in the two axis directions including the second axis (Y axis) and the third axis (Z axis) directions, or the magnetic fields in the three axis directions including the first axis to the third axis (X axis, Y axis, and Z axis) directions, the second axis being parallel to the substrate plane 70 and perpendicular to the first axis, the third axis being perpendicular to the substrate plane 70.

The plural magneto-resistance elements includes the fifth magneto-resistance element 50e and any three of the first to fourth magneto-resistance elements 50a to 50d disposed in the same way as the arrangement pattern of the fifth embodiment illustrated in FIGS. 15A and 15B.

It will be described hereinafter that the arrangement pattern illustrated in FIGS. 15A and 15B, from which the fourth magneto-resistance element 50d is removed for example, including the first to third magneto-resistance elements 50a to 50c, the fifth magneto-resistance element 50e, and the first to third magnetic flux concentrators 60a to 60c can detect the magnetic fields in three axis directions.

In FIG. 17, when the fourth magneto-resistance element 50d and the output terminal D are not present, the magneto-resistances $R_A$, $R_B$, $R_C$, and $R_E$ between the output terminals A and S, between the output terminals B and S, between the output terminals C and S, and between the output terminals E and S are obtained, respectively. Now, output signals corresponding amounts of the resistance change depending on the magnitude of the magnetic fields in respective axes are extracted from the magneto-resistances represented in the expressions (11) to (13), and (15) so as to obtain the expressions (16) to (18). Furthermore, following expressions are obtained.

By calculating −(16)+(18), $$2\Delta Ry = -S_A + S_C$$

By calculating −(16)+(17), $$2\Delta Rz = -S_A + S_B$$

By calculating (17)+(18), $$2\Delta Rx = S_B + S_C$$

As seen above, it can be understood that it is possible to extract output signals in respective axes. It has been described here that the magnetic fields in the three axis directions can be detected by an example in which the fourth magneto-resistance element 50d among the first to fourth magneto-resistance elements 50a to 50d is removed. However, the similar magnetic fields in the three axis directions can be also detected in the case where any one of the first to third magneto-resistance elements 50a to 50c is removed. In short, any configuration can be employed as long as the simultaneous equations can be formed and solved so as to extract ΔRx, ΔRy, and ΔRz.

Seventh Embodiment

In the magnetic sensor of the seventh embodiment, each of the plural magneto-resistance elements has a sensitive axis in the first axis (X axis) direction parallel to the substrate plane 70. The magnetic sensor of the seventh embodiment detects the magnetic fields in the two axis directions including the second axis (Y axis) and the third axis (Z axis) directions, or the magnetic fields in the three axis directions including the first axis to the third axis (X axis, Y axis, and Z axis) directions, the second axis being parallel to the substrate plane 70 and perpendicular to the first axis, the third axis being perpendicular to the substrate plane 70. The plural magneto-resistance elements includes the first to fourth magneto-resistance elements 50a to 50d disposed in the same way as the arrangement pattern of the fifth embodiment illustrated in FIGS. 15A and 15B, and does not include the fifth magneto-resistance element 50e.

It will be described hereinafter that the arrangement pattern illustrated in FIGS. 15A and 15B, from which the fifth magneto-resistance element 50e is removed, including the first to forth magneto-resistance elements 50a to 50d, and the first to third magnetic flux concentrators 60a to 60c can detect the magnetic fields in two axis directions.

In FIG. 17, when the fifth magneto-resistance element 50e and the output terminal E are not present, the magneto-resistances $R_A$, $R_B$, $R_C$, and $R_D$ between the output terminals A and S, between the output terminals B and S, between the output terminals C and S, and between the output terminals D and S are obtained, respectively. Now, output signals corresponding amounts of the resistance change depending on the magnitude of the magnetic fields in respective axes are extracted from the magneto-resistances represented in the expressions (11) to (14) as follows.

By calculating −(11)+(13), $$2\Delta Ry = -R_A + R_C \tag{20}$$

By calculating −(12)+(14), $$2\Delta Ry = -R_B + R_D \tag{21}$$

By calculating −(11)+(12), $$2\Delta Rz = -R_A + R_B \tag{22}$$

By calculating −(13)+(14), $$2\Delta Rz = -R_C + R_D \tag{23}$$

In addition,
By calculating (20)+(21),

4ΔRy is obtained.

By calculating (22)+(23),

4ΔRz is obtained.

As seen above, it can be understood that it is possible to extract output signals in respective axes. In short, any configuration can be employed as long as the simultaneous equations can be formed and solved so as to extract ΔRx, ΔRy, and ΔRz.

Eighth Embodiment

In the magnetic sensor of the eighth embodiment, each of the plural magneto-resistance elements has a sensitive axis in the first axis (X axis) direction parallel to the substrate plane 70. The magnetic sensor of the eighth embodiment detects the magnetic fields in the two axis directions including the second axis (Y axis) and the third axis (Z axis) directions, or the magnetic fields in the three axis directions including the first axis to the third axis (X axis, Y axis, and Z axis) directions, the second axis being parallel to the substrate plane 70 and perpendicular to the first axis, the third axis being perpendicular to the substrate plane 70. The plural magneto-resistance elements includes any three magneto-resistance elements among the first to fourth magneto-resistance elements 50a to 50d disposed in the same way as the arrangement pattern of the fifth embodiment illustrated in FIGS. 15A and 15B, and does not include the fifth magneto-resistance element 50e.

It will be described hereinafter that the arrangement pattern illustrated in FIGS. 15A and 15B, from which the fourth and fifth magneto-resistance elements 50d and 50e are removed for example, including the first to third magneto-resistance elements 50a to 50c, and the first to third magnetic flux concentrators 60a to 60c can detect the magnetic fields in two axis directions.

In FIG. 17, when the fourth and fifth magneto-resistance elements 50d and 50e and the output terminals D and E are not present, the magneto-resistances $R_A$, $R_B$, and $R_C$ between the output terminals A and S, between the output terminals B and S, and between the output terminals C and S are obtained, respectively. Now, output signals corresponding amounts of the resistance change depending on the magnitude of the magnetic fields in respective axes are extracted from the magneto-resistances represented in the expressions (11) to (13) so as to obtain the expressions (20) and (22).

From (20), $$2\Delta Ry = -R_A + R_C \text{ is obtained.}$$

From (22), $$2\Delta Rz = -R_A + R_B \text{ is obtained.}$$

As seen above, it can be understood that it is possible to extract output signals in respective axes. It has been described here that the magnetic fields in the two axis directions (the axis direction perpendicular to the substrate and the axis direction parallel to the substrate) can be detected by an example in which the fourth magneto-resistance element 50d among the first to fourth magneto-resistance elements 50a to 50d is removed. However, the similar magnetic fields in the two axis directions can be also detected in the case where any one of the first to third magneto-resistance elements 50a to 50c is removed.

Ninth Embodiment

Figure 20:
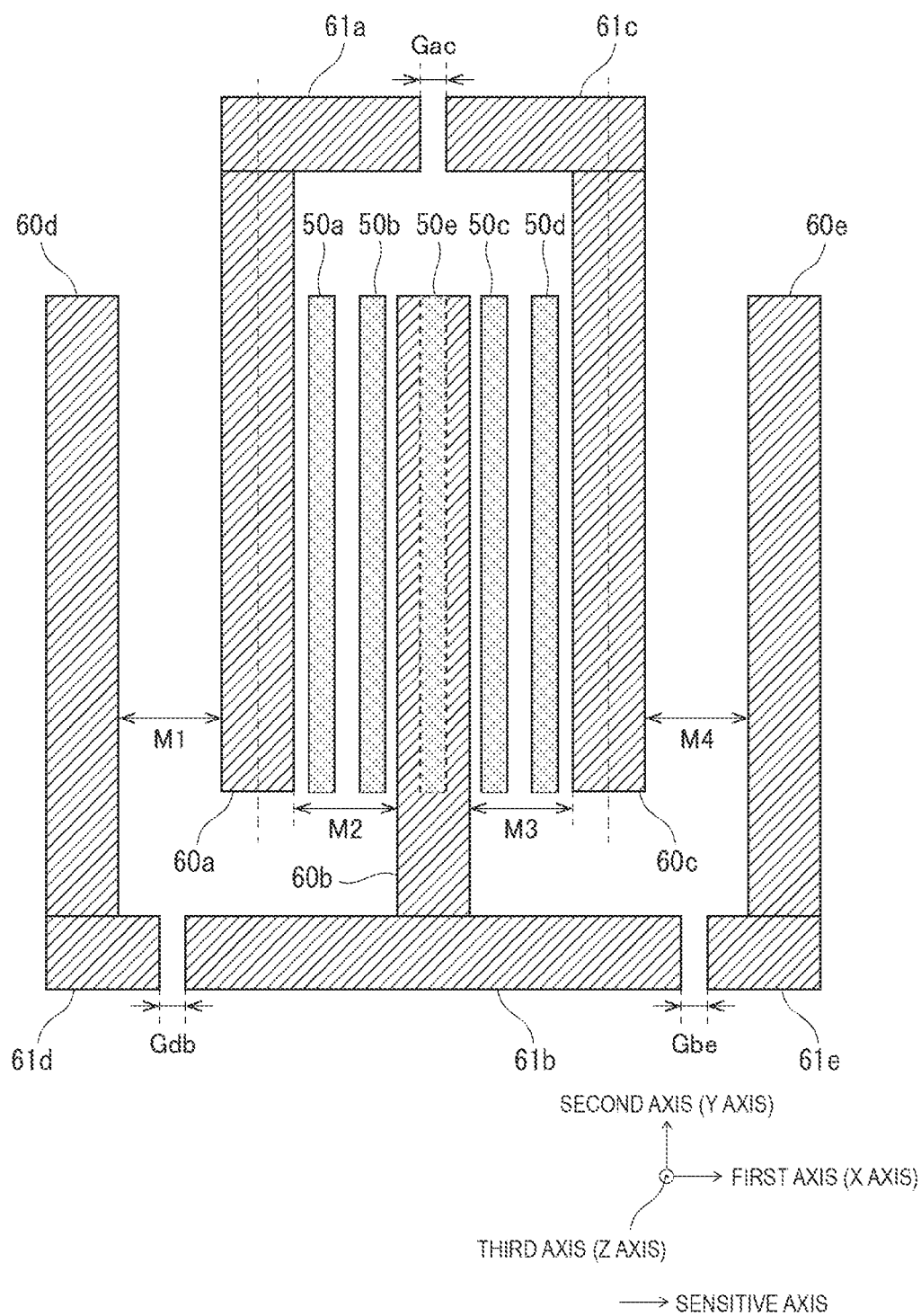
FIG. 20 is a view illustrative of an arrangement pattern of magneto-resistance elements and magnetic flux concentrators in the ninth embodiment.

FIG. 20 is a view illustrative of an arrangement pattern of magneto-resistance elements and magnetic flux concentrators in the ninth embodiment of the magnetic sensor according to the present invention. In the drawing, reference numerals 60d and 60e denote the fourth and fifth magnetic flux concentrators, and reference numerals 61a to 61e denote the first to fifth magnetic flux concentrator plates (magnetic flux concentrator member). In the drawing, the same numerals are assigned to the components having the same functions as those in FIGS. 15A and 15B.

The magnetic sensor of the ninth embodiment further includes the fourth and fifth magnetic flux concentrators 60d and 60e in addition to the arrangement pattern of the fifth embodiment illustrated in FIGS. 15A and 15B.

The fourth magnetic flux concentrator 60d is disposed at the position where the fourth and second magnetic flux concentrators 60d and 60b sandwich the first magnetic flux concentrator 60a. In addition, the fifth magnetic flux concentrator 60e is disposed at the position where the fifth and second magnetic flux concentrators 60e and 60b sandwich the third magnetic flux concentrator 60c. In addition, in the drawing, the first to fifth magnetic flux concentrators 60a to 60e are disposed such that the second magnetic flux concentrator 60b and the fourth and fifth magnetic flux concentrators 60d and 60e project from the first and third magnetic flux concentrators 60a and 60c in the second axis direction. In such a configuration, in addition to the magnetic paths described in the fifth embodiment, a magnetic path in which the magnetic field By in the second axis direction traverses on the substrate plane 70 toward the positive first axis direction from the fourth magnetic flux concentrator 60d projecting in the second direction and passes through the first magnetic flux concentrator 60a, and a magnetic path in which the magnetic field By traverses on the substrate plane 70 toward the negative first direction from the fifth magnetic flux concentrator 60e projecting in the second direction and passes through the third magnetic flux concentrator 60c, are formed.

In addition, the first to fifth magnetic flux concentrators 60a to 60e are disposed to have rectangular shapes, whose longitudinal directions coincide with the second axis direction. An inter-edge distance M1 is a distance between a side of the first magnetic flux concentrator 60a overlapping with the first virtual plane 71 which is the closest to the fourth magnetic flux concentrator 60d, and a side of the fourth magnetic flux concentrator 60d overlapping with the first virtual plane 71 which is the closest to the first magnetic flux concentrator 60a. An inter-edge distance M4 is a distance between a side of the third magnetic flux concentrator 60c overlapping with the first virtual plane 71 which is the closest to the fifth magnetic flux concentrator 60e, and a side of the fifth magnetic flux concentrator 60e overlapping with the first virtual plane 71 which is the closest to the third magnetic flux concentrator 60c. An inter-edge distance M2 (that is, the first inter-edge distance Lab) is a distance between a side of the first magnetic flux concentrator 60a overlapping with the first virtual plane 71 which is the closest to the second magnetic flux concentrator 60b, and a side of the second magnetic flux concentrator 60b overlapping with the first virtual plane 71 which is the closest to the first magnetic flux concentrator 60a. An inter-edge distance M3 (that is, the second inter-edge distance Lbc) is a distance between a side of the second magnetic flux concentrator 60b overlapping with the first virtual plane 71 which is the closest to the third magnetic flux concentrator 60c, and a side of the third magnetic flux concentrator 60c overlapping with the first virtual plane 71 which is the closest to the second magnetic flux concentrator 60b.

The first to fifth magnetic flux concentrators 60a to 60e are disposed such that the inter-edge distance M1, the inter-edge distance M2, the inter-edge distance M3, and the inter-edge distance M4 are substantially equal to one another. More specifically, it is preferable that any three of the four inter-edge distances M1 to M4 be not shorter than 0.7 times and not longer than 1.3 times the other one of M1 to M4. In such a configuration, the magnetic fluxes passing through the first to third magnetic flux concentrators 60a to 60c become substantially even, thus the magnetic field in the first axis direction obtained by converting the magnetic field in the second axis direction can uniformly passing through the first to fourth magneto-resistance elements 50a to 50d. Thus, the magnetic sensor of the fifth embodiment can detect the magnetic field in the second axis direction with high accuracy. In FIG. 20, both of the fourth and fifth magnetic flux concentrators 60d and 60e are disposed, however, any one of concentrators 60d and 60e does not have to be disposed.

Furthermore, the magnetic sensor of the ninth embodiment includes the first to fifth magnetic flux concentrator plates 61a to 61e disposed at the end of the first to fifth magnetic flux concentrators 60a to 60e. The first to fifth magnetic flux concentrators 60a to 60e form T-shapes or L-shapes, in the planar view, when viewed in the third direction.

In addition, the first to fifth magnetic flux concentrator plates 61a to 61e are disposed such that there is a gap Gdb between the second magnetic flux concentrator plate 61b and the fourth magnetic flux concentrator plate 61d, there is a gap Gbe between the second magnetic flux concentrator plate 61b and the fifth magnetic flux concentrator plate 61e, and there is a gap Gac between the first magnetic flux concentrator plate 61a and the third magnetic flux concentrator plate 61c.

In such a configuration, it is possible to inhibit that the magnetic field Bx in the first axis direction is intensely concentrated by the first to fifth magnetic flux concentrator plates 61a to 61e. Thus, a magnetic path uniformly traversing the first to fourth magneto-resistance elements 50a to 50d can be formed. Thus the magnetic sensor of the ninth embodiment can detect the magnetic field in the first axis direction with high accuracy. In addition, a magnetic path in which the magnetic field By in the second axis direction traverses the end of the second magnetic flux concentrator 60b after the second magnetic flux concentrator plate 61b disposed at the end of the second magnetic flux concentrator 60b concentrates the magnetic field By in a wide range, then traverses the first and second magneto-resistance elements 50a and 50b from the second magnetic flux concentrator 60b, and passes through the first magnetic flux concentrator 60a and the first magnetic flux concentrator plate 61a is formed. A magnetic path in which the magnetic field By traverses the third and fourth magneto-resistance elements 50c and 50d from the second magnetic flux concentrator 60b, and passes through the third magnetic flux concentrator 60c and the third magnetic flux concentrator plate 61c is formed. Therefore, the magnetic sensor of the ninth embodiment can detect the magnetic field in the second axis direction with high sensitivity. In addition, the magnetic sensor of the ninth embodiment can concentrates the magnetic field component inputted from the negative side toward the positive side of the second axis and the magnetic field component inputted from the positive side toward the negative side of the second axis at almost the same magnetic flux gain.

As the protruding length of the second magnetic flux concentrator 60b from the first and third magnetic flux concentrators 60a and 60c, the distance between the first magnetic flux concentrator 60a and the second magnetic flux concentrator plate 61b, or the distance between the third magnetic flux concentrator 60c and the second magnetic flux concentrator plate 61b is longer, the magnetic flux concentration is enhanced. It is preferable that the protruding length and these distances be equal to or several times the length in the first axis direction (width) of the magnetic flux concentrator. The other numerical examples are equivalent to those of the ninth embodiment.

In the FIG. 20, the first to fifth magnetic flux concentrators 60a and 60e form T-shapes or L-shapes. However, even if the first to fifth magnetic flux concentrator plates are disposed so as to form Y-shapes, the magnetic sensor of the ninth embodiment can detect the magnetic field in the second axis direction with high sensitivity. In addition, all of the first to fifth magnetic flux concentrator plates 61a to 61e are disposed, however, some of the first to fifth magnetic flux concentrator plates 61a to 61e do not have to be disposed.

The configuration illustrated in FIG. 20 is based on the fifth embodiment, the same configuration can be applied to the sixth to the eighth embodiments.

Tenth Embodiment

Figure 21:
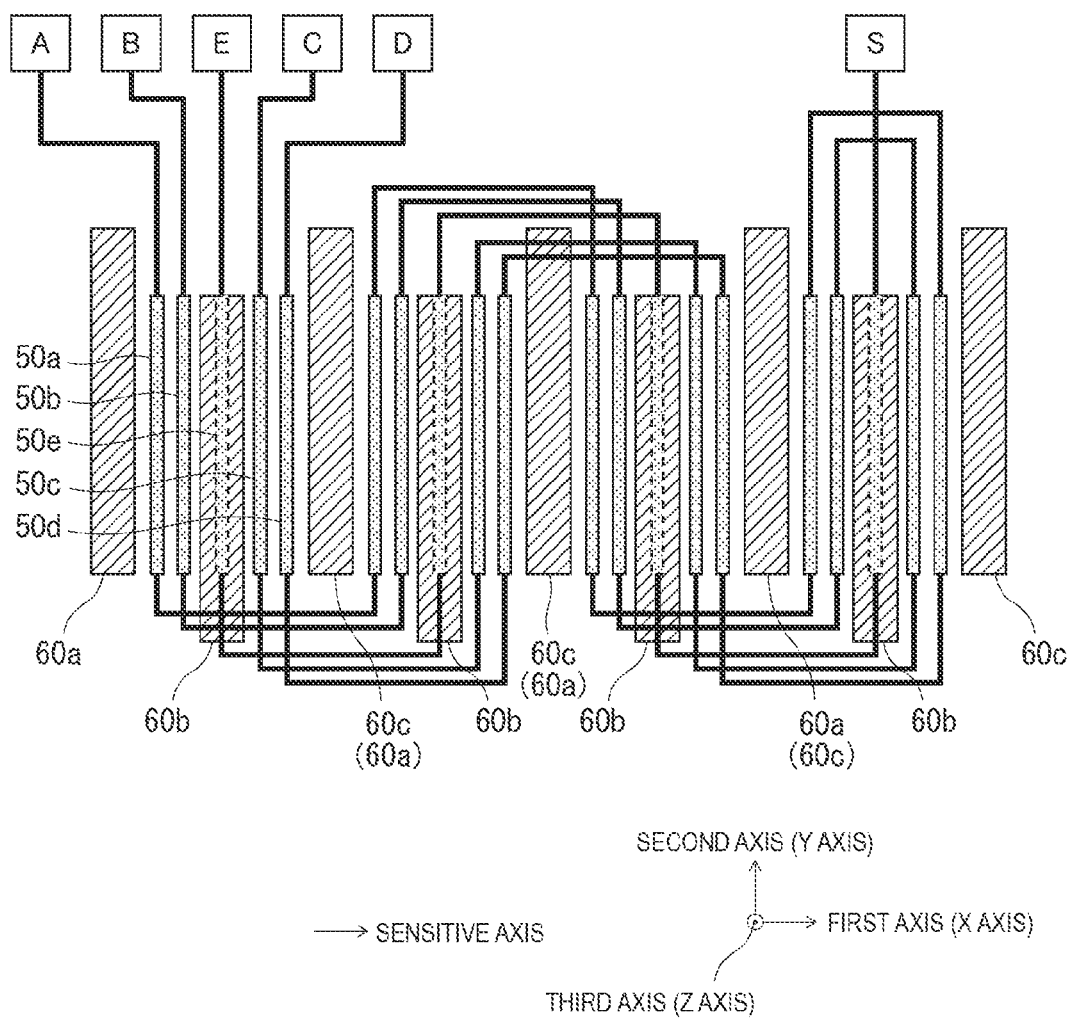
FIG. 21 is a view illustrative of an arrangement pattern of magneto-resistance elements and magnetic flux concentrators in the tenth embodiment.

FIG. 21 is a view illustrative of an arrangement pattern of magneto-resistance elements and magnetic flux concentrators in the tenth embodiment of the magnetic sensor according to the present invention. In the drawing, the same numerals are assigned to the components having the same functions as those in FIGS. 15A, 15B, and 17.

The magnetic sensor of the tenth embodiment has plural arrangement patterns illustrated in FIGS. 15A and 15B.

In the plural arrangement patterns, the third magnetic flux concentrator 60c in each of arrangement patterns serves as the first magnetic flux concentrator 60a in another arrangement pattern in a stage adjacent and subsequent to the each of arrangement patterns. In addition, the first to fifth magneto-resistance elements 50a to 50e in each of arrangement patterns are electrically connected to the first to fifth magneto-resistance elements in another arrangement pattern in a stage adjacent and subsequent to the each of arrangement patterns, respectively.

In FIG. 21, four arrangement patterns are disposed, thus the third magnetic flux concentrators 60c serve as the first magnetic flux concentrators 60a at the three pairs of adjacent arrangement patterns. In addition, each of the first to fifth magneto-resistance elements 50a to 50e has a group of four magneto-resistance elements. In each of the groups, the four magneto-resistance elements are electrically connected with one another in series. The first terminals of the groups of four magneto-resistance elements are electrically coupled to one point, respectively, and then connected to the output terminal S. The second terminals of the groups are connected to the output terminals A, B, C, D and E, respectively.

The magnetic sensor of the tenth embodiment having such a configuration can detect the magnetic fields in the first to third axis directions with higher sensitivity in comparison with the single arrangement pattern. The four magneto-resistance elements of each of the first to fifth magneto-resistance elements 50a to 50e may be electrically connected with one another in parallel, instead of in series. The manner connecting the magneto-resistance elements is not limited to the above-mentioned configuration.

In addition, all the four magneto-resistance elements of each of the first to fifth magneto-resistance elements 50a to 50e are electrically connected with one another, however some of magneto-resistance elements do not have to be electrically connected. In addition, the wirings used for connecting the four magneto-resistance elements of the first to fifth magneto-resistance elements 50a to 50e may be metal wirings, or wirings formed from the same material as the magneto-resistance elements. Both types of wiring can be used in mixture.

The configuration illustrated in FIG. 21 is based on the fifth embodiment, the same configuration can be applied to the sixth to the ninth embodiments.

Figure 22:
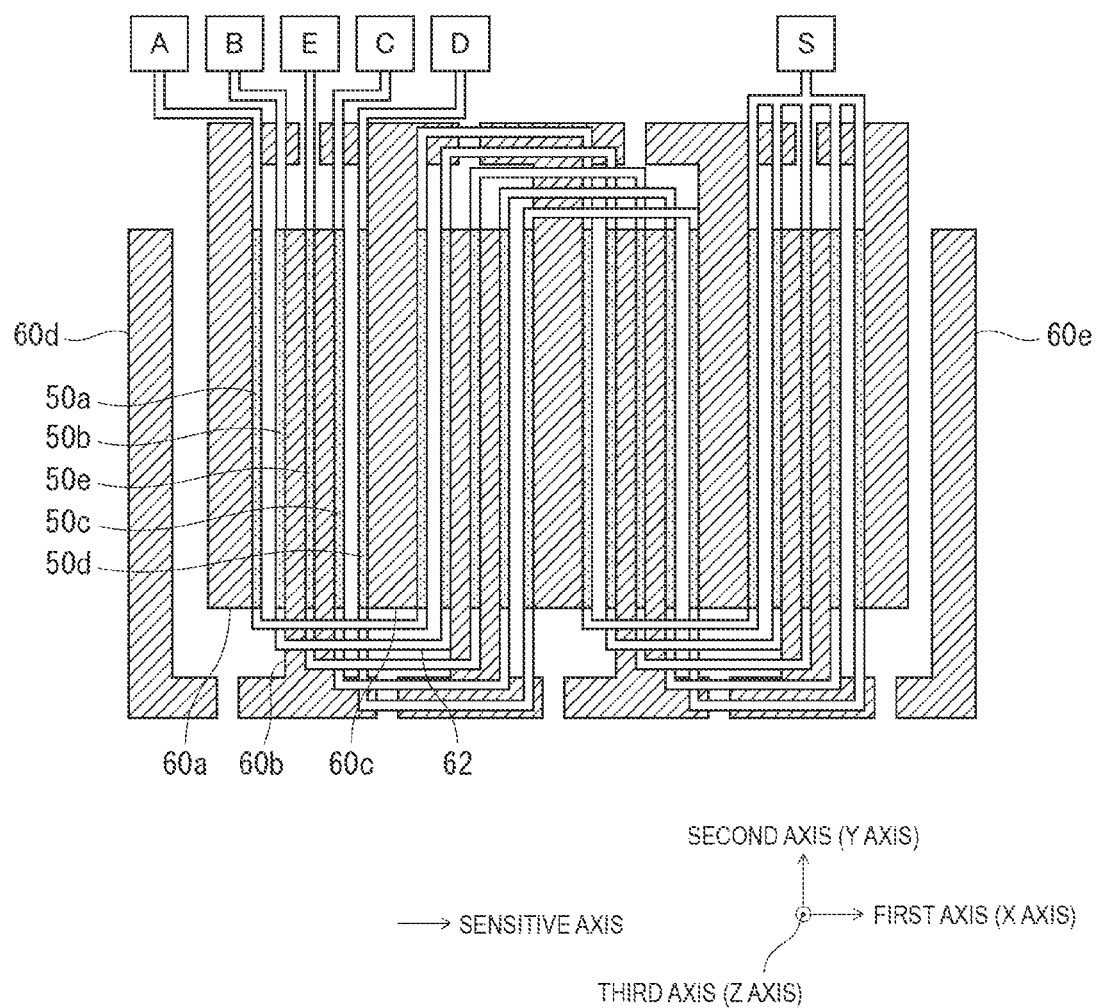
FIG. 22 is a view illustrative of an arrangement pattern of magneto-resistance elements and magnetic flux concentrators when the ninth and tenth embodiments are combined.

FIG. 22 is a view illustrative of an arrangement pattern of magneto-resistance elements and magnetic flux concentrators when the ninth and tenth embodiments are combined. In FIG. 22, four arrangement patterns are disposed, thus the third magnetic flux concentrators 60c serve as the first magnetic flux concentrators 60a at the three pairs of adjacent arrangement patterns. At the left end in the first axis direction, the fourth magnetic flux concentrator 60d is disposed at the position where the fourth and second magnetic flux concentrators 60d and 60b sandwich the first magnetic flux concentrator 60a. In addition, at the right end in the first axis direction, the fifth magnetic flux concentrator 60e is disposed at the position where the fifth and second magnetic flux concentrators 60e and 60b sandwich the third magnetic flux concentrator 60c.

In addition, the first to fifth magnetic flux concentrator plates 61a to 61e are disposed at the end of the first to fifth magnetic flux concentrators 60a to 60e. The first to fifth magnetic flux concentrators 60a to 60e form T-shapes or L-shapes, in the planar view, when viewed in the third direction. In addition, each of the first to fifth magneto-resistance elements 50a to 50e has a group of four magneto-resistance elements. In each of the groups, the four magneto-resistance elements are electrically connected with one another in series. The first terminals of the groups of four magneto-resistance elements are electrically coupled to one point, respectively, and then connected to the output terminal S. The second terminals of the groups are connected to the output terminals A, B, C, D and E, respectively. In such a configuration, the magnetic fields in the two axes or three axes can be detected with high sensitivity and high accuracy.

Additionally, in the tenth embodiment, no magneto-resistance element is disposed in the sections where the plural arrangement patterns do not overlap with each other, that is, in the vicinities of the fourth and fifth magnetic flux concentrators 60d and 60e in FIG. 22. The magnetic field distributions at the vicinities of the fourth and fifth magnetic flux concentrators 60d and 60e disposed at the left and right ends in the first axis direction of the plural arrangement patterns, respectively, are different from the magnetic field distribution at the inner portion of the plural arrangement pattern. For example, magnetic fields in the first and second axis directions at the vicinities of the fourth and fifth magnetic flux concentrators 60d and 60e are larger than those at the inner portion. Therefore, when no magneto-resistance element is disposed at the vicinities of the magnetic flux concentrators disposed at the both ends in the first axis direction of the plural arrangement patterns, it is possible to apply a substantially even magnetic field to each of magneto-resistance elements.

Modification of Tenth Embodiment

Figure 23:
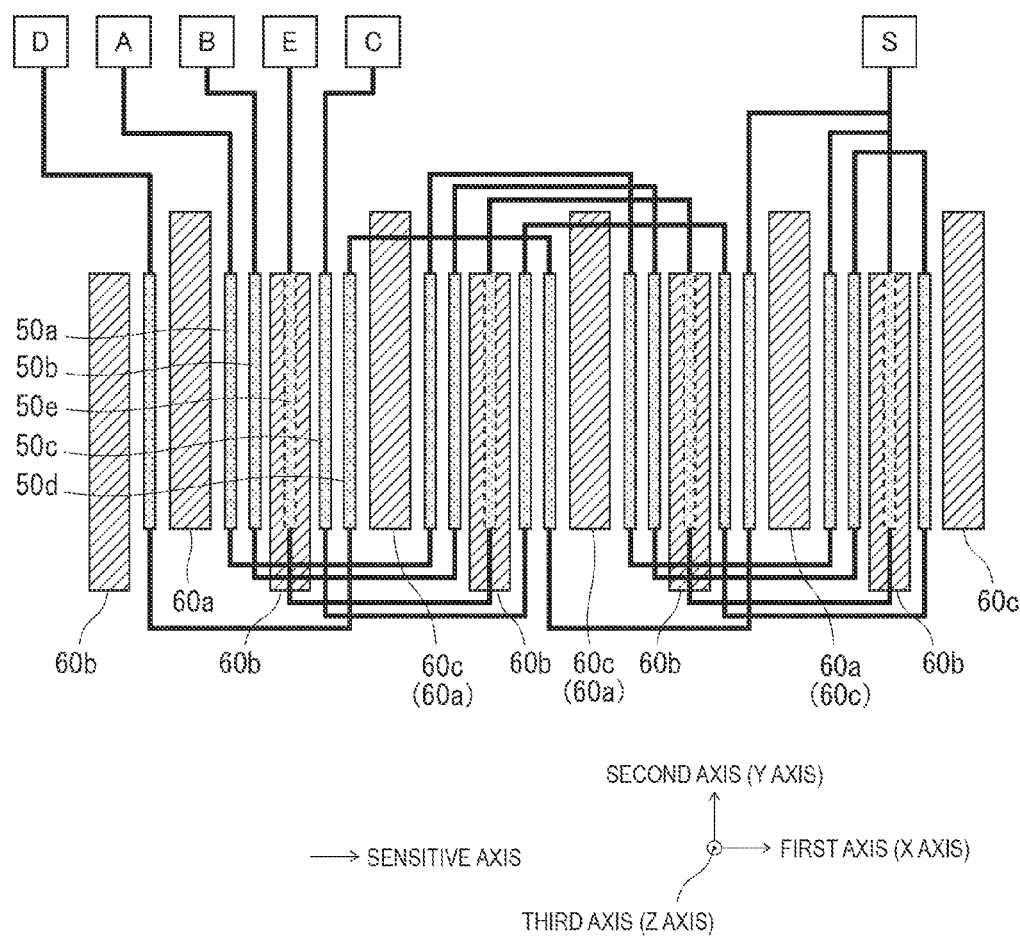
FIG. 23 is a view illustrative of an arrangement pattern of magneto-resistance elements and magnetic flux concentrators in the modification of the tenth embodiment.

FIG. 23 is a view illustrative of the modification of the magnetic sensor of the tenth embodiment, and of an arrangement pattern of magneto-resistance elements and magnetic flux concentrators. In the drawing, the same numerals are assigned to the components having the same functions as those in FIGS. 15A, 15B, and 17.

The magnetic sensor of the modification of the tenth embodiment includes the plural arrangement patterns illustrated in FIGS. 15A and 15B, similarly to FIG. 21.

In FIG. 23, four arrangement patterns are disposed from the right end in the first axis direction, each of the arrangement patterns including three or more magneto-resistance elements, thus the third magnetic flux concentrators 60c serve as the first magnetic flux concentrators 60a at the three pairs of adjacent arrangement patterns. The magnetic sensor include, the fourth magneto-resistance element 50d and the second magnetic flux concentrator 60b at the left end in the first axis direction, in addition to the four arrangement patterns.

From another viewpoint, the first and third magnetic flux concentrators 60a and 60c can be perceived as projecting from the second magnetic flux concentrator 60b in the second axis direction. Therefore, the magnetic sensor can be perceived as being configured such that four arrangement patterns is disposed from the left end in the first axis direction, each of the four arrangement patterns includes three or more magneto-resistance elements, and the third magneto-resistance element 50c and the third magnetic flux concentrator 60c are added at the right end in the first axis direction. From either viewpoint, each of the first to fifth magneto-resistance elements 50a to 50e has a group of four magneto-resistance elements, and in each of the groups, the four magneto-resistance elements are electrically connected with one another in series.

The major difference between FIG. 21 and FIG. 23 is whether or not the number of the second magnetic flux concentrators 60b is equal to the number of the first magnetic flux concentrators 60a or the third magnetic flux concentrators 60c. In FIG. 21, both numbers are not equal, In FIG. 23, both numbers are equal. Such a modification does not change the essence of the invention and can detect the magnetic fields in two or three axes.

Eleventh Embodiment

FIG. 24A and FIG. 24B are views illustrative of the eleventh embodiment of the magnetic sensor according to the present invention, and are views illustrative of the function of the gaps in the magnetic sensor of the tenth embodiment illustrated in FIG. 22, having the plural arrangement patterns.

In the configuration of the magnetic sensor used in FIG. 24A, seven arrangement patterns are repeatedly disposed, each adjacent ones of the first to fifth magnetic flux concentrator plates 61a to 61e are not separated from each other and have no gap. Specifically, the first magnetic flux concentrator plate 61a is connected to the third magnetic flux concentrator plate 61c (that is, Gac=0), and the fourth magnetic flux concentrator plate 61d is connected to the second magnetic flux concentrator plate 61b (that is, Gdb=0), and the second magnetic flux concentrator plate 61b is connected to the fifth magnetic flux concentrator plate 61e (that is, Gbe=0).

It is assumed that the thickness of each of the first to third magnetic flux concentrators 60a to 60c in the third axis direction is 5 μm. It is assumed that the width of each of the first to third magnetic flux concentrators 60a to 60c in the first axis direction is 4 μm. It is assumed that the first and second inter-edge distances Lab and Lbc are 6 μm. It is assumed that the distance between the first virtual plane 71 and the second virtual plane 72 is 0.5 μm, regardless of the thickness of each of the first to fifth magneto-resistance elements 50a to 50e.

In the configuration of the magnetic sensor used in FIG. 24B, each adjacent ones of the first to fifth magnetic flux concentrator plates 61a to 61e are separated from each other and have gaps (Gac, Gdb, and Gbe=2 μm). It is assumed that thickness of each of the first to third magnetic flux concentrators 60a to 60c in the third axis direction, the width of each of the first to third magnetic flux concentrators 60a to 60c in the third axis direction, the first and second inter-edge distances Lab and Lbc, and the distance between the first virtual plane 71 and the second virtual plane 72 are the same as those of the magnetic sensor used in FIG. 24A.

In FIGS. 24A and 24B, magnetic flux gains when the magnetic field is applied to the magnetic sensor in the first axis direction (that is, the sensitive axis direction) are plotted, which is calculated by the magnetic field numerical analysis based on the integral element method. The magnetic flux gains are obtained by dividing the magnetic field components in the first axis direction at respective positions on a line extending in the first axis direction on the second virtual plane 72 and passing the center of the magnetic sensor when viewed in the third axis direction, by the input of the magnetic field in the first axis direction.

In FIG. 24A, the uniformity of the spatial distribution of the magnetic flux gains along the first axis direction is poor in comparison with FIG. 24B. In FIG. 24B, the uniformity of the spatial distribution of the magnetic flux gains along the first axis direction is improved.

In FIG. 24A, the magnetic fluxes intensely pass through the first to fifth magnetic flux concentrator plates 61a to 61e with no gap, thus the magnetic fluxes cannot sufficiently enter into the first to third magnetic flux concentrators 60a to 60c disposed at inner portion of the sensor structure. Therefore, the values of the magnetic flux gains in the first axis direction at the positions of the first to fourth magneto-resistance elements 50a to 50d become low.

In FIG. 24B, when the first to fifth magnetic flux concentrator plates 61a to 61e have gaps, thus the magnetic flux flows are impeded at the gaps. Therefore, the magnetic fluxes flowing into the magnetic sensor are not concentrated and are distributed. In addition, through the effect of such a distribution, the uniformity of the spatial distribution of the magnetic flux gains along the second axis direction is also improved.

In this manner, by providing gaps among the first to fifth magnetic flux concentrator plates 61a to 61e so as to increase the impedance of the magnetic flux flow sufficiently and to form a more uniform magnetic field distribution in the space inside the sensor, it is possible to improve the uniformity of the spatial distributions of the magnetic flux gains along the first and second axis directions at the positions of the first to fifth magneto-resistance elements 50a to 50e on the second virtual plane 72.

In the magnetic field numerical analysis, improvement in the uniformity of the spatial distributions of the magnetic flux gains is found when the length (Gac, Gdb, and Gbe) of the gaps is 0.5 µm, as is in the case of 2 µm. Thus, the length of the gap can be reduced up to the processing limit of the magnetic flux concentrator. However, it is preferable that the length of the gap be almost equal to or less than the length in the first axis direction (width) of the second magnetic flux concentrators 60b, practically.

Twelfth Embodiment

Figure 25A:
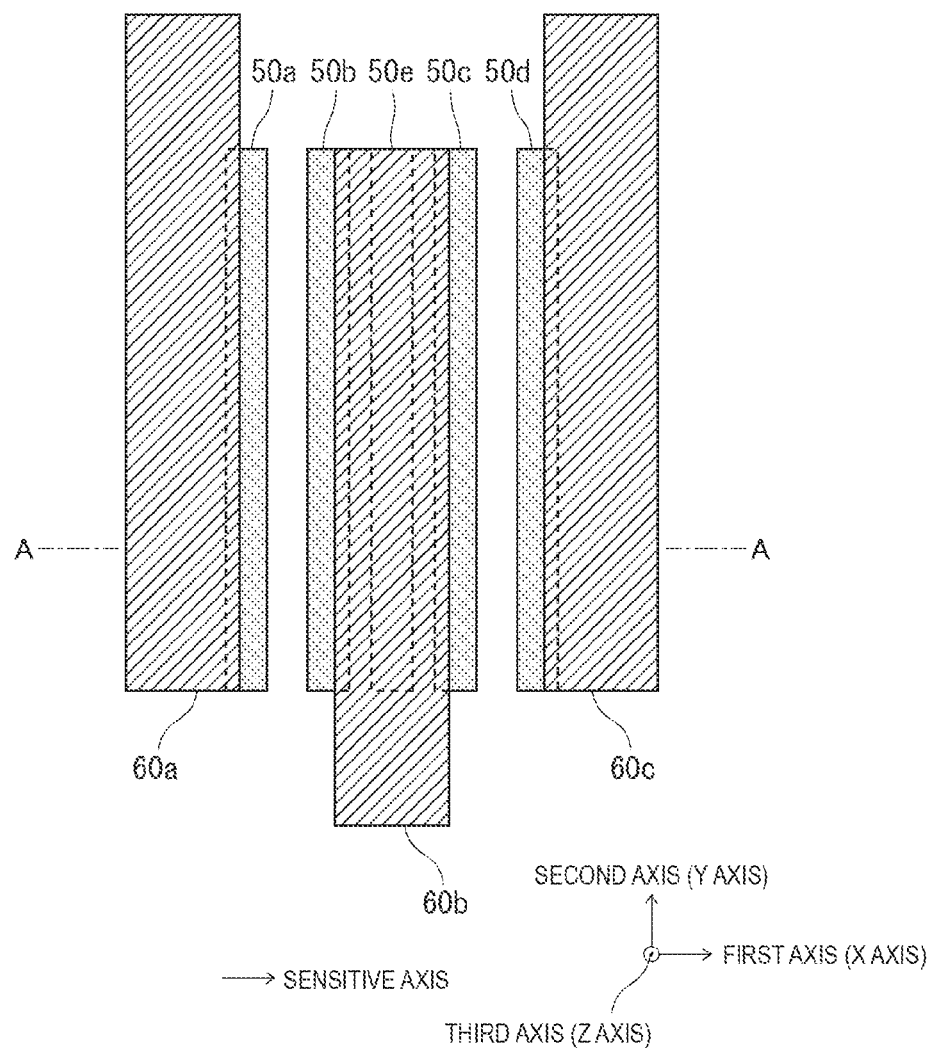
FIG. 25A and FIG. 25B are views illustrative of an arrangement pattern of magneto-resistance elements and magnetic flux concentrators in the twelfth embodiment.
Figure 25B:
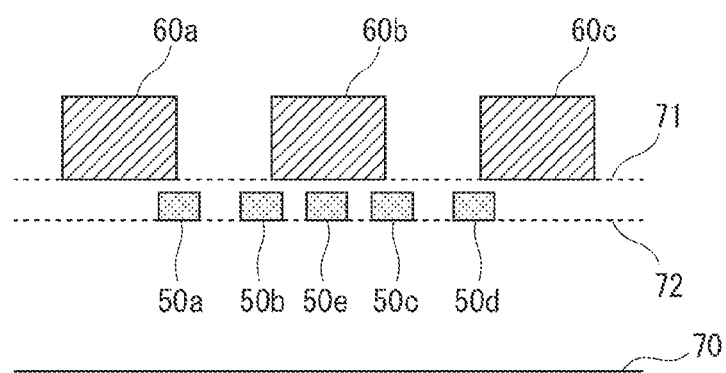

FIG. 25A and FIG. 25B are views illustrative of an arrangement pattern of magneto-resistance elements and magnetic flux concentrators in the twelfth embodiment of the magnetic sensor according to the present invention. FIGS. 25A and 25B indicate the same structural unit as illustrated in FIGS. 8A and 8B. In the drawing, the same numerals are assigned to the components having the same functions as those in FIGS. 15A and 15B. FIG. 25A is a top view when viewed in the third direction, and FIG. 25B is a cross-sectional view cut along A-A line in FIG. 25A. In the drawings, a reference numeral 71 denotes the first virtual plane 71 and the second virtual plane 72.

In the magnetic sensor of the twelfth embodiment, the first to third magnetic flux concentrators 60a to 60c are disposed on the first virtual plane 71 parallel to the substrate plane 70, and the first to fifth magneto-resistance elements 50a to 50e are disposed on the second virtual plane 72 parallel to the substrate plane 70.

The arrangement pattern in FIGS. 15A and 15B is configured such that a part extending in the short side direction (the first axis direction) of each of the first to fourth magneto-resistance elements 50a to 50d does not overlap with a part extending in the short side direction (the first axis direction) of any of the first to third magnetic flux concentrators 60a to 60c, along the long side direction (the second axis direction) of the first to fourth magneto-resistance elements 50a to 50d.

On the other hand, the arrangement pattern in FIGS. 25A and 25B, the part extending in the short side direction (the first axis direction) of each of the first to fourth magneto-resistance elements 50a to 50d overlaps with the part extending in the short side direction (the first axis direction) of any of the first to third magnetic flux concentrators 60a to 60c, along the long side direction (the second axis direction) of the first to fourth magneto-resistance elements 50a to 50d.

That is, the part of the first magneto-resistance element 50a, which is extending to the first magnetic flux concentrator 60a in the short side direction (the first axis direction), is covered with the first magnetic flux concentrator 60a along the long side direction (the second axis direction) of the first magneto-resistance element 50a. In addition, the part of second magneto-resistance element 50b, which is extending to the second magnetic flux concentrator 60b in the short side direction (the first axis direction), is covered with the second magnetic flux concentrator 60b along the long side direction (the second axis direction) of the second magneto-resistance element 50b. The part of third magneto-resistance element 50c, which is extending to the second magnetic flux concentrator 60b in the short side direction (the first axis direction), is covered with the second magnetic flux concentrator 60b along the long side direction (the second axis direction) of the third magneto-resistance element 50c. The part of fourth magneto-resistance element 50d, which is extending to the third magnetic flux concentrator 60c in the short side direction (the first axis direction), is covered with the third magnetic flux concentrator 60c along the long side direction (the second axis direction) of the fourth magneto-resistance element 50d.

When a value OL is defined as a value obtained by normalizing the length in the first axis direction of the overlapping portion between the magneto-resistance element and the magnetic flux concentrator adjacent thereto in a planar view when viewed in the third axis direction, by the length in the first axis direction (width) of the magneto-resistance element, OL in FIGS. 25A and 25B is represented as a positive value. When there is no overlapping portion and no gap between the first magneto-resistance element 50a and the first magnetic flux concentrator 60a, OL=0.

In the case where OL>0 as illustrated in FIGS. 25A and 25B, in comparison with the case where OL=0, the magnetic field component in the first axis direction becomes large on the magnetic field sensitive surface of the magneto-resistance element having a sensitive axis in the first axis direction. Thus the amounts of the resistance change ΔRx, ΔRy and ΔRz, depending on the magnitude of the magnetic field components of three axes can be detected with higher sensitivity. In addition, when the length in the first axis direction of the magneto-resistance element varies, there is an effect of suppressing the variation in the magnetic field component in the first axis direction on the magnetic field sensitive surface of the magneto-resistance element, thus there is an effect of suppressing the variation in the amounts of the resistance change ΔRx, ΔRy and ΔRz depending on the magnitude of the magnetic field components of three axes.

The preferable example of the value OL will be described hereinafter. In the assumed configuration, the length of the first to third magnetic flux concentrators 60a to 60c in the short side direction (the width of the rectangular shape) along the first axis direction is 6 µm to 12 µm, the first and second inter-edge distances Lab and Lbc corresponding to the space between the magnetic flux concentrators are 1 to 2 times the length of the first to third magnetic flux concentrators 60a to 60c in the short side direction (the width of the rectangular shape) along the first axis direction, the thickness of the magnetic flux concentrators is 5 μm to 15 μm, the length of the shape of the magneto-resistance elements in the first axis direction (the width of the plate) is 1 μm to 4 μm, the distance in the third axis direction between the first virtual plane 71 corresponding to the bottom faces of the magnetic flux concentrators having the thickness and the second virtual plane 72 on which the tabular magneto-resistance elements are located is 0.25 μm to 0.5 μm.

In the above case, an example of the preferable value of OL is ⅕ to ½. It was confirmed by the magnetic field numerical analysis based on the integral element method that, when OL was within such a range and the width of the magneto-resistance elements was 1 μm, the sensitivity to the magnetic field in the third axis direction was improved by 5 percent, and when the width of the magneto-resistance elements was 4 μm, the sensitivity was improved by 15 percent, in comparison with the case where OL=0.

Thirteenth Embodiment

In the fifth to eleventh embodiments, an example of the preferable value of the length of the shape of the first to third magnetic flux concentrators 60a to 60c in the first axis direction (the width of the rectangular shape) is 6 μm to 18 μm. In addition, an example of the preferable first and second inter-edge distances Lab and Lbc corresponding to the space between the magnetic flux concentrators is 1 to 4 times the length of the first to third magnetic flux concentrators 60a to 60c in the first axis direction. In addition, an example of the preferable value of the thickness of the first to third magnetic flux concentrators 60a to 60c in the third axis direction is 5 μm to 15 μm.

An example of the preferable value of the distance between the first virtual plane 71 and the second virtual plane 72 is about 0.1 μm to 1 μm. In the combination of the above examples, it is confirmed by the magnetic field numerical analysis based on the integral element method that, the magnetic conversion ratio ($B_{OX}/B_{IX}$) in the first axis direction is obtained to be about 0.1 to 3, the magnetic conversion ratio ($B_{OX}/B_{IX}$) being a ratio of the magnetic field ($B_{OX}$) to the magnetic field ($B_{IX}$), the magnetic field ($B_{IX}$) being a magnetic field in the first axis direction, the magnetic field ($B_{OX}$) being a magnetic field in the first axis direction which is converted from the magnetic field ($B_{IX}$) by the magnetic flux concentrators and passes through each of the magnetic field sensitive surfaces of the first to fourth magneto-resistance elements 50a to 50d. In addition, it is confirmed by the magnetic field numerical analysis based on the integral element method that, the magnetic conversion ratio ($B_{OY}/B_{IY}$) in the second axis direction is obtained to be about 0.1 to 3, the magnetic conversion ratio ($B_{OY}/B_{IY}$) being a ratio of the magnetic field ($B_{OY}$) to the magnetic field ($B_{IY}$), the magnetic field ($B_{IY}$) being a magnetic field in the second axis direction, the magnetic field ($B_{OY}$) being a magnetic field in the first axis direction which is converted from the magnetic field ($B_{IY}$) by the magnetic flux concentrators and passes through each of the magnetic field sensitive surfaces of the first to fourth magneto-resistance elements 50a to 50d. In addition, it is confirmed by the magnetic field numerical analysis based on the integral element method that, the magnetic conversion ratio ($B_{OX}/B_{IZ}$) in the third axis direction is obtained to be about 0.1 to 3, the magnetic conversion ratio ($B_{OX}/B_{IZ}$) being a ratio of the magnetic field ($B_{OX}$) to the magnetic field ($B_{IZ}$), the magnetic field ($B_{IZ}$) being a magnetic field in the third axis direction, the magnetic field ($B_{OX}$) being a magnetic field in the first axis direction which is converted from the magnetic field ($B_{IZ}$) by the magnetic flux concentrators and passes through each of the magnetic field sensitive surfaces of the first to fourth magneto-resistance elements 50a to 50d.

As mentioned above, the fifth to thirteenth embodiments can detect magnetic fields in the two or three axis directions on a substrate while suppressing the increase in current consumption. That is, it is possible to achieve a small magnetic sensor using magneto-resistance elements having a sensitive axis in one direction capable of suppressing the increase in current consumption.

(Magnetic Detecting Method)

Next, an example of the magnetic detecting method using the magnetic sensors of the fifth to thirteenth embodiments will be described.

In one magnetic detecting method using the magnetic sensors of the fifth to thirteenth embodiments, the magnetic field components in the two axis directions are detected on the basis of outputs ($R_A$ to $R_C$) from the first and second magneto-resistance elements sandwiched by the first and second magnetic flux concentrators and from the third magneto-resistance element sandwiched by the second and third magnetic flux concentrators.

The first to third magneto-resistance elements have a sensitive axis in an identical direction. The magnetic field component ($2\Delta Ry$) in the second axis direction (Y axis) is calculated on the basis of a value based on the output ($R_A=R+\Delta Rx-\Delta Ry-\Delta Rz$) from the first magneto-resistance element and a value based on the output ($R_C=R+\Delta Rx+\Delta Ry-\Delta Rz$) from the third magneto-resistance element. The magnetic field component ($2\Delta Rz$) in the third axis direction (Z axis) is calculated on the basis of a value based on the output ($R_A=R+\Delta Rx-\Delta Ry-\Delta Rz$) from the first magneto-resistance element and a value based on the output ($R_B=R+\Delta Rx-\Delta Ry+\Delta Rz$) from the second magneto-resistance element.

Additionally, in another magnetic detecting method using the magnetic sensors of the fifth to thirteenth embodiments, the magnetic field components of the three axis directions are detected on the basis of outputs from the first to third magneto-resistance elements described above and an output from the fifth magneto-resistance element covered with the magnetic flux concentrator.

The first to third magneto-resistance elements, and the fifth magneto-resistance element have a sensitive axis in an identical direction. In addition to the above-mentioned calculation of the magnetic field components in the second and third axis directions, the magnetic field component ($2\Delta Rx$) in the first axis direction (X axis) is calculated on the basis of the output ($R_B=R+\Delta Rx-\Delta Ry+\Delta Rz$) from the second magneto-resistance element, the output ($R_C=R+\Delta Rx+\Delta Ry-\Delta Rz$) from the third magneto-resistance element, and the output ($R_E=R$) from the fifth magneto-resistance element.

Additionally, in still another magnetic detecting method using the magnetic sensors of the fifth to thirteenth embodiments, the magnetic field components of the two axis directions are detected on the basis of outputs ($R_A$ to $R_D$) from the first and second magneto-resistance elements sandwiched by the first and second magnetic flux concentrators and from the third and fourth magneto-resistance elements sandwiched by the second and third magnetic flux concentrators.

The magnetic field component ($4\Delta Ry$) in the second axis direction (Y axis) is calculated on the basis of a value ($R_C+R_D-(R_A+R_B)$) obtained by subtracting the sum ($R_A+R_B$) of values on the basis of the outputs ($R_A$, $R_B$) from the first and second magneto-resistance elements from the sum ($R_C+R_D$) of values based on the outputs ($R_C$, $R_D$) from the third and fourth magneto-resistance elements. The magnetic field component ($4\Delta Rz$) in the third axis direction (Z axis) is calculated on the basis of a value ($R_B+R_D-(R_A+R_C)$) obtained by subtracting the sum ($R_A+R_C$) of values on the basis of the outputs ($R_A$, $R_C$) from the first and third magneto-resistance elements from the sum ($R_B+R_D$) of values on the basis of the outputs ($R_B$, $R_D$) from the second and fourth magneto-resistance elements.

Alternatively, the magnetic field component ($2\Delta Ry$) in the second axis direction (Y axis) may be calculated on the basis of the output ($R_A=R+\Delta Rx-\Delta Ry-\Delta Rz$) of the first magneto-resistance element and the output ($R_C=R+\Delta Rx+\Delta Ry-\Delta Rz$) of the third magneto-resistance element, and the magnetic field component ($2\Delta Rz$) in the third axis direction (Z axis) may be calculated on the basis of the output ($R_A=R+\Delta Rx-\Delta Ry-\Delta Rz$) of the first magneto-resistance element and the output ($R_B=R+\Delta Rx-\Delta Ry+\Delta Rz$) of the second magneto-resistance element.

Additionally, in yet another magnetic detecting method using the magnetic sensors of the fifth to thirteenth embodiments, the magnetic field components of the three axis directions are detected on the basis of outputs from the first to fourth magneto-resistance elements described above and an output from the fifth magneto-resistance element covered by the magnetic flux concentrator.

The first to fifth magneto-resistance elements have a sensitive axis in an identical direction. In addition to the above-mentioned calculation of the magnetic field components in the second and third axis directions, the magnetic field component ($4\Delta Rx$) in the first axis direction (X axis) is calculated on the basis of a total sum ($R_A+R_B+R_C+R_D$) of signals on the basis of the outputs ($R_A$, $R_B$, $R_C$, $R_D$) from the first to fourth magneto-resistance elements, the signals being obtained by subtracting a value on the basis of the output ($R_E$) from the fifth magneto-resistance element from the respective values on the basis of the outputs from the first to fourth magneto-resistance elements. In short, in the magnetic detecting methods described above, the magnetic field components of the respective axis directions are obtained by solving the simultaneous equations with respect to resistances.

In addition, the second axis direction (Y axis) is perpendicular to the sensitive axes of the first to fifth magneto-resistance elements and parallel to the substrate plane. The third axis direction (Z axis) is perpendicular to the substrate plane. The first axis direction (X axis) is the direction of the sensitive axes of the first to fifth magneto-resistance elements.

As seen above, the magnetic detecting method using the magnetic sensors of the fifth to thirteenth embodiments can detect magnetic fields in the two or three axis directions on a substrate with high resolution while suppressing the increase in current consumption. In addition, it is possible to achieve a magnetic detecting method through a small magnetic sensor using magneto-resistance elements having a sensitive axis in one direction.

Fourteenth Embodiment

Figure 26:
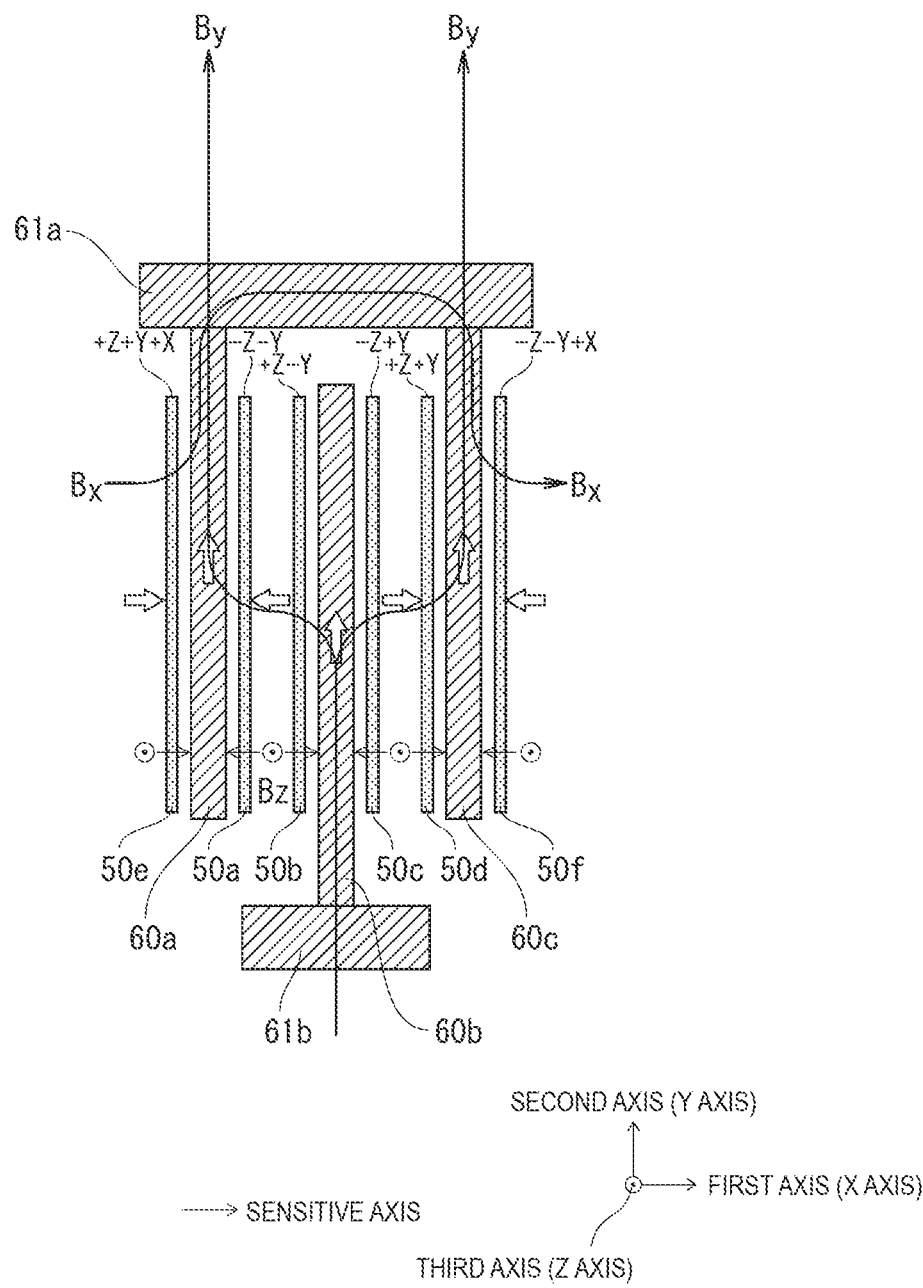
FIG. 26 is a view illustrative of an arrangement pattern of magneto-resistance elements and magnetic flux concentrators in the fourteenth embodiment.

FIG. 26 is a view illustrative of an arrangement pattern of magneto-resistance elements and magnetic flux concentrators in the fourteenth embodiment of the magnetic sensor according to the present invention, and a view illustrative of the structure of the magnetic sensor of the fourteenth embodiment in the planar view.

The magnetic sensor of the fourteenth embodiment has a configuration obtained by removing the fifth magneto-resistance element 50e from the magnetic sensor illustrated in FIGS. 15A and 15B. The fifth magneto-resistance element 50e is further disposed on the left side of the first magnetic flux concentrator 60a in the first axis direction, and the sixth magneto-resistance element 50f is further disposed on the right side of the third magnetic flux concentrator 60c in the first axis direction. The ends of the first and third magnetic flux concentrators 60a and 60c are connected via the magnetic flux concentrator plate 61a.

When the magnetic field Bx in the first axis direction is inputted to the magnetic sensor of the fourteenth embodiment, the magnetic field Bx in the first axis direction is inputted to the fifth magneto-resistance element 50e, thus, the resistance changes by $\Delta Rx$. Then the magnetic field Bx in the first axis direction is inputted to the first magnetic flux concentrator 60a, and is curved to the second axis direction by the magnetic flux concentrator plate 61a connected to the third magnetic flux concentrator 60c. The curved magnetic field passes through the magnetic flux concentrator plate 61a and is outputted from the third magnetic flux concentrator 60c in the first axis direction. The magnetic field outputted from the third magnetic flux concentrator 60c is inputted to the sixth magneto-resistance element 50f. The resistance of the sixth magneto-resistance element 50f changes by $\Delta Rx$. As seen above, by the magnetic flux concentrator plate 61a connecting the first and third magnetic flux concentrators 60a and 60c, the first to fourth magneto-resistance elements 50a to 50d are shielded from the magnetic field Bx in the first axis direction. Thus, the magnetic field Bx is inputted to only the fifth and sixth magneto-resistance elements 50e and 50f.

When the magnetic field By in the second axis direction is inputted, according to the similar principle as the embodiments described above, the magnetic field By in the second axis direction is inputted to the first to fourth magneto-resistance elements 50a to 50d, the resistances of the first and second magneto-resistance elements 50a and 50b change by $-\Delta Ry$, the resistances of the third and fourth magneto-resistance elements 50c and 50d change by $\Delta Ry$.

The magnetic field By in the second axis direction is curved by the first magnetic flux concentrator 60a, a magnetic field is inputted to the fifth magneto-resistance element 50e in the same direction as those of the magnetic fields inputted to the third and fourth magneto-resistance elements 50c and 50d. Therefore, the resistance of the fifth magneto-resistance element 50e changes by $\Delta Ry$. On the other hand, the magnetic field By in the second axis direction is inputted to the sixth magneto-resistance element 50f by the third magnetic flux concentrator 60c, in the same direction as those of the magnetic field By inputted to the first and the second magneto-resistance elements 50a and 50b. Therefore, the resistance of the sixth magneto-resistance element 50f changes by $-\Delta Ry$.

Also when the magnetic field Bz in the third axis direction is inputted, according to the similar principle as the embodiments described above, the resistances of the first and third magneto-resistance elements 50a and 50c change by $-\Delta Rz$, the resistances of the second and fourth magneto-resistance elements 50b and 50d change by $\Delta Rz$. The magnetic field in the third axis direction is inputted to the fifth magneto-resistance element 50e by the first magnetic flux concentrator 60a, in the same direction as those of the magnetic field in the third axis direction inputted to the second and the fourth magneto-resistance elements 50b and 50d. Then, the resistance of the fifth magneto-resistance element 50e changes by $\Delta Rz$. The magnetic field in the third axis direction is inputted to the sixth magneto-resistance element 50f by the third magnetic flux concentrator 60c, in the same direction as those of the magnetic field in the third axis direction inputted to the first and third magneto-resistance elements 50a and 50c. Then, the resistance of the sixth magneto-resistance element 50f changes by −ΔRz.

Figure 27:
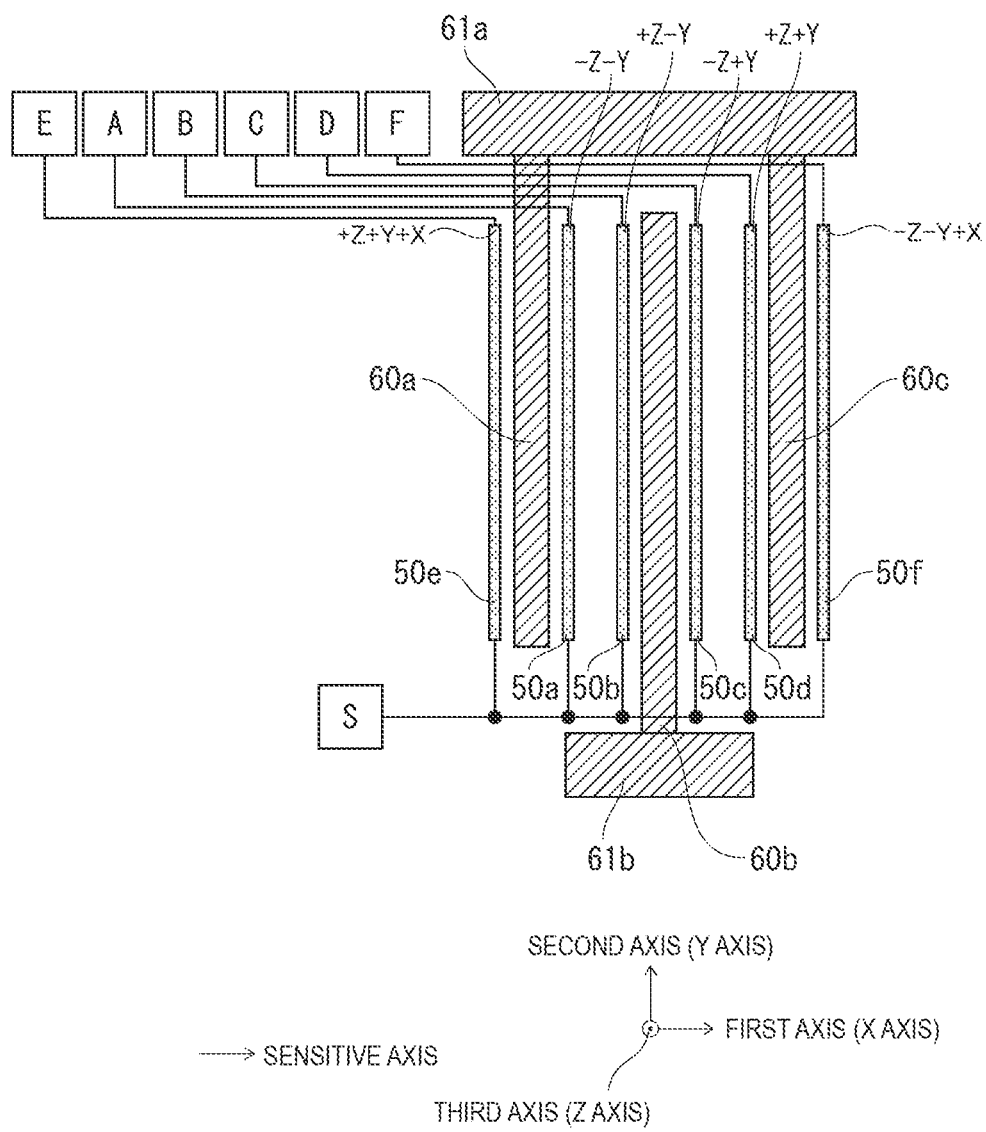
FIG. 27 is a view illustrative of wirings for extracting output signals of the magnetic sensor illustrated in FIG. 26.

FIG. 27 is a view illustrative of wirings for extracting output signals of the magnetic sensor illustrated in FIG. 26. The first terminals of the first to sixth magneto-resistance elements 50a to 50f are electrically connected to the terminal S, and the second terminals of the magneto-resistance elements 50a to 50f are electrically connected to the terminals A to F, respectively. Now, by connecting the terminal S to the ground and connecting the terminals A to F to the current sources so as to flow predetermined currents to the first to sixth magneto-resistance elements 50a to 50f, it is possible to extract the signals indicate the mixed magnetic field components of the three axis from the terminals A to F.

Next, the method for extracting the signals of the magnetic field components of the respective axes from the magneto-resistance elements will be described. When the magnetic field Bx in the first axis direction, the magnetic field By in the second axis direction, and the magnetic field Bz in the third axis direction are applied to the magnetic sensor of the fourteenth embodiment, the resistances $R_A$ to $R_F$ of the first to sixth magneto-resistance elements 50a to 50f are represented by the following expressions.

$$R_A = R - \Delta Ry - \Delta Rz \quad (24)$$

$$R_B = R - \Delta Ry + \Delta Rz \quad (25)$$

$$R_C = R + \Delta Ry - \Delta Rz \quad (26)$$

$$R_D = R + \Delta Ry + \Delta Rz \quad (27)$$

$$R_E = R + \Delta Rx + \Delta Ry + \Delta Rz \quad (28)$$

$$R_F = R + \Delta Rx - \Delta Ry - \Delta Rz \quad (29)$$

Similarly to the description of the embodiments described above, the outputs of the magnetic field components of the respective axes can be calculated by solving the simultaneous equations with respect to the expressions (24) to (29).

An example of the calculation method of ΔRx, ΔRy, and ΔRz will be described hereinafter. The following expressions are obtained.

By calculating −(24)+(26), $$-R_A + R_C = 2\Delta Ry \quad (30)$$

By calculating −(25)+(27), $$-R_B + R_D = 2\Delta Ry \quad (31)$$

By calculating −(24)+(25), $$-R_A + R_B = 2\Delta Rz \quad (32)$$

By calculating −(26)+(27), $$-R_C + R_D = 2\Delta Rz \quad (33)$$

By calculating (28)+(29), $$R_E + R_F = 2R + 2\Delta Rx \quad (34)$$

Then, the following results are obtained.
By calculating (30)+(31), $$4\Delta Ry \quad (35)$$

By calculating (32)+(33), $$4\Delta Rz \quad (36)$$

By calculating (24)+(25)+(26)+(27), $$4R \quad (37)$$

Then, the following result is obtained.
By calculating 2×(34)−(37), $$4\Delta Rx \quad (38)$$

In this manner, the magnetic field components of the respective axes can be obtained as indicated by the expressions (35), (36) and (38).

Figure 28:
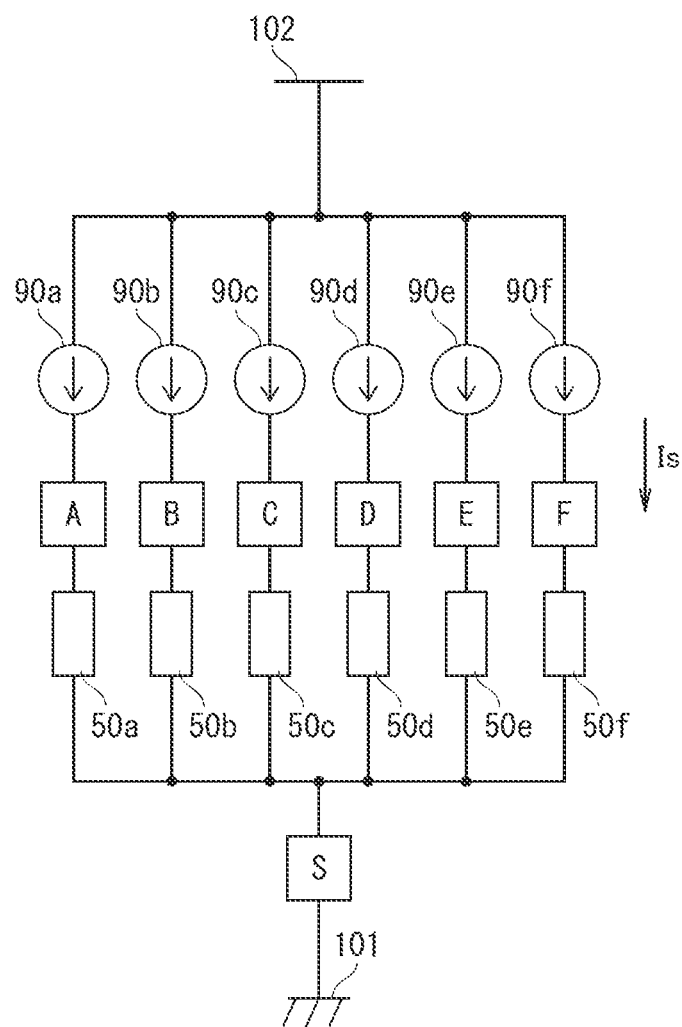
FIG. 28 is a configuration diagram of a specific circuit for detecting the signals of the magnetic sensor illustrated in FIG. 27.

FIG. 28 is a configuration diagram of a specific circuit for detecting the signals of the magnetic sensor illustrated in FIG. 27. Similar to FIG. 19, the terminal S is connected to the ground, the terminals A to F are connected to the first terminals of plural current sources whose supply currents are identical to one another, respectively, and the second terminals of the plural current sources are connected to a power supply voltage terminal. In such a configuration, predetermined currents can be supply to the first to sixth magneto-resistance elements 50a to 50f, and voltages based on a resistance change in a state where the magnetic field Bx in the first axis direction, the magnetic field By in the second axis direction, and the magnetic field Bz in the third axis direction are applied are outputted from the terminals A to F.

Figure 29:
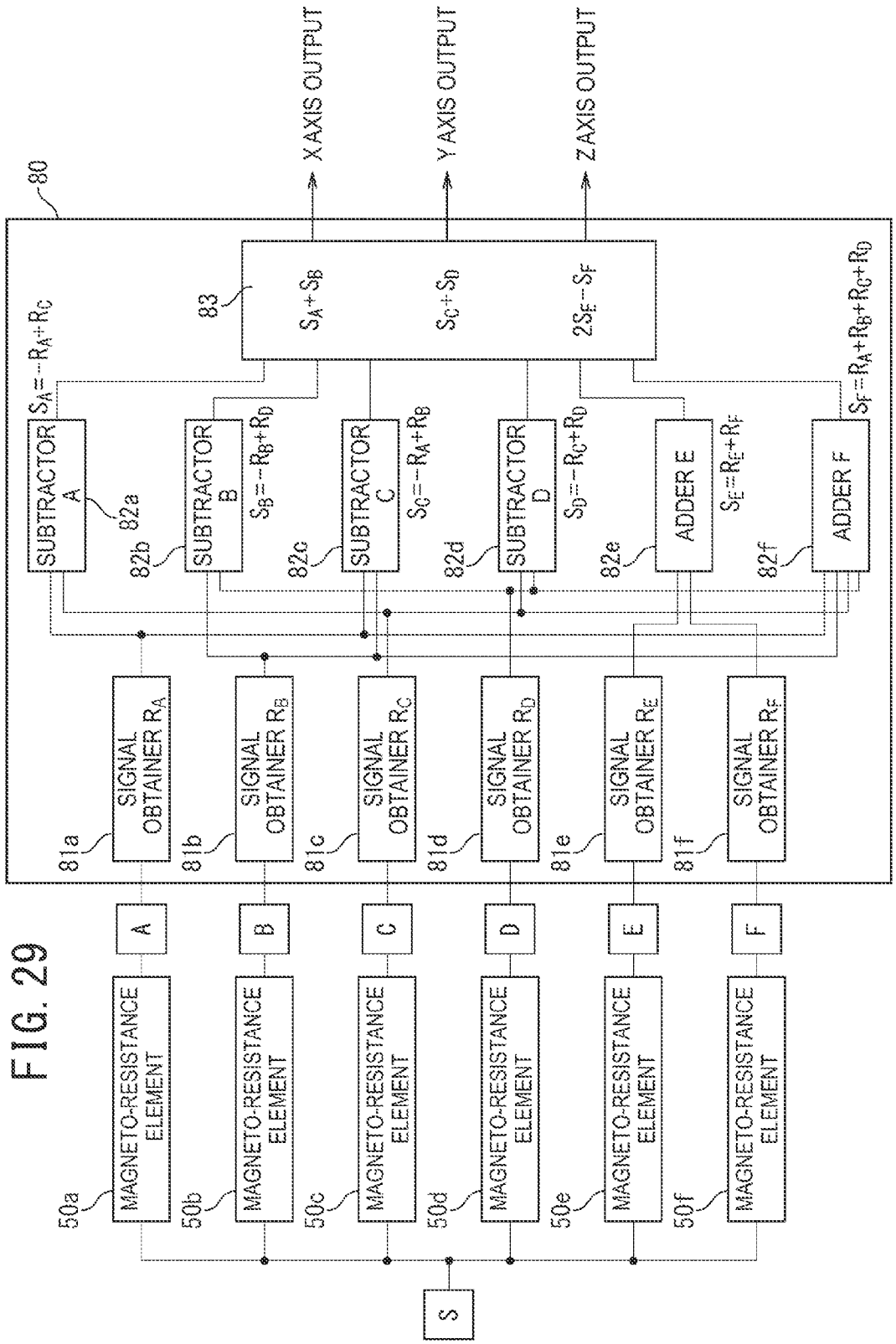
FIG. 29 is a configuration diagram of a circuit for a calculator of the output signals of the magnetic sensor illustrated in FIG. 26.

FIG. 29 is a configuration diagram of a circuit for a calculator of the output signals of the magnetic sensor illustrated in FIG. 26.

The calculator 80 includes signal obtainers 81a to 81f ($R_A$ to $R_F$), subtractors 82a to 82d (A to D), adders 82e (E) and 82f (F). The signal obtainers 81a to 81f obtain the voltages depending on the resistances of the first to sixth magneto-resistance elements 50a to 50f at the terminals A to F, respectively. That is, the signal obtainers 81a to 81f obtain the signals indicated by the expressions (24) to (29), respectively. Then, the subtractors 82a to 82d and the adder 82e calculate the expressions (30) to (34), respectively, the adder 82f calculates the expression (37). Finally, the adder-subtractor 83 in the subsequent stage calculates the expressions (35), (36), and (38) to obtain the output in the first axis direction, the output in the second axis direction, and the output in the third axis direction.

It is noted that the outputs depending on ΔRx, ΔRy, and ΔRz are obtained the above-mentioned steps in the fourteenth embodiment, however, the fourteenth embodiment is not limited to the above-mentioned steps. That is, any configuration in which the calculator 80 solves simultaneous equations so as to obtain ΔRx, ΔRy, and ΔRz can be employed.

The fourteenth embodiment described above does not need the fifth magneto-resistance element 50e for reference included in the magnetic sensor illustrated in FIGS. 15A and 15B which does not sense the magnetic field in any of the first to third directions. In addition to the effects of the fifth to thirteenth embodiments, the fourteenth embodiment has an effect of increasing sensitivity, since the fourteenth embodiment does not use a magneto-resistance element as reference but use it as the magneto-resistance element E or F.

Fifteenth Embodiment

Figure 30:
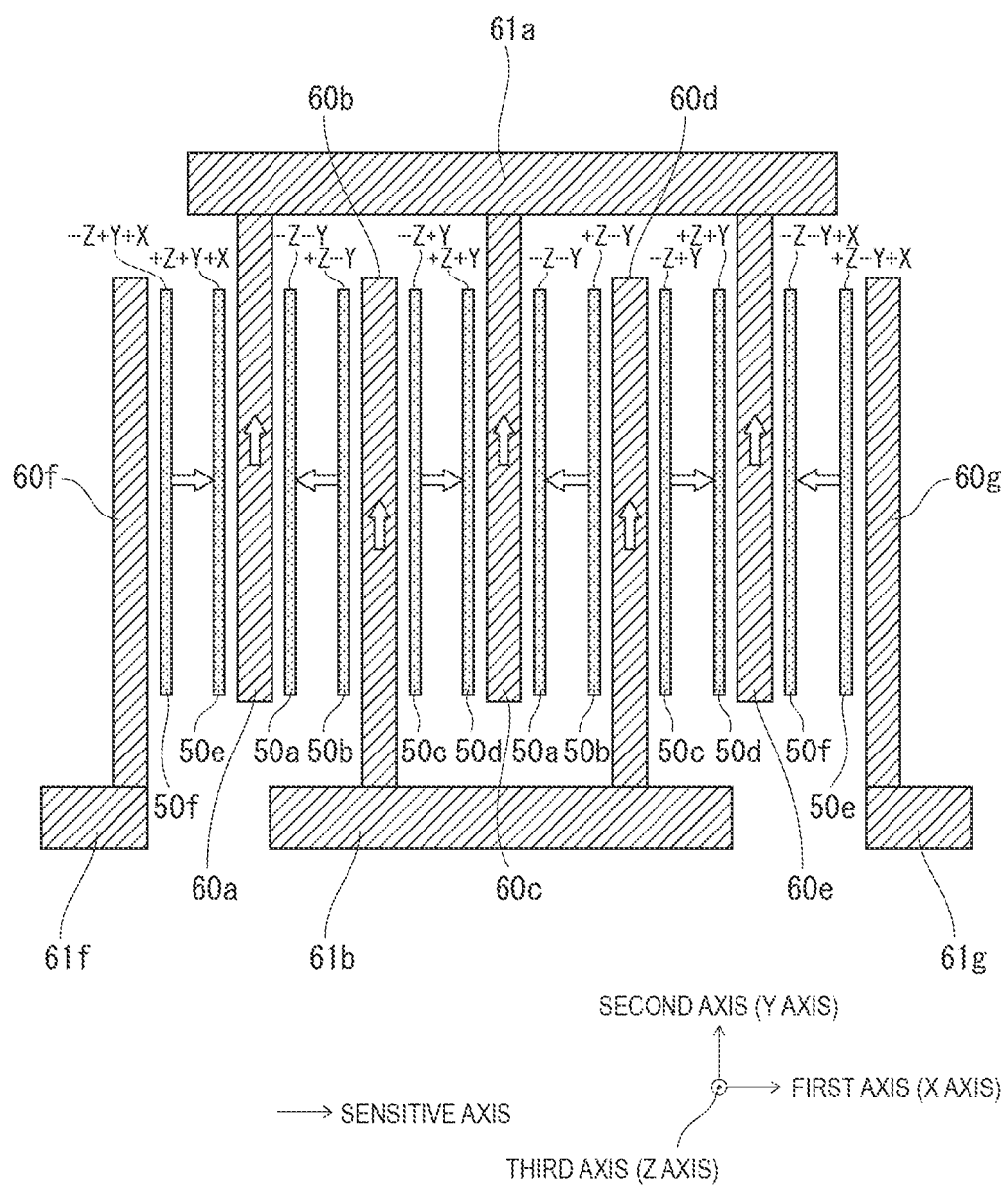
FIG. 30 is a view illustrative of an arrangement pattern of magneto-resistance elements and magnetic flux concentrators in the fifteenth embodiment.

FIG. 30 is a view illustrative of an arrangement pattern of magneto-resistance elements and magnetic flux concentrators in the fifteenth embodiment of the magnetic sensor according to the present invention, and a view illustrative of the structure of the magnetic sensor of the fifteenth embodiment in the planar view.

The magnetic sensor of the fifteenth embodiment includes, in addition to the magnetic sensor of the fourteenth embodiment described above, the fourth and fifth magnetic flux concentrators 60f and 60g. The fourth magnetic flux concentrator 60f is disposed on the left side in the first axis of the magnetic flux concentrator 60a disposed at the left end in the first axis direction among the plural magnetic flux concentrators 60a to 60e, in the planar view. The fifth magnetic flux concentrator 60g is disposed on the right side in the first axis of the magnetic flux concentrator 60e disposed at the right end in the first axis direction, in the planar view. In addition, in the magnetic sensor of the fifteenth embodiment, each of the combination of the fourth magnetic flux concentrator 60f and the magnetic flux concentrator plate 61f connecting thereto, and the combination of the fifth magnetic flux concentrator 60g and the magnetic flux concentrator plate 61g connecting thereto form an L-shape, in the planar view. It is noted that each of the combination of the fourth magnetic flux concentrator 60f with the magnetic flux concentrator plate 61f connecting thereto, and the combination of the fifth magnetic flux concentrator 60g with the magnetic flux concentrator plate 61g connecting thereto may form a T-shape or a Y-shape, similarly to the embodiments described above. Then, the magnetic flux concentrators facing with each other so as to sandwich an adjacent magnetic flux concentrator displaced therewith in the longitudinal direction, among the plural the magnetic flux concentrators 60a to 60e are connected with each other via the magnetic flux concentrator plate 61a or 61b, That is, the respective ends of the plural the magnetic flux concentrators 60a to 60e are alternately connected to the magnetic flux concentrator plate 61a or 61b.

Figure 31:
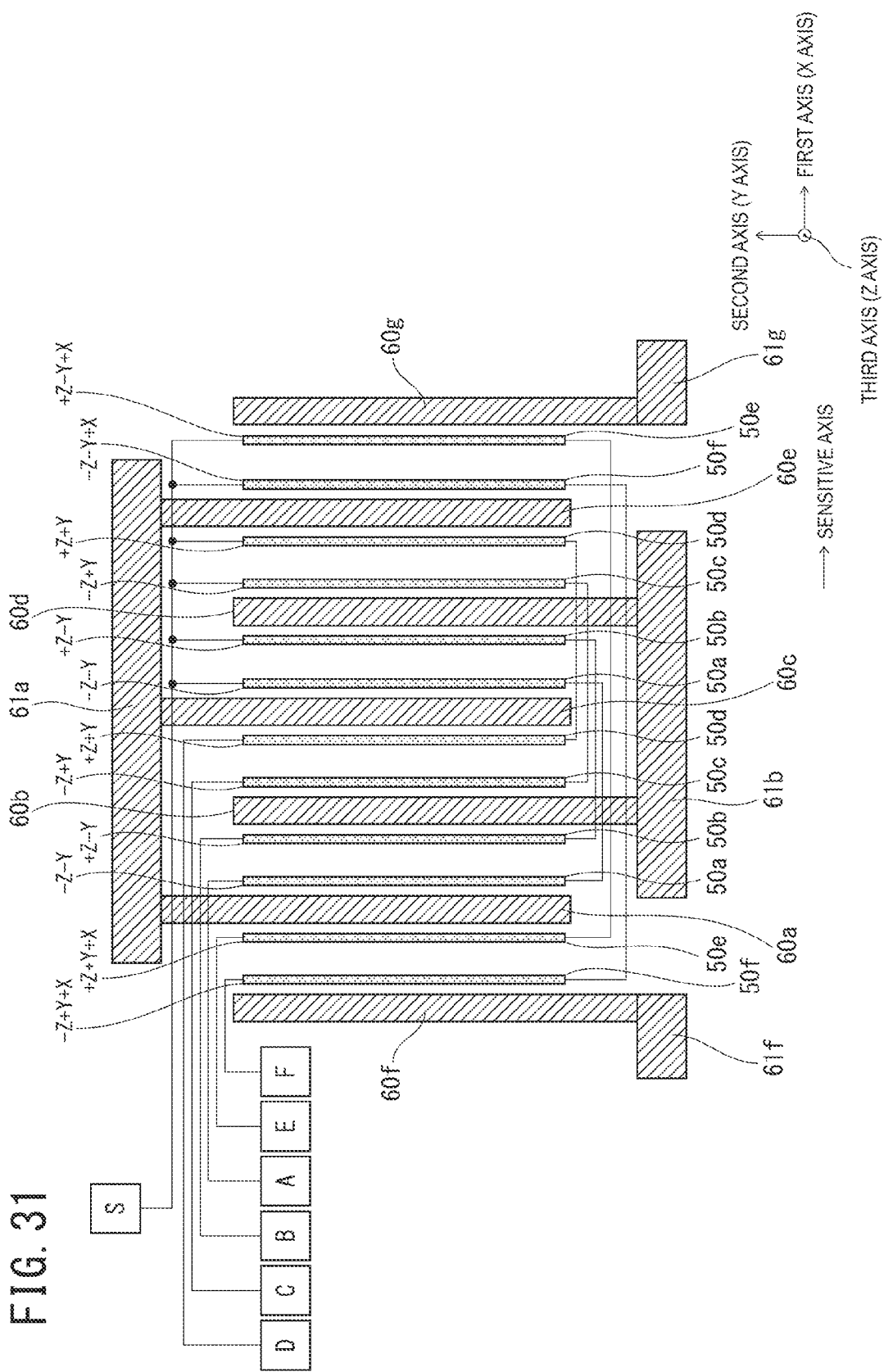
FIG. 31 is a view illustrative of wirings for extracting output signals of the magnetic sensor illustrated in FIG. 30.

FIG. 31 is a view illustrative of wirings for extracting output signals of the magnetic sensor illustrated in FIG. 30. The magneto-resistance elements to which the same numerals are assigned among the first to sixth magneto-resistance elements 50a to 50f are connected to each other in series. The first terminal of each of the magneto-resistance elements are connected to the terminal S, and the second terminals of the magneto-resistance elements are connected to the terminals A to F, respectively. Similarly to the fourteenth embodiment described above, the terminal S is connected to the ground, the terminals A to F are connected to the current sources supplying the predetermined currents. The specific circuit configuration for supplying currents to the respective magneto-resistance elements to extract the signals depending on the resistances of the respective magneto-resistance elements is similar to FIG. 28.

According to the similar principle as the fourteenth embodiment described above, the signals depending on the resistances of the first to fourth magneto-resistance elements 50a to 50d are the same as the expressions (24) to (27), when the magnetic flux gain is normalized. With respect to the fifth and sixth magneto-resistance elements 50e and 50f, the components in the second axis direction at the right and left magneto-resistance elements have opposite signs from each other, only the component in the first axis direction and the component in the third axis direction appear as a resistance change. That is, the signals depending on the resistances of the fifth and sixth magneto-resistance elements 50e to 50f are represented by the following expressions, when the magnetic flux gain is normalized.

$$R_E = R + \Delta Rx + \Delta Ry + \Delta Rz \quad (39)$$

$$R_F = R + \Delta Rx - \Delta Ry - \Delta Rz \quad (40)$$

Then, similarly to the fourteenth embodiment described above, the outputs of the magnetic field components of the respective axes can be obtained by using the calculator 80 to solve the simultaneous equations with respect to the expressions (24) to (27), the expression (39), and the expression (40).

The steps for solving the simultaneous equations may be the same as the steps in the fourteenth embodiment described above. That is, when the calculation is performed by the above-mentioned steps, the circuit configuration of the calculator 80 is similar to FIG. 29.

Sixteenth Embodiment

Figure 32:
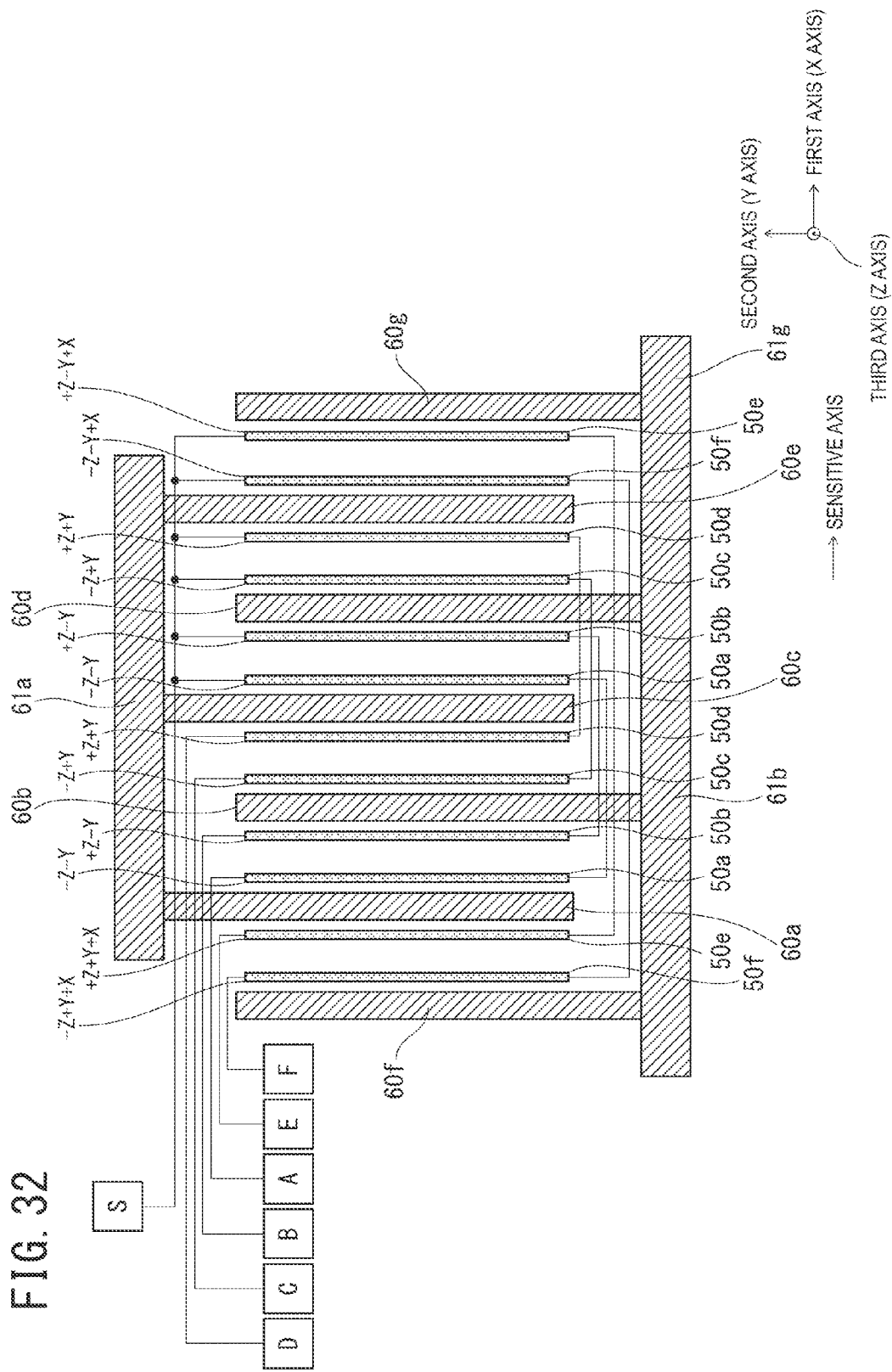
FIG. 32 is a view illustrative of an arrangement pattern of magneto-resistance elements and magnetic flux concentrators in the sixteenth embodiment.

FIG. 32 is a view illustrative of an arrangement pattern of magneto-resistance elements and magnetic flux concentrators in the sixteenth embodiment of the magnetic sensor according to the present invention, and a view illustrative of the configuration of the magnetic sensor of the sixteenth embodiment in the planar view and the wirings for detecting signals from the magnetic sensor.

The magnetic sensor of the sixteenth embodiment has a configuration obtained by alternately connecting the ends of the plural the magnetic flux concentrators 60a to 60g of the magnetic sensor of the fifteenth embodiment with one another, via the magnetic flux concentrator plate 61a or 61b. That is, in the magnetic sensor of the sixteenth embodiment, the respective ends of the plural magnetic flux concentrators 60a, 60c, and 60e are connected to one another via the magnetic flux concentrator plate 61a, the respective ends located on the side facing toward the displacing direction toward which the plural magnetic flux concentrators are displaced in the longitudinal direction. The respective ends of the remaining magnetic flux concentrators 60f, 60b, 60d, and 60g are connected to one another via the magnetic flux concentrator plate 61b, the respective ends located on the side facing toward the direction opposite to the displacing direction.

The method for extracting the signals depending on the resistances of the respective magneto-resistance elements and the method for solving the simultaneous equations to output the magnetic field components of the respective axes are similar to those of the fourteenth and fifteenth embodiments described above, thus, the descriptions thereof are omitted.

Seventeenth Embodiment

Figure 33:
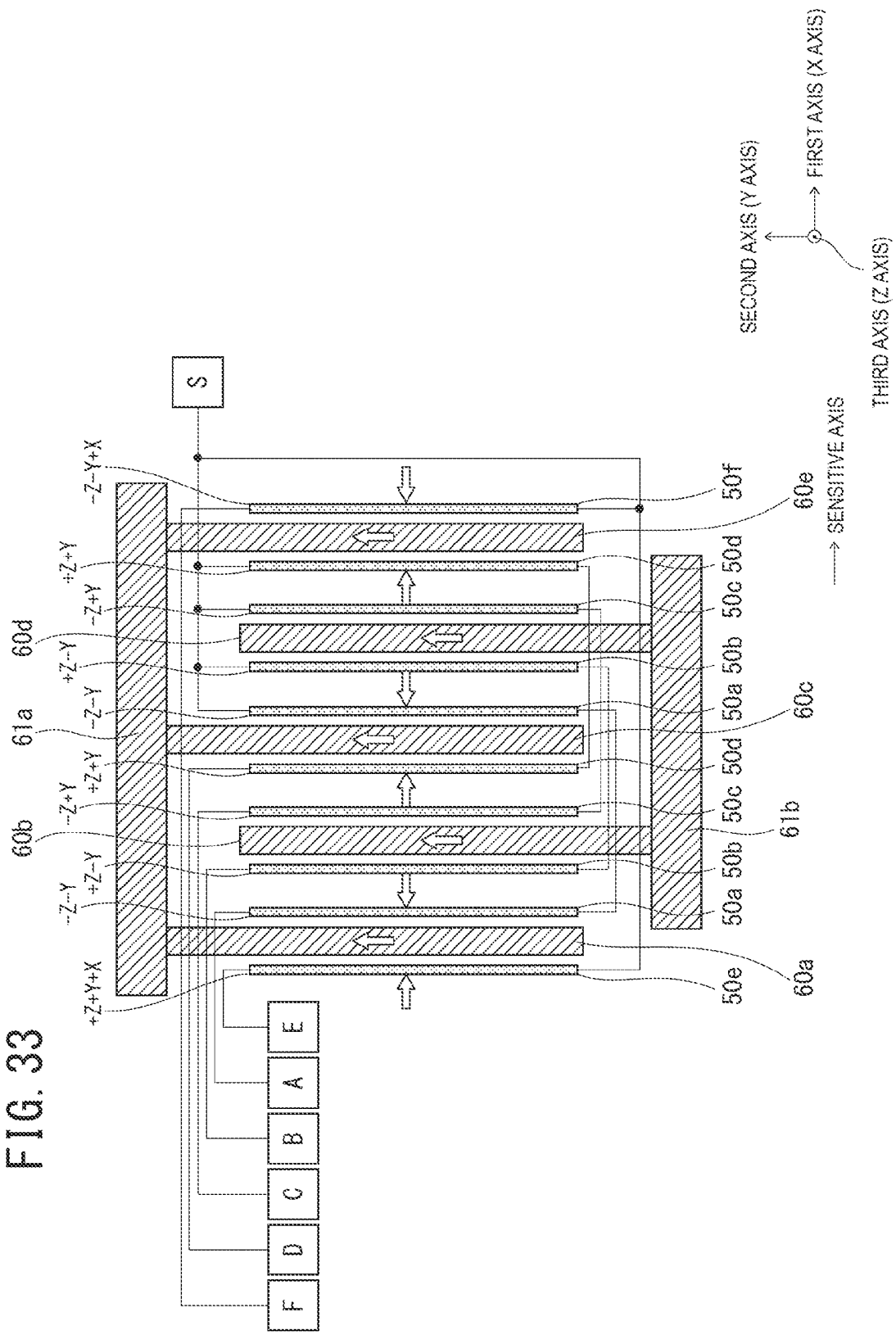
FIG. 33 is a view illustrative of an arrangement pattern of magneto-resistance elements and magnetic flux concentrators in the seventeenth embodiment.

FIG. 33 is a view illustrative of an arrangement pattern of magneto-resistance elements and magnetic flux concentrators in the seventeenth embodiment of the magnetic sensor according to the present invention, and a view illustrative of the configuration of the magnetic sensor of the seventeenth embodiment in the planar view and the wirings for detecting signals from the magnetic sensor.

The magnetic sensor of the seventeenth embodiment has a configuration obtained by removing, from the magnetic sensor of the fifteenth embodiment described above, the fourth and fifth magnetic flux concentrators 60f and 60g, and the magnetic flux concentrator plates 61f and 61g, disposed on the left end and the right end in the first axis direction and forming the L-shapes, and the sixth magneto-resistance element 50f disposed on the left end in the first axis direction, and the fifth magneto-resistance element 50e disposed on the right end in the first axis direction, among the magneto-resistance elements. The magneto-resistance elements to which the same numerals are assigned among the first to fourth magneto-resistance elements 50a to 50d are connected to each other in series. The first terminal of each of the first to sixth magneto-resistance elements 50a to 50f are connected to the terminal S, and the second terminals of the magneto-resistance elements 50a to 50f are connected to the terminals A to F, respectively. The method for flowing the predetermined currents to the terminals A to F to extract the signals depending on the resistances of the respective magneto-resistance elements and the method for solving the simultaneous equations to output the magnetic field components of the respective axes are similar to those of the fourteenth and fifteenth embodiments described above, thus, the descriptions thereof are omitted.

Eighteenth Embodiment

Figure 34:
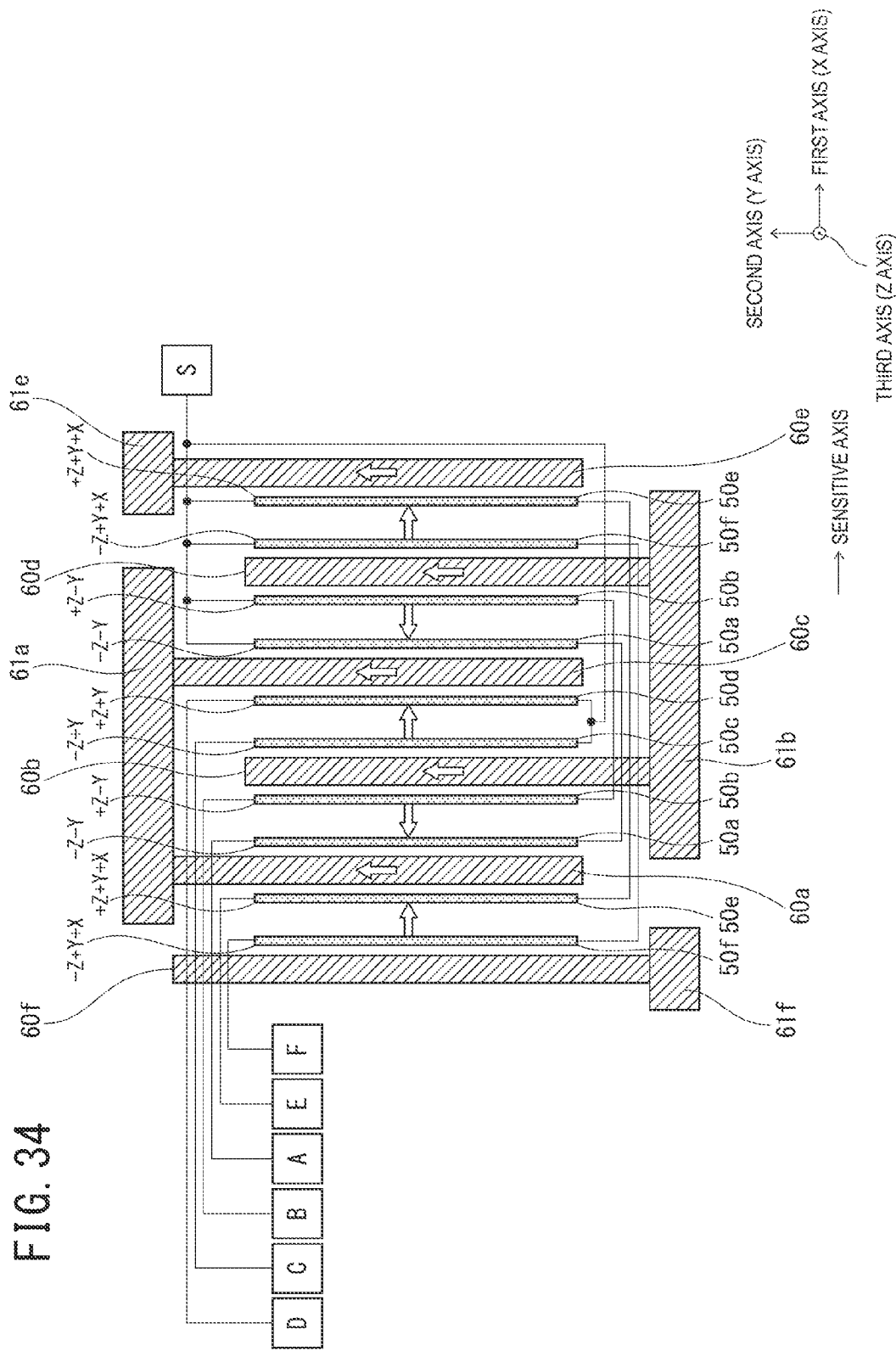
FIG. 34 is a view illustrative of an arrangement pattern of magneto-resistance elements and magnetic flux concentrators in the eighteenth embodiment.

FIG. 34 is a view illustrative of an arrangement pattern of magneto-resistance elements and magnetic flux concentrators in the eighteenth embodiment of the magnetic sensor according to the present invention, and a view illustrative of the configuration of the magnetic sensor of the eighteenth embodiment in the planar view and the wirings for detecting signals from the magnetic sensor.

The configuration of the plural magnetic flux concentrators 60a to 60f and the magnetic flux concentrator plates 61a, 61b, 61e, and 60f of the magnetic sensor of the eighteen embodiment is obtained by arranging the plural magnetic flux concentrators 60a to 60e of the seventeenth embodiment such that the end of the magnetic flux concentrator 60e disposed at right end in the first axis direction is not connected to the end of the magnetic flux concentrator 60c disposed at the center via the magnetic flux concentrator plates 61a, and the magnetic flux concentrator 60f and the magnetic flux concentrator plate 61f forming an inverted T shape is further disposed to be spaced apart from the magnetic flux concentrator 60a disposed at the left end in the first axis direction among the plural magnetic flux concentrators 60a to 60e of the seventeenth embodiment described above. Then, in the magnetic sensor of the eighteen embodiment, the third and fourth magneto-resistance elements 50c and 50d disposed between the two magnetic flux concentrators 60d and 60e located on the right side in the first axis of the magnetic sensor of the seventeenth embodiment described above are replaced with the sixth and fifth magneto-resistance elements 50f and 50e on the right side of the fifteenth embodiment, furthermore, the sixth magneto-resistance element 50f at the right end in the first axis direction of the seventeenth embodiment described above is disposed between the magnetic flux concentrator 60a and the fourth magnetic flux concentrator 60f forming an inverted T shape with the magnetic flux concentrator plate 61f so as to be close to the magnetic flux concentrator 60f forming the inverted T shape.

The magneto-resistance elements to which the same numerals are assigned among the first and second magneto-resistance elements 50a and 50b and the fifth and sixth magneto-resistance elements 50e and 50f are connected to each other in series. The first terminal of each of the magneto-resistance elements 50a to 50f are connected to the terminal S, and the second terminals of the magneto-resistance elements 50a to 50f are connected to the terminals A to F, respectively.

The method to extract the signals depending on the resistances of the respective magneto-resistance elements when flowing the predetermined currents to the terminals A to F is similar to those of the fourteenth and fifteenth embodiments described above. Additionally, similarly to the fourteenth and fifteenth embodiments described above, the outputs of magnetic field components of the respective axes can be obtained by solving the simultaneous equations with respect to the signals depending on the resistances of the magneto-resistance elements 50a to 50f obtained from the terminals A to F.

In the eighteenth embodiment, when assuming that the resistances of the third and fourth magneto-resistance elements 50c and 50d to which no magnetic field is applied are equal to the resistances of the first and second magneto-resistance elements 50a and 50b and the fifth and sixth magneto-resistance elements 50e and 50f to which no magnetic field is applied, the outputs of the respective magneto-resistance elements at the terminals A to E are the same as those of the fourteenth embodiment described above. However, the sign of ΔRy in the signal $R_F$ obtained from the terminal F in the eighteenth embodiment is different from the sign of ΔRy in the signal $R_F$ in the fourteenth embodiment, as following expression.

$$R_F = R + \Delta Rx + \Delta Ry - \Delta Rz \tag{41}$$

In addition, $R_E + R_F$ is represented the following expression.

$$R_E + R_F = 2R + 2\Delta Rx + 2\Delta Ry \tag{42}$$

That is, in the eighteenth embodiment, it is possible to obtain 4ΔRx by configuring the adder-subtractor 83 of the calculator 80 of the fourteenth embodiment described above so as to subtracting 4ΔRy in the expression (35) from a value obtained by calculating 2×(42)−(37). As is clear from the above description, any method or steps for solving can be employed as long as ΔRx, ΔRy, and ΔRz can be obtained. That is, the calculator 80 has any configuration solving the simultaneous equations so as to output ΔRx, ΔRy, and ΔRz.

As seen above, the magnetic sensors of the fourteenth to eighteenth embodiments are characterized by utilizing the property that the magnetic field in the first axis direction is different from the magnetic field in the first axis direction at the inner portion of the arrangement pattern in the gaps formed by the magnetic flux concentrators disposed at the both ends in the first axis direction and the magnetic flux concentrators adjacent thereto.

Several aspects of the magnetic sensor and the method for detecting the magnetic field explained above will be hereinafter described.

(Aspect 1)

A magnetic sensor comprising:

a plurality of magnetic flux concentrator units substantially parallel to each other and substantially parallel to a substrate, one of two adjacent ones of the plurality of magnetic flux concentrator units being displaced with respect to another of the two adjacent ones in a longitudinal direction;

a plurality of magnetic detectors substantially parallel to the plurality of magnetic flux concentrator units, disposed between two adjacent magnetic flux concentrator units of the plurality of magnetic flux concentrator units in a planar view;

wherein, the plurality of magnetic detectors includes a first and a second magnetic detectors disposed to be close to the two adjacent ones of the plurality of magnetic flux concentrator units, respectively, in the planar view.

(Aspect 2)

The magnetic sensor according to aspect 1, wherein the first magnetic detector is disposed to be closer to one magnetic flux concentrator unit than to another magnetic flux concentrator unit of the two adjacent ones of the plurality of magnetic flux concentrator units, in the planar view, and the second magnetic detector is disposed to be closer to the another magnetic flux concentrator unit than to the one magnetic flux concentrator unit, in the planar view.

(Aspect 3)

The magnetic sensor according to aspect 1 or 2, wherein the plurality of magnetic flux concentrator units include three or more magnetic flux concentrator units, and wherein one magnetic flux concentrator unit of the three or more magnetic flux concentrator units is disposed to be displaced with respect to two other magnetic flux concentrator units in the longitudinal direction and the two other magnetic flux concentrator units face with each other to sandwich the one magnetic flux concentrator unit, in the planar view.

(Aspect 4)

The magnetic sensor according to aspect 3, wherein respective inter-edge distances between the plurality of magnetic flux concentrator units are substantially equal to each other.

(Aspect 5)

The magnetic sensor according to aspect 3 or 4, wherein respective centroid positions of the plurality of magnetic flux concentrator units are disposed zigzag in the planar view.

(Aspect 6)

The magnetic sensor according to any one of aspects 3 to 5, wherein alternate ones of the plurality of magnetic flux concentrator units face each other in the planar view.

(Aspect 7)

The magnetic sensor according to any one of aspects 3 to 6, wherein a magnetic flux concentrator member is provided at an end of one of the plurality of magnetic flux concentrator units.

(Aspect 8)

The magnetic sensor according to aspect 7, wherein the one of the plurality of magnetic flux concentrator units and the magnetic flux concentrator member form a magnetic flux concentrator unit having a T-shape, a Y-shape or an L-shape.

(Aspect 9)

The magnetic sensor according to any one of aspects 1 to 8, further comprising a third magnetic detector disposed to be covered with one of the plurality of magnetic flux concentrator units in the planar view.

(Aspect 10)

The magnetic sensor according to aspect 7, wherein the plurality of magnetic flux concentrator units are alternately connected to each other via the magnetic flux concentrator member.

(Aspect 11)

The magnetic sensor according to aspect 10, further comprising a fourth and a fifth magnetic detectors disposed outside of magnetic flux concentrator units disposed at ends, among the plurality of magnetic flux concentrator units, respectively, in the planar view.

(Aspect 12)

The magnetic sensor according to aspect 7, wherein a magnetic flux concentrator unit disposed at an end, among the plurality of magnetic flux concentrator units and the magnetic flux concentrator member form a magnetic flux concentrator unit having a T-shape, a Y-shape or an L-shape, in the planar view, and magnetic flux concentrator units among the plurality of magnetic flux concentrator units other than the magnetic flux concentrator unit disposed at the end are alternately connected to each other via the magnetic flux concentrator member.

(Aspect 13)

The magnetic sensor according to any one of aspects 3 to 8, and 12, wherein sensitive axes of the plurality of magnetic detectors are an identical first axis direction.

(Aspect 14)

The magnetic sensor according to aspect 13, comprising a calculator configured to calculate a magnetic field in a second axis direction and a magnetic field in a third axis direction, on the basis of respective outputs of the plurality of magnetic detectors.

(Aspect 15)

The magnetic sensor according to aspect 14, wherein the calculator is configured to calculate the magnetic fields in the second and the third axis directions, on the basis of respective resistances of the plurality of magnetic detectors.

(Aspect 16)

The magnetic sensor according to aspect 9, wherein sensitive axes of the plurality of magnetic detectors and of the third magnetic detector are an identical first axis direction.

(Aspect 17)

The magnetic sensor according to aspect 16, comprising a calculator configured to calculate a magnetic field in a second axis direction and a magnetic field in a third axis direction, on the basis of respective outputs of the plurality of magnetic detectors and of the third magnetic detector.

(Aspect 18)

The magnetic sensor according to aspect 17, wherein the calculator is configured to calculate the magnetic fields in the second and the third axis directions, on the basis of respective resistances of the plurality of magnetic detectors and of the third magnetic detector.

(Aspect 19)

The magnetic sensor according to aspect 11, wherein sensitive axes of the plurality of magnetic detectors, and of the fourth and the fifth magnetic detectors are an identical first axis direction.

(Aspect 20)

The magnetic sensor according to aspect 19, comprising a calculator configured to calculate a magnetic field in a second axis direction and a magnetic field in a third axis direction, on the basis of respective outputs of the plurality of magnetic detectors, and of the fourth and the fifth magnetic detectors.

(Aspect 21)

The magnetic sensor according to aspect 20, wherein the calculator is configured to calculate the magnetic fields in the second and the third axis directions, on the basis of respective resistances of the plurality of magnetic detectors, and of the fourth and the fifth magnetic detectors.

(Aspect 22)

The magnetic sensor according to aspect 15, 18 or 21, wherein the calculator is configured to calculate the magnetic fields in the second and the third axis directions by solving simultaneous equations with respect to the respective resistances.

(Aspect 23)

The magnetic sensor according to any one of aspects 13 to 22, wherein the first axis direction is parallel to the substrate, the second axis direction is parallel to the substrate and perpendicular to the first axis direction, and the third axis direction is perpendicular to the substrate.

(Aspect 24)

A magnetic sensor comprising:

a magnetic detector including a magnetic field sensitive material configured to detect a magnetic field component in a first direction, and a magnetic field direction converter configured to convert a magnetic field component in a second direction and a magnetic field component in a third direction into the magnetic field component in the first direction, the second direction being perpendicular to the first direction, the third direction being perpendicular to both of the first and the second directions.

(Aspect 25)

The magnetic sensor according to aspect 24, wherein the magnetic field direction converter comprises a first and a second magnetic flux concentrator units disposed to be substantially parallel to each other on a substrate, and in an arrangement pattern including the first and the second magnetic flux concentrator units and the magnetic field sensitive material included in the magnetic detector, the magnetic field sensitive material included in the magnetic detector is disposed between the first magnetic flux concentrator unit and the second magnetic flux concentrator unit in a planar view of the substrate.

(Aspect 26)

The magnetic sensor according to aspect 25, wherein the magnetic field sensitive material included in the magnetic detector is disposed to be substantially parallel to the first magnetic flux concentrator unit and the second magnetic flux concentrator unit in the planar view of the substrate.

(Aspect 27)

The magnetic sensor according to aspect 26, wherein a distance between the magnetic field sensitive material included in the magnetic detector and the first magnetic flux concentrator unit is shorter than a distance between the magnetic field sensitive material included in the magnetic detector and the second magnetic flux concentrator unit.

(Aspect 28)

The magnetic sensor according to any one of aspects 25 to 27, wherein the first and the second magnetic flux concentrator units are disposed to form a magnetic path of a magnetic flux component from the second magnetic flux concentrator unit to the first magnetic flux concentrator unit, when a magnetic field is inputted in a longitudinal direction of the second magnetic flux concentrator unit.

(Aspect 29)

The magnetic sensor according to any one of aspects 25 to 28, wherein the first direction and the second direction are parallel to a plane of the substrate, and the third direction is perpendicular to the plane of the substrate.

(Aspect 30)

The magnetic sensor according to any one of aspects 25 to 29, wherein the second magnetic flux concentrator unit is disposed to be displaced with respect to the first magnetic flux concentrator unit in a longitudinal direction of the second magnetic flux concentrator unit.

(Aspect 31)

The magnetic sensor according to any one of aspects 25 to 30, wherein, the magnetic field direction converter comprises a third magnetic flux concentrator unit and/or a fourth magnetic flux concentrator unit, the third magnetic flux concentrator unit is disposed at a position where the first magnetic flux concentrator unit is sandwiched between the third magnetic flux concentrator unit and the second magnetic flux concentrator unit, and the fourth magnetic flux concentrator unit is disposed at a position where the second magnetic flux concentrator unit is sandwiched between the fourth magnetic flux concentrator unit and the first magnetic flux concentrator unit.

(Aspect 32)

The magnetic sensor according to any one of aspects 25 to 31, wherein the first to the fourth magnetic flux concentrator units are equipped with a first to a fourth magnetic flux concentrator members, respectively, disposed at the ends of the first to the fourth magnetic flux concentrator units, and the first to the fourth magnetic flux concentrator units and the first to the fourth magnetic flux concentrator members form T-shapes, Y-shapes, or L-shapes, respectively, in the planar view of the substrate.

(Aspect 33)

The magnetic sensor according to aspect 32, wherein the first to the fourth magnetic flux concentrator units and the first to the fourth magnetic flux concentrator members forming T-shapes, Y-shapes, or L-shapes have gaps between one another.

(Aspect 34)

The magnetic sensor according to any one of aspects 25 to 33, wherein a part of the magnetic field sensitive material included in the magnetic detector, the part extending along a long side of the magnetic field sensitive material, is covered with any one of the first or the second magnetic flux concentrator unit on the plane of the substrate.

(Aspect 35)

The magnetic sensor according to any one of aspects 25 to 34, comprising an auxiliary magnetic detector (50c) including a magnetic field sensitive material having the same structure as a structure of the magnetic field sensitive material included in the magnetic detector, wherein the magnetic field sensitive material included in the auxiliary magnetic detector is disposed not to sense magnetic field components in the first to the third directions, and the arrangement pattern includes the magnetic field sensitive material included in the auxiliary magnetic detector.

(Aspect 36)

The magnetic sensor according to aspect 35, wherein the magnetic field sensitive material included in the auxiliary magnetic detector is covered with any one of the first or the second magnetic flux concentrator units.

(Aspect 37)

The magnetic sensor according to aspect 36, wherein the magnetic field sensitive material included in the auxiliary magnetic detector is covered with the second magnetic flux concentrator unit.

(Aspect 38)

The magnetic sensor according to any one of aspects 24 to 37, comprising a plurality of the arrangement patterns.

(Aspect 39)

The magnetic sensor according to aspect 38, wherein, in the plurality of arrangement patterns, the magnetic field sensitive material included in the magnetic detector and/or the magnetic field sensitive material included in the auxiliary magnetic detector in each of the arrangement patterns are/is electrically connected to the magnetic field sensitive material included in the magnetic detector and/or the magnetic field sensitive material included in the auxiliary magnetic detector in another arrangement pattern in a stage adjacent and subsequent to the each of the arrangement patterns, respectively.

(Aspect 40)

The magnetic sensor according to aspect 39, wherein, in the plurality of arrangement patterns, the magnetic field sensitive material included in the magnetic detector in each of the arrangement patterns is electrically connected to the magnetic field sensitive material included in the magnetic detector in another arrangement pattern in a stage adjacent and subsequent to the each of the arrangement patterns.

(Aspect 41)

The magnetic sensor according to aspect 39, wherein, in the plurality of arrangement patterns, the magnetic field sensitive material included in the auxiliary magnetic detector in each of the arrangement patterns is electrically connected to the magnetic field sensitive material included in the auxiliary magnetic detector in another arrangement pattern in a stage adjacent and subsequent to the each of the arrangement patterns.

(Aspect 42)

The magnetic sensor according to any one of aspects 24 to 41, wherein the magnetic field sensitive material included in the magnetic detector is configured to detect the magnetic field component in only the first direction.

(Aspect 43)

The magnetic sensor according to any one of aspects 24 to 42, wherein the first to the fourth magnetic flux concentrator units and the first to the fourth magnetic flux concentrator members are made of a soft magnetic material.

(Aspect 44)

The magnetic sensor according to any one of aspects 24 to 43 comprising a controller configured to control another function block, wherein the controller is configured to receive a signal obtained from an output of the magnetic detector, the signal being in a state where magnetic field components in the first to third directions are summed, and to control the another function block by using the signal in the state where the magnetic field components in the first to third directions are summed.

(Aspect 45)

The magnetic sensor according to any one of aspects 24 to 43 comprising:

a signal generator configured to generate a signal on the basis of an output of the magnetic detector and an output of the auxiliary magnetic detector, the signal being in a state where magnetic field components in the first to third directions are summed; and a controller configured to control another function block, wherein the controller is configured to control the another function block by using the signal outputted from the signal generator, the signal being in the state where the magnetic field components in the first to third directions are summed.

(Aspect 46)

A magnetic sensor for detecting magnetic field components in two axis directions or three axis directions, the magnetic sensor comprising an arrangement pattern including:

three or more magnetic detectors disposed to be parallel to one another and parallel to a substrate plane; and a first to a third magnetic flux concentrator units disposed to be parallel to one another and parallel to the substrate plane, wherein the first to the third magnetic flux concentrator units are disposed to form respective magnetic paths of a magnetic flux component from the second magnetic flux concentrator unit to the first magnetic flux concentrator unit and a magnetic flux component from the second magnetic flux concentrator unit to the third magnetic flux concentrator unit, when a magnetic field is inputted in a longitudinal direction of the second magnetic flux concentrator unit, the three or more magnetic detectors are divided into a first magnetic detector group disposed between the second magnetic flux concentrator unit and the first magnetic flux concentrator unit and a second magnetic detector group disposed between the second magnetic flux concentrator unit and the third magnetic flux concentrator unit.

(Aspect 47)

The magnetic sensor according to aspect 46, wherein all of the three or more magnetic detectors have a sensitive axis in a first axis direction parallel to the substrate plane, the two axis directions include a second axis direction parallel to the substrate plane and perpendicular to the first axis direction and a third axis direction perpendicular to the substrate plane, and the three axis directions include the first to the third axis directions.

(Aspect 48)

The magnetic sensor according to aspect 46 or 47, wherein the three or more magnetic detectors are disposed such that inter-median-line distances are substantially equal to one another, the inter-median-line distances including first inter-median-line distances between a first virtual median line and centerlines of the respective magnetic detectors in the first magnetic detector group extending in a longitudinal direction of the magnetic detectors, the first virtual median line being a line midway between the first magnetic flux concentrator unit and the second magnetic flux concentrator unit, and second inter-median-line distances between a second virtual median line and centerlines of the respective magnetic detectors in the second magnetic detector group extending in the longitudinal direction of the magnetic detectors, the second virtual median line being a line midway between the second magnetic flux concentrator unit and the third magnetic flux concentrator unit.

(Aspect 49)

The magnetic sensor according to aspect 48, wherein any one of the inter-median-line distances is not shorter than 0.7 times and not longer than 1.3 times another of the inter-median-line distances.

(Aspect 50)

The magnetic sensor according to any one of aspects 46 to 49, wherein the second magnetic flux concentrator unit is disposed to be displaced with respect to the first and the third magnetic flux concentrator units in the longitudinal direction of the second magnetic flux concentrator unit.

(Aspect 51)

The magnetic sensor according to any one of aspects 46 to 50, a centroid position of the second magnetic flux concentrator unit is not located on a virtual line connecting centroid positions of the first and the third magnetic flux concentrator units in a planar view.

(Aspect 52)

The magnetic sensor according to any one of aspects 46 to 51, wherein a first inter-edge distance between the first magnetic flux concentrator unit and the second magnetic flux concentrator unit is substantially equal to a second inter-edge distance between the second magnetic flux concentrator unit and the third magnetic flux concentrator unit.

(Aspect 53)

The magnetic sensor according to aspect 52 wherein the first inter-edge distance is not shorter than 0.7 times and not longer than 1.3 times the second inter-edge distance.

(Aspect 54)

The magnetic sensor according to any one of aspects 46 to 53, comprising a fourth magnetic flux concentrator unit and/or a fifth magnetic flux concentrator unit, wherein the fourth magnetic flux concentrator unit is disposed at a position where the first magnetic flux concentrator unit is sandwiched between the fourth magnetic flux concentrator unit and the second magnetic flux concentrator unit, and the fifth magnetic flux concentrator unit is disposed at a position where the third magnetic flux concentrator unit is sandwiched between the fifth magnetic flux concentrator unit and the second magnetic flux concentrator unit.

(Aspect 55)

The magnetic sensor according to any one of aspects 46 to 54, wherein magnetic flux concentrator members are disposed at the ends on the magnetic flux concentrator units, respectively, and the magnetic flux concentrator units form magnetic flux concentrator units having T-shapes, Y-shapes, or L-shapes, respectively.

(Aspect 56)

The magnetic sensor according to aspect 55, the magnetic flux concentrator members of the magnetic flux concentrator units having T-shapes, Y-shapes, or L-shapes have gaps between each other.

(Aspect 57)

The magnetic sensor according to any one of aspects 46 to 56, wherein a part of each of the three or more magnetic detectors extending along a long side of the magnetic detectors is covered with any one of the first to the third magnetic flux concentrator units on the substrate plane.

(Aspect 58)

The magnetic sensor according to any one of aspects 46 to 57, wherein the arrangement pattern comprises an auxiliary magnetic detector in addition to the three or more magnetic detectors, wherein the auxiliary magnetic detector is covered with one of the magnetic flux concentrator units.

(Aspect 59)

The magnetic sensor according to aspect 58, wherein the three or more magnetic detectors are four magnetic detectors.

(Aspect 60)

The magnetic sensor according to aspect 58 or 59, wherein the auxiliary magnetic detector is covered with any one of the first to the three magnetic flux concentrator units.

(Aspect 61)

The magnetic sensor according to any one of aspects 46 to 60, comprising a plurality of the arrangement patterns.

(Aspect 62)

The magnetic sensor according to aspect 61, wherein, in the plurality of arrangement patterns, the third magnetic flux concentrator unit in each of the arrangement patterns serves as the first magnetic flux concentrator unit in another arrangement pattern in a stage adjacent and subsequent to the each of the arrangement patterns.

(Aspect 63)

The magnetic sensor according to aspect 61 or 62, wherein, in the plurality of arrangement patterns, the three or more magnetic detectors and/or the auxiliary magnetic detector in each of the arrangement patterns are/is electrically connected to the three or more magnetic detectors and/or the auxiliary magnetic detector in another arrangement pattern in a stage adjacent and subsequent to the each of the arrangement patterns, respectively.

(Aspect 64)

The magnetic sensor according to any one of aspects 46 to 63, comprising a calculator configured to receive signals on the basis of outputs from the three or more magnetic detectors to calculate a magnetic field component of Y axis and a magnetic field component of Z axis, the Y axis being perpendicular to sensitive axes of the three or more magnetic detectors and parallel to the substrate plane, the Z axis being perpendicular to the substrate plane.

(Aspect 65)

The magnetic sensor according to any one of aspects 58 to 60, comprising a calculator configured to receive signals on the basis of outputs from the three or more magnetic detectors and an output from the auxiliary magnetic detector to calculate a magnetic field component of sensitive axes of the three or more magnetic detectors, a magnetic field component of Y axis, and a magnetic field component of Z axis, the Y axis being perpendicular to the sensitive axes of the three or more magnetic detectors and parallel to the substrate plane, the Z axis being perpendicular to the substrate plane.

(Aspect 66)

The magnetic sensor according to aspect 65, wherein the calculator is configured to calculate the magnetic field component of the sensitive axes of the three or more magnetic detectors by adding signals obtained by subtracting the signal on the basis of the output from the auxiliary magnetic detector from the signals on the basis of the outputs from the three or more magnetic detectors.

(Aspect 67)

A magnetic detecting method of using the magnetic sensor according to any one of aspects 46 to 66.

(Aspect 68)

A magnetic detecting method for detecting magnetic field components in two axis directions on the basis of outputs from a first and a second magnetic detectors sandwiched between a first and a second magnetic flux concentrator units and of a output from a third magnetic detector sandwiched between the second and a third magnetic flux concentrator units, wherein the first to the third magnetic detectors have a sensitive axis in an identical first axis direction, and the magnetic detecting method comprising:

calculating a magnetic field component in a second axis direction on the basis of a value based on the output from the first magnetic detector and a value based on the output from the third magnetic detector; and calculating a magnetic field component in a third axis direction on the basis of the value based on the output from the first magnetic detector and a value based on the output from the second magnetic detector.

(Aspect 69)

A magnetic detecting method for detecting magnetic field components in two axis directions on the basis of outputs from a first and a second magnetic detectors sandwiched between a first and a second magnetic flux concentrator units and of outputs from a third and a fourth magnetic detectors sandwiched between the second and a third magnetic flux concentrator units, wherein the first to the fourth magnetic detectors have a sensitive axis in an identical first axis direction, and the magnetic detecting method comprising:

calculating a magnetic field component in a second axis direction on the basis of a value obtained by subtracting a sum of values based on the outputs from the first and the second magnetic detectors from a sum of values based on the outputs from the third and the fourth magnetic detectors; and calculating a magnetic field component in a third axis direction on the basis of a value obtained by subtracting a sum of the values based on the outputs from the first and the third magnetic detectors from a sum of the values based on the outputs from the second and the fourth magnetic detectors, or calculating the magnetic field component in the second axis direction on the basis of the output from the first magnetic detector and the output from the third magnetic detector; and calculating the magnetic field component in the third axis direction on the basis of the output from the first magnetic detector and the output from the second magnetic detector.
(Aspect 70)

The magnetic detecting method according to aspect 68, wherein, magnetic field components in three axis directions are detected on the basis of the outputs from the first to third magnetic detectors and an output from an auxiliary magnetic detector covered with a magnetic flux concentrator unit, the first to the third magnetic detectors and the auxiliary magnetic detector have a sensitive axis in the first axis direction, and the magnetic detecting method comprising calculating a magnetic field component in the first axis direction on the basis of the output from the second magnetic detector, the output from the third magnetic detector, and the output from the auxiliary magnetic detector, in addition to the calculating the magnetic field component in the second axis direction and the calculating the magnetic field component in the third axis direction.
(Aspect 71)

The magnetic detecting method according to aspect 69, wherein, magnetic field components in three axis directions are detected on the basis of the outputs from the first to fourth magnetic detectors and an output from an auxiliary magnetic detector covered with a magnetic flux concentrator unit, the first to the fourth magnetic detectors and the auxiliary magnetic detector have a sensitive axis in the first axis direction, and the magnetic detecting method comprising calculating a magnetic field component in the first axis direction on the basis of a total sum of signals based on the outputs from the first to the fourth magnetic detectors, the signals being obtained by subtracting a value based on the output from the auxiliary magnetic detector from values based on the outputs from the first to the fourth magnetic detectors, in addition to the calculating the magnetic field component in the second axis direction and the calculating the magnetic field component in the third axis direction.
(Aspect 72)

The magnetic detecting method according to any one of aspects 68 to 71, wherein the second axis direction is perpendicular to the sensitive axes of the magnetic detectors and parallel to a substrate plane and the third axis direction is perpendicular to the substrate plane.
(Aspect 73)

The magnetic detecting method according to any one of aspects 69 to 72, wherein the first axis direction is a direction of sensitive axes of the magnetic detectors.

INDUSTRIAL APPLICABILITY

The magnetic sensor and the magnetic detecting method according some embodiments of the present invention can be applied to the field of the portable device or the like in which miniaturization, space saving and power saving are strongly requested.

REFERENCE SIGNS LIST 1 antiferromagnetic layer
2 pinned layer (fixed layer)
3 Cu layer (spacer layer)
4 free layer (free rotation layer)
11 insulating film
12 free layer (free rotation layer)
13 conductive layer
14 pinned layer (fixed layer)
15 antiferromagnetic layer
16 insulating film
31 silicon substrate
32a to 32c GMR element
33a to 33d metal wiring
41a to 41f magnetic flux concentrator
50a to 50f the first to the sixth magneto-resistance elements (magnetic detectors)
60a to 60g the first to the seventh magnetic flux concentrators (magnetic flux concentrator units)
61a to 61g the first to the seventh magnetic flux concentrator plates (magnetic flux concentrator members)
70 substrate plane
71 the first virtual plane
72 the second virtual plane
80 calculator
81a to 81f signal obtainer
82a to 82d subtractor
82e, 82f adder
83 adder-subtractor
90a to 90f constant current source
101 the first electrical potential
102 the second electrical potential
161b, 162b endpoint of the second magnetic flux concentrator unit

The invention claimed is:

1. A magnetic sensor comprising:
a plurality of magnetic flux concentrator units substantially parallel to each other and substantially parallel to a substrate, one of two adjacent ones of the plurality of magnetic flux concentrator units being displaced with respect to another of the two adjacent ones in a longitudinal direction;
a plurality of magnetic detectors substantially parallel to the plurality of magnetic flux concentrator units, disposed between two adjacent magnetic flux concentrator units of the plurality of magnetic flux concentrator units in a planar view;
wherein, the plurality of magnetic detectors includes a first and a second magnetic detectors disposed to be close to the two adjacent ones of the plurality of magnetic flux concentrator units, respectively, in the planar view.

2. The magnetic sensor according to claim 1, wherein
the first magnetic detector is disposed to be closer to one magnetic flux concentrator unit than to another magnetic flux concentrator unit of the two adjacent ones of the plurality of magnetic flux concentrator units, in the planar view, and
the second magnetic detector is disposed to be closer to the another magnetic flux concentrator unit than to the one magnetic flux concentrator unit, in the planar view.

3. The magnetic sensor according to claim 1, wherein
the plurality of magnetic flux concentrator units include three or more magnetic flux concentrator units, and wherein
one magnetic flux concentrator unit of the three or more magnetic flux concentrator units is disposed to be displaced with respect to two other magnetic flux concentrator units in the longitudinal direction and the two other magnetic flux concentrator units face with each other to sandwich the one magnetic flux concentrator unit, in the planar view.

4. The magnetic sensor according to claim 3, wherein respective inter-edge distances between the plurality of magnetic flux concentrator units are substantially equal to each other.

5. The magnetic sensor according to claim 3, wherein respective centroid positions of the plurality of magnetic flux concentrator units are disposed zigzag in the planar view.

6. The magnetic sensor according to claim 3, wherein alternate ones of the plurality of magnetic flux concentrator units face each other in the planar view.

7. The magnetic sensor according to claim 3, wherein a magnetic flux concentrator member is provided at an end of one of the plurality of magnetic flux concentrator units.

8. The magnetic sensor according to claim 7, wherein the one of the plurality of magnetic flux concentrator units and the magnetic flux concentrator member form a magnetic flux concentrator unit having a T-shape, a Y-shape or an L-shape.

9. The magnetic sensor according to claim 7, wherein the plurality of magnetic flux concentrator units are alternately connected to each other via the magnetic flux concentrator member.

10. The magnetic sensor according to claim 9, further comprising a fourth and a fifth magnetic detectors disposed outside of magnetic flux concentrator units disposed at ends, among the plurality of magnetic flux concentrator units, respectively, in the planar view.

11. The magnetic sensor according to claim 10, wherein sensitive axes of the plurality of magnetic detectors, and of the fourth and the fifth magnetic detectors are an identical first axis direction.

12. The magnetic sensor according to claim 11, comprising a calculator configured to calculate a magnetic field in a second axis direction and a magnetic field in a third axis direction, on the basis of respective outputs of the plurality of magnetic detectors, and of the fourth and the fifth magnetic detectors.

13. The magnetic sensor according to claim 12, wherein the calculator is configured to calculate the magnetic fields in the second and the third axis directions, on the basis of respective resistances of the plurality of magnetic detectors, and of the fourth and the fifth magnetic detectors.

14. The magnetic sensor according to claim 7, wherein a magnetic flux concentrator unit disposed at an end, among the plurality of magnetic flux concentrator units and the magnetic flux concentrator member form a magnetic flux concentrator unit having a T-shape, a Y-shape or an L-shape, in the planar view, and
magnetic flux concentrator units among the plurality of magnetic flux concentrator units other than the magnetic flux concentrator unit disposed at the end are alternately connected to each other via the magnetic flux concentrator member.

15. The magnetic sensor according to claim 3, wherein sensitive axes of the plurality of magnetic detectors are an identical first axis direction.

16. The magnetic sensor according to claim 15, comprising a calculator configured to calculate a magnetic field in a second axis direction and a magnetic field in a third axis direction, on the basis of respective outputs of the plurality of magnetic detectors.

17. The magnetic sensor according to claim 16, wherein the calculator is configured to calculate the magnetic fields in the second and the third axis directions, on the basis of respective resistances of the plurality of magnetic detectors.

18. The magnetic sensor according to claim 17, wherein the calculator is configured to calculate the magnetic fields in the second and the third axis directions by solving simultaneous equations with respect to the respective resistances.

19. The magnetic sensor according to claim 15, wherein the first axis direction is parallel to the substrate,
the second axis direction is parallel to the substrate and perpendicular to the first axis direction, and
the third axis direction is perpendicular to the substrate.

20. The magnetic sensor according to claim 1, further comprising a third magnetic detector disposed to be covered with one of the plurality of magnetic flux concentrator units in the planar view.

21. The magnetic sensor according to claim 20, wherein sensitive axes of the plurality of magnetic detectors and of the third magnetic detector are an identical first axis direction.

22. The magnetic sensor according to claim 21, comprising a calculator configured to calculate a magnetic field in a second axis direction and a magnetic field in a third axis direction, on the basis of respective outputs of the plurality of magnetic detectors and of the third magnetic detector.

23. The magnetic sensor according to claim 22, wherein the calculator is configured to calculate the magnetic fields in the second and the third axis directions, on the basis of respective resistances of the plurality of magnetic detectors and of the third magnetic detector.

24. A magnetic sensor comprising:
a magnetic detector including a magnetic field sensitive material configured to detect a magnetic field component in a first direction, and
a magnetic field direction converter configured to convert a magnetic field component in a second direction and a magnetic field component in a third direction into the magnetic field component in the first direction, the second direction being perpendicular to the first direction, the third direction being perpendicular to both of the first and the second directions.

25. The magnetic sensor according to claim 24, wherein the magnetic field direction converter comprises a first and a second magnetic flux concentrator units disposed to be substantially parallel to each other on a substrate, and
in an arrangement pattern including the first and the second magnetic flux concentrator units and the magnetic field sensitive material included in the magnetic detector, the magnetic field sensitive material included in the magnetic detector is disposed between the first magnetic flux concentrator unit and the second magnetic flux concentrator unit in a planar view of the substrate.

26. The magnetic sensor according to claim 25, wherein the magnetic field sensitive material included in the magnetic detector is disposed to be substantially parallel to the first magnetic flux concentrator unit and the second magnetic flux concentrator unit in the planar view of the substrate.

27. The magnetic sensor according to claim 26, wherein a distance between the magnetic field sensitive material included in the magnetic detector and the first magnetic flux concentrator unit is shorter than a distance between the magnetic field sensitive material included in the magnetic detector and the second magnetic flux concentrator unit.

28. The magnetic sensor according to claim 25, wherein the first and the second magnetic flux concentrator units are disposed to form a magnetic path of a magnetic flux component from the second magnetic flux concentrator unit to the first magnetic flux concentrator unit, when a magnetic field is inputted in a longitudinal direction of the second magnetic flux concentrator unit.

29. The magnetic sensor according to claim 25, wherein the first direction and the second direction are parallel to a plane of the substrate, and the third direction is perpendicular to the plane of the substrate.

30. The magnetic sensor according to claim 25, wherein the second magnetic flux concentrator unit is disposed to be displaced with respect to the first magnetic flux concentrator unit in a longitudinal direction of the second magnetic flux concentrator unit.

31. The magnetic sensor according to claim 25, wherein,
the magnetic field direction converter comprises a third magnetic flux concentrator unit and/or a fourth magnetic flux concentrator unit,
the third magnetic flux concentrator unit is disposed at a position where the first magnetic flux concentrator unit is sandwiched between the third magnetic flux concentrator unit and the second magnetic flux concentrator unit, and
the fourth magnetic flux concentrator unit is disposed at a position where the second magnetic flux concentrator unit is sandwiched between the fourth magnetic flux concentrator unit and the first magnetic flux concentrator unit.

32. The magnetic sensor according to claim 25, wherein
the first to the fourth magnetic flux concentrator units are equipped with a first to a fourth magnetic flux concentrator members, respectively, disposed at the ends of the first to the fourth magnetic flux concentrator units, and
the first to the fourth magnetic flux concentrator units and the first to the fourth magnetic flux concentrator members form T-shapes, Y-shapes, or L-shapes, respectively, in the planar view of the substrate.

33. The magnetic sensor according to claim 32, wherein the first to the fourth magnetic flux concentrator units and the first to the fourth magnetic flux concentrator members forming T-shapes, Y-shapes, or L-shapes have gaps between one another.

34. The magnetic sensor according to claim 25, wherein a part of the magnetic field sensitive material included in the magnetic detector, the part extending along a long side of the magnetic field sensitive material, is covered with any one of the first or the second magnetic flux concentrator unit on the plane of the substrate.

35. The magnetic sensor according to claim 25, comprising an auxiliary magnetic detector including a magnetic field sensitive material having the same structure as a structure of the magnetic field sensitive material included in the magnetic detector, wherein
the magnetic field sensitive material included in the auxiliary magnetic detector is disposed not to sense magnetic field components in the first to the third directions, and
the arrangement pattern includes the magnetic field sensitive material included in the auxiliary magnetic detector.

36. The magnetic sensor according to claim 35, wherein the magnetic field sensitive material included in the auxiliary magnetic detector is covered with any one of the first or the second magnetic flux concentrator units.

37. The magnetic sensor according to claim 36, wherein the magnetic field sensitive material included in the auxiliary magnetic detector is covered with the second magnetic flux concentrator unit.

38. The magnetic sensor according to claim 24, comprising a plurality of the arrangement patterns.

39. The magnetic sensor according to claim 38, wherein, in the plurality of arrangement patterns, the magnetic field sensitive material included in the magnetic detector and/or the magnetic field sensitive material included in the auxiliary magnetic detector in each of the arrangement patterns are/is electrically connected to the magnetic field sensitive material included in the magnetic detector and/or the magnetic field sensitive material included in the auxiliary magnetic detector in another arrangement pattern in a stage adjacent and subsequent to the each of the arrangement patterns, respectively.

40. The magnetic sensor according to claim 39, wherein, in the plurality of arrangement patterns, the magnetic field sensitive material included in the magnetic detector in each of the arrangement patterns is electrically connected to the magnetic field sensitive material included in the magnetic detector in another arrangement pattern in a stage adjacent and subsequent to the each of the arrangement patterns.

41. The magnetic sensor according to claim 39, wherein, in the plurality of arrangement patterns, the magnetic field sensitive material included in the auxiliary magnetic detector in each of the arrangement patterns is electrically connected to the magnetic field sensitive material included in the auxiliary magnetic detector in another arrangement pattern in a stage adjacent and subsequent to the each of the arrangement patterns.

42. The magnetic sensor according to claim 24, wherein the magnetic field sensitive material included in the magnetic detector is configured to detect the magnetic field component in only the first direction.

43. The magnetic sensor according to claim 24, wherein the first to the fourth magnetic flux concentrator units and the first to the fourth magnetic flux concentrator members are made of a soft magnetic material.

44. The magnetic sensor according to claim 24 comprising a controller configured to control another function block, wherein
the controller is configured to receive a signal obtained from an output of the magnetic detector, the signal being in a state where magnetic field components in the first to third directions are summed, and to control the another function block by using the signal in the state where the magnetic field components in the first to third directions are summed.

45. The magnetic sensor according to claim 24 comprising:
a signal generator configured to generate a signal on the basis of an output of the magnetic detector and an output of the auxiliary magnetic detector, the signal being in a state where magnetic field components in the first to third directions are summed; and
a controller configured to control another function block, wherein
the controller is configured to control the another function block by using the signal outputted from the signal generator, the signal being in the state where the magnetic field components in the first to third directions are summed.

46. A magnetic sensor for detecting magnetic field components in two axis directions or three axis directions, the magnetic sensor comprising an arrangement pattern including:
- three or more magnetic detectors disposed to be parallel to one another and parallel to a substrate plane; and
- a first to a third magnetic flux concentrator units disposed to be parallel to one another and parallel to the substrate plane, wherein
- the first to the third magnetic flux concentrator units are disposed to form respective magnetic paths of a magnetic flux component from the second magnetic flux concentrator unit to the first magnetic flux concentrator unit and a magnetic flux component from the second magnetic flux concentrator unit to the third magnetic flux concentrator unit, when a magnetic field is inputted in a longitudinal direction of the second magnetic flux concentrator unit,
- the three or more magnetic detectors are divided into a first magnetic detector group disposed between the second magnetic flux concentrator unit and the first magnetic flux concentrator unit and a second magnetic detector group disposed between the second magnetic flux concentrator unit and the third magnetic flux concentrator unit.

47. The magnetic sensor according to claim 46, wherein
all of the three or more magnetic detectors have a sensitive axis in a first axis direction parallel to the substrate plane,
the two axis directions include a second axis direction parallel to the substrate plane and perpendicular to the first axis direction and a third axis direction perpendicular to the substrate plane, and
the three axis directions include the first to the third axis directions.

48. The magnetic sensor according to claim 46, wherein the three or more magnetic detectors are disposed such that inter-median-line distances are substantially equal to one another, the inter-median-line distances including first inter-median-line distances between a first virtual median line and centerlines of the respective magnetic detectors in the first magnetic detector group extending in a longitudinal direction of the magnetic detectors, the first virtual median line being a line midway between the first magnetic flux concentrator unit and the second magnetic flux concentrator unit, and second inter-median-line distances between a second virtual median line and centerlines of the respective magnetic detectors in the second magnetic detector group extending in the longitudinal direction of the magnetic detectors, the second virtual median line being a line midway between the second magnetic flux concentrator unit and the third magnetic flux concentrator unit.

49. The magnetic sensor according to claim 48, wherein any one of the inter-median-line distances is not shorter than 0.7 times and not longer than 1.3 times another of the inter-median-line distances.

50. The magnetic sensor according to claim 46, wherein the second magnetic flux concentrator unit is disposed to be displaced with respect to the first and the third magnetic flux concentrator units in the longitudinal direction of the second magnetic flux concentrator unit.

51. The magnetic sensor according to claim 46, a centroid position of the second magnetic flux concentrator unit is not located on a virtual line connecting centroid positions of the first and the third magnetic flux concentrator units in a planar view.

52. The magnetic sensor according to claim 46, wherein a first inter-edge distance between the first magnetic flux concentrator unit and the second magnetic flux concentrator unit is substantially equal to a second inter-edge distance between the second magnetic flux concentrator unit and the third magnetic flux concentrator unit.

53. The magnetic sensor according to claim 52 wherein the first inter-edge distance is not shorter than 0.7 times and not longer than 1.3 times the second inter-edge distance.

54. The magnetic sensor according to claim 46, comprising a fourth magnetic flux concentrator unit and/or a fifth magnetic flux concentrator unit, wherein
- the fourth magnetic flux concentrator unit is disposed at a position where the first magnetic flux concentrator unit is sandwiched between the fourth magnetic flux concentrator unit and the second magnetic flux concentrator unit, and
- the fifth magnetic flux concentrator unit is disposed at a position where the third magnetic flux concentrator unit is sandwiched between the fifth magnetic flux concentrator unit and the second magnetic flux concentrator unit.

55. The magnetic sensor according to claim 46, wherein
magnetic flux concentrator members are disposed at the ends on the magnetic flux concentrator units, respectively, and
the magnetic flux concentrator units form magnetic flux concentrator units having T-shapes, Y-shapes, or L-shapes, respectively.

56. The magnetic sensor according to claim 55, the magnetic flux concentrator members of the magnetic flux concentrator units having T-shapes, Y-shapes, or L-shapes have gaps between each other.

57. The magnetic sensor according to claim 46, wherein a part of each of the three or more magnetic detectors extending along a long side of the magnetic detectors is covered with any one of the first to the third magnetic flux concentrator units on the substrate plane.

58. The magnetic sensor according to claim 46, wherein the arrangement pattern comprises an auxiliary magnetic detector in addition to the three or more magnetic detectors, wherein the auxiliary magnetic detector is covered with one of the magnetic flux concentrator units.

59. The magnetic sensor according to claim 58, wherein the three or more magnetic detectors are four magnetic detectors.

60. The magnetic sensor according to claim 58, wherein the auxiliary magnetic detector is covered with any one of the first to the three magnetic flux concentrator units.

61. The magnetic sensor according to claim 58, comprising a calculator configured to receive signals on the basis of outputs from the three or more magnetic detectors and an output from the auxiliary magnetic detector to calculate a magnetic field component of sensitive axes of the three or more magnetic detectors, a magnetic field component of Y axis, and a magnetic field component of Z axis, the Y axis being perpendicular to the sensitive axes of the three or more magnetic detectors and parallel to the substrate plane, the Z axis being perpendicular to the substrate plane.

62. The magnetic sensor according to claim 61, wherein the calculator is configured to calculate the magnetic field component of the sensitive axes of the three or more magnetic detectors by adding signals obtained by subtracting the signal on the basis of the output from the auxiliary magnetic detector from the signals on the basis of the outputs from the three or more magnetic detectors.

63. The magnetic sensor according to claim 46, comprising a plurality of the arrangement patterns.

64. The magnetic sensor according to claim 63, wherein, in the plurality of arrangement patterns, the third magnetic flux concentrator unit in each of the arrangement patterns serves as the first magnetic flux concentrator unit in another arrangement pattern in a stage adjacent and subsequent to the each of the arrangement patterns.

65. The magnetic sensor according to claim 63, wherein, in the plurality of arrangement patterns, the three or more magnetic detectors and/or the auxiliary magnetic detector in each of the arrangement patterns are/is electrically connected to the three or more magnetic detectors and/or the auxiliary magnetic detector in another arrangement pattern in a stage adjacent and subsequent to the each of the arrangement patterns, respectively.

66. The magnetic sensor according to claim 46, comprising a calculator configured to receive signals on the basis of outputs from the three or more magnetic detectors to calculate a magnetic field component of Y axis and a magnetic field component of Z axis, the Y axis being perpendicular to sensitive axes of the three or more magnetic detectors and parallel to the substrate plane, the Z axis being perpendicular to the substrate plane.

67. A magnetic detecting method of using the magnetic sensor according to claim 46.

68. A magnetic detecting method for detecting magnetic field components in two axis directions on the basis of outputs from a first and a second magnetic detectors sandwiched between a first and a second magnetic flux concentrator units and of a output from a third magnetic detector sandwiched between the second and a third magnetic flux concentrator units, wherein
the first to the third magnetic detectors have a sensitive axis in an identical first axis direction, and
the magnetic detecting method comprising:
calculating a magnetic field component in a second axis direction on the basis of a value based on the output from the first magnetic detector and a value based on the output from the third magnetic detector; and
calculating a magnetic field component in a third axis direction on the basis of the value based on the output from the first magnetic detector and a value based on the output from the second magnetic detector.

69. A magnetic detecting method for detecting magnetic field components in two axis directions on the basis of outputs from a first and a second magnetic detectors sandwiched between a first and a second magnetic flux concentrator units and of outputs from a third and a fourth magnetic detectors sandwiched between the second and a third magnetic flux concentrator units, wherein
the first to the fourth magnetic detectors have a sensitive axis in an identical first axis direction, and
the magnetic detecting method comprising:
calculating a magnetic field component in a second axis direction on the basis of a value obtained by subtracting a sum of values based on the outputs from the first and the second magnetic detectors from a sum of values based on the outputs from the third and the fourth magnetic detectors; and
calculating a magnetic field component in a third axis direction on the basis of a value obtained by subtracting a sum of the values based on the outputs from the first and the third magnetic detectors from a sum of the values based on the outputs from the second and the fourth magnetic detectors, or
calculating the magnetic field component in the second axis direction on the basis of the output from the first magnetic detector and the output from the third magnetic detector; and
calculating the magnetic field component in the third axis direction on the basis of the output from the first magnetic detector and the output from the second magnetic detector.

70. The magnetic detecting method according to claim 68, wherein,
magnetic field components in three axis directions are detected on the basis of the outputs from the first to third magnetic detectors and an output from an auxiliary magnetic detector covered with a magnetic flux concentrator unit,
the first to the third magnetic detectors and the auxiliary magnetic detector have a sensitive axis in the first axis direction, and
the magnetic detecting method comprising calculating a magnetic field component in the first axis direction on the basis of the output from the second magnetic detector, the output from the third magnetic detector, and the output from the auxiliary magnetic detector, in addition to the calculating the magnetic field component in the second axis direction and the calculating the magnetic field component in the third axis direction.

71. The magnetic detecting method according to claim 69, wherein,
magnetic field components in three axis directions are detected on the basis of the outputs from the first to fourth magnetic detectors and an output from an auxiliary magnetic detector covered with a magnetic flux concentrator unit,
the first to the fourth magnetic detectors and the auxiliary magnetic detector have a sensitive axis in the first axis direction, and
the magnetic detecting method comprising calculating a magnetic field component in the first axis direction on the basis of a total sum of signals based on the outputs from the first to the fourth magnetic detectors, the signals being obtained by subtracting a value based on the output from the auxiliary magnetic detector from values based on the outputs from the first to the fourth magnetic detectors, in addition to the calculating the magnetic field component in the second axis direction and the calculating the magnetic field component in the third axis direction.

72. The magnetic detecting method according to claim 68, wherein the second axis direction is perpendicular to the sensitive axes of the magnetic detectors and parallel to a substrate plane and the third axis direction is perpendicular to the substrate plane.

73. The magnetic detecting method according to claim 69, wherein the first axis direction is a direction of sensitive axes of the magnetic detectors.

* * * * *